United States Patent [19]
Takahashi

[11] Patent Number: 5,939,736
[45] Date of Patent: *Aug. 17, 1999

[54] INSULATED GATE THYRISTOR

[75] Inventor: Tetsuo Takahashi, Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/779,514

[22] Filed: Jan. 8, 1997

[30] Foreign Application Priority Data

Mar. 13, 1996 [JP] Japan ................................ 8-056107

[51] Int. Cl.⁶ .......................... H01L 29/74; H01L 31/111
[52] U.S. Cl. ........................... 257/147; 257/152; 257/163
[58] Field of Search ................................. 257/147, 151, 257/152, 163, 167, 176

[56] References Cited

U.S. PATENT DOCUMENTS

| | | | |
|---|---|---|---|
| 5,281,833 | 1/1994 | Ueno | 257/147 |
| 5,381,025 | 1/1995 | Zommer | 257/152 |
| 5,457,329 | 10/1995 | Harada | 257/147 |

FOREIGN PATENT DOCUMENTS

| | | |
|---|---|---|
| 0 476 815 | 3/1992 | European Pat. Off. . |
| 4121375 | 1/1993 | Germany . |
| 4126491 | 2/1993 | Germany . |

OTHER PUBLICATIONS

Anup Bhalla et al., "ESTD: An Emitter Switched Thyristor with a Diverter," IEEE Electron Device Letters, vol. 16, No. 2, Feb. 1995, pp. 77–79 (previously cited in IDS dated Jan. 8, 1997).

Bhalla, Anup, et al: "ESTD: An Emitter Switched Thyristor with a Diverter", *IEEE Electron Device Letters*, vol. 16, No. 2, Feb. 1995, pp. 77–79.

Nandakumar, M., et al: "A New MOS–Gated Power Thyristor Structure with Turn–Off Achieved by Controlling the Base Resistance", *IEEE Electron Device Letters*, vol. 12, No. 5, May 1991, pp. 227–229.

*Primary Examiner*—Wael Fahmy
*Attorney, Agent, or Firm*—McDermott, Will & Emery

[57] ABSTRACT

A semiconductor device for conducting a in current across a cathode electrode and an anode electrode, includes a thyristor formed of an $n^+$ floating region connected electrically to the cathode electrode, a $p^+$ anode connected electrically to the anode electrode, a p base, and an $n^-$ layer. A $p^+$ diverter is provided inside and outside the p base region. The semiconductor device further includes a gate oxide film and a gate electrode for forming a channel region between the p base and each $p^+$ diverter and between the $n^+$ floating region and the $n^-$ layer. When the thyristor is turned off, the hole-current within the p base is split into each $p^+$ diverter. A semiconductor device superior in controllable current is obtained.

11 Claims, 34 Drawing Sheets

INSULATED GATE THYRISTOR

BACKGROUND OF THE INVENTION

1. Field of the Invention

The present invention relates to a semiconductor device and a method of manufacturing thereof. Particularly, the present invention relates to a structure of an insulating gate type thyristor.

2. Description of the Background Art

In a general, low switching loss, low on-state voltage, high speed operation and high controllable current are required in switching device.

Switching loss refers to the power loss generated when a switching element is set to a conductive state (referred to as "turn-on" hereinafter), or to a cut off state (referred to as "turn-off" hereinafter). Steady-state loss refers to the power loss represented by the product of a forward voltage drop generated by on-resistance in a steady state after being turned on (referred to as "on-state" hereinafter) and the conducting current. Controllable current is defined as the maximum main current that can be turned off.

An insulating gate type thyristor is known as a switching element satisfying these demands. An insulating gate type thyristor is generally advantageous in that the steady-state loss is small. However, it is disadvantageous that it can not be turned-off, or has low controllable current even when it can be turned-off at high speed.

An emitter switched thyristor with a diverter (referred to as "ESTD" hereinafter) disclosed in Electron Device Letters, Vol. 16, (1995) is known as an example of an insulating gate type thyristor that has a turn-off capability and that is improved controllable current. FIGS. 63 and 64 show a sectional view and a plan view, respectively, of an ESTD. FIG. 63 is a cross sectional view taken along I—I of FIG. 64.

Referring to FIGS. 63 and 64, an ESTD includes a $p^+$ anode 1, an $n^-$ layer 2, a p base 3, a $p^+$ contact 4, an $n^+$ cathode 5, a p diverter 6a, an $n^+$ floating region 7a, gate oxide films 8a and 8b, gate electrodes 12a and 12b, an anode electrode 9, a cathode electrode 10, and a diverter electrode 11a. $P^+$ anode 1, $n^-$ layer 2, p base 3, and $n^+$ floating region 7a form a thyristor.

P base 3 and $p^+$ diverter 6a form a p channel MOSFET by gate oxide film 8b. Cathode electrode 10 and diverter electrode 11a are electrically connected.

An operation of an ESTD will be described hereinafter. An on state is realized by applying a voltage higher than a threshold voltage to gate electrodes 12a and 12b while a forward bias is established between cathode electrode 10 and anode electrode 9, that is to say, in a state where cathode electrode 10 is grounded and a positive (+) voltage is applied to anode electrode 9.

More specifically, application of a voltage higher than a threshold voltage to gate electrodes 12a and 12b causes an n channel region of high electron density to be generated in a region of p base 3 sandwiched by $n^+$ cathode 5 and $n^+$ floating region 7a in the proximity of gate oxide film 8a. Also, an n channel region of high electron density is generated in a region of p base 3 sandwiched by $n^+$ floating region 7a and $n^-$ layer 2 of a semiconductor substrate in the proximity of gate oxide film 8b. Electrons flow to the n channel region to be injected from cathode electrode 10 into $n^-$ layer 2 of the semiconductor substrate via $n^+$ cathode 5 and $n^+$ floating region 7a. Electrons flow towards $p^+$ anode 1 to which a positive (+) voltage is applied. When the electrons arrive at $p^+$ anode 1, holes are injected into $n^-$ layer 2 from $p^+$ anode 1. Some of the holes injected into $n^-$ layer 2 flow into p base 3 to be conducted below $n^+$ floating region 7a and $n^+$ cathode 5 to enter $p^+$ contact 4. Then, holes flow from $p^+$ contact 4 towards cathode electrode 10.

When the holes stored within p base 3 become greater than the internal potential of the pn junction formed by $n^+$ floating region 7a and p base 3, the holes will flow from p base 3 towards $n^+$ floating region 7a to turn on the thyristor to initiate a thyristor operation. Thus, a main current flows across cathode electrode 10 and anode electrode 9. Here, the minimum current required for the turned-on thyristor to maintain its state is referred to as "holding current".

In contrast, an off-state is realized by applying a voltage lower than a threshold voltage to gate electrodes 12a and 12b. This operation will be described in detail hereinafter.

When a voltage lower than a threshold voltage is applied to gate electrodes 12a and 12b, the n channel region formed at p base 3 region sandwiched by $n^+$ cathode 5 and $n^+$ floating region 7a in the proximity of gate oxide film 8a, and also the n channel region formed at p base 3 region sandwiched by $n^+$ floating region 7a and $n^-$ layer 2 of the semiconductor substrate in the proximity of gate oxide film 8b and are eliminated, whereby injection of electrons from cathode electrode 10 is suppressed.

Channel inversion occurs in the region of $n^-$ layer 2 of the semiconductor substrate sandwiched by p base 3 and $p^+$ diverter 6a in the proximity of gate oxide film 8b. As a result, a p channel region of high hole density is generated. Since additional injection of electrons is not carried out, newly generation of holes is also not seen. The holes in p base 3 region will flow from $p^+$ contact 4 towards cathode electrode 10. Furthermore, holes will flow towards $p^+$ diverter 6a via the p channel region in the proximity of gate oxide film 8b. More specifically, the holes stored in p base region 3 will be diverted towards $p^+$ diverter 6a.

When the hole-current flows towards cathode electrode 10 and diverter electrode 11a so that the main current becomes lower than the holding current level, the operation of the thyristor is inhibited since the thyristor cannot maintain its on-state. Thus, the main current across cathode electrode 10 and anode electrode 9 is cut off.

An emitter switched thyristor (referred to as "EST" hereinafter) is set forth in the following for the sake of describing the controllable current of a thyristor.

A plan view of an EST indicates a striped structure similar to that of FIG. 64. Referring to FIG. 65 showing a sectional view of EST, the structure of EST is identical to that of the ESTD provided that the $p^+$ diverter and the diverter electrode are removed.

The operation of an EST is similar to that of an ESTD. However, holes stored in p base 3 region flow only towards cathode electrode 10 in the transition to an off-state. Therefore, a turn-off state is not easily achieved since the potential in p base 3 is higher than that in an ESTD. This means that the value of the maximum main current that can be turned off is lower than that for an ESTD. When the same main current is to be turned off, the time to attain a turn-off state becomes longer since there is no diversion towards the $p^+$ diverter in comparison with an ESTD. It is said that the characteristics of an element is superior and that the controllable current is high as the value of the maximum main current that can be turned off is greater. The characteristic can be improved as the turn-off loss is reduced in proportion to a shorter turn-off time. It is therefore important to lower the potential of P base 3 to quickly draw out holes to improve the characteristics of a thyristor. A p$^+$ diverter has a critical function for this purpose.

A base resistance thyristor (referred to as "BRT" hereinafter) disclosed in Electron Device Letters, Vol. 12 (1991) will be described hereinafter as another thyristor with such a p$^+$ diverter.

FIGS. 66 and 67 show a sectional view and a plan view, respectively, of a BRT. FIG. 66 is a cross sectional view taken along I—I of FIG. 67.

Referring to FIGS. 66 and 67, a BRT includes a p$^+$ anode 1, an n$^-$layer 2, a p base 3, an n$^+$ cathode 5, a p$^+$ diverter 6a, a gate oxide film 8b, an anode electrode 9, a cathode electrode 10, and a diverter electrode 11a. A thyristor is formed by p$^+$ anode 1, n$^-$layer 2, p base 3, and n$^+$ cathode 5.

An operation of a BRT will be described hereinafter. An on-state is realized by applying a voltage higher than a threshold voltage to gate electrode 12b. By applying the voltage to gate electrode 12b, an n channel region is formed in the region of p base 3 sandwiched by n$^+$ cathode 5 and n$^-$layer 2 of a semiconductor substrate in the proximity of gate oxide film 8b. Electrons are injected from cathode electrode 10 towards n$^-$layer 2 of the semiconductor substrate through n$^+$ cathode 5 and the n channel region. Holes are injected from p$^+$ anode 1 towards n$^-$layer 2. Here, holes are stored inside p base 3 to cause the potential to exceed the internal potential of the pn junction formed of n$^+$ cathode 5 and p base 3. Holes flow from p base 3 towards n$^+$ cathode 5 to initiate an operation of the thyristor by being turned on. Thus, a state is obtained in which a main current flows across cathode electrode 10 and anode electrode 9.

An off-state is realized by applying a voltage lower than a threshold voltage to gate electrode 12b.

When the voltage is applied to gate electrode 12b, the n channel region formed in the region of p base 3 sandwiched by n$^+$ cathode 5 and n$^-$layer 2 of the semiconductor substrate in the proximity of gate oxide film 8b is eliminated, whereby injection of electrons from cathode electrode 10 is ceased. Channel inversion occurs in the region of n$^-$layer 2 of the semiconductor substrate sandwiched by p base 3 and p$^+$ diverter 6a in the proximity of gate oxide film 8b to generate a p channel region of high hole density. The holes flowing through p base 3 are conducted towards p$^+$ diverter 6a via the p channel region. Thus, a thyristor operation is suppressed when the current becomes lower than the holding current of the thyristor to cut off the main current.

In this BRT, holes flow through p diverter 6a in the transition to an off-state. Therefore, there is an effect similar to that of reduction in the resistance of p base 3 of the thyristor formed of p$^+$ anode 1, n$^-$layer 2, p base 3, and n$^+$ cathode 5. Thus, the controllable current is improved when the thyristor is turned off, that is, when the effective holding current is increased during channel inversion.

As described above, an insulating gate type thyristor including a p$^+$ diverter has the holes stored in the p base also conducted towards the p$^+$ diverter when turned off to be increased in controllable current in comparison to a thyristor does not include a p$^+$ diverter.

It is appreciated from FIGS. 64 and 67 that a p diverter has a plane structure of stripes. When a higher current is to be cut off at high speed, the current diverting efficiency of the hole-current is degraded since there is only one p$^+$ diverter region. It was difficult to improve the controllable current for high currents. Since the flow of the hole-current is gathered towards one p$^+$ diverter in the split of the current, there are cases where the thyristor operates erroneously.

It is to be noted that the p$^+$ diverter region in an ESTD or a BRT is in direct contact with n$^-$layer 2 as shown in FIGS. 63 or 66. Therefore, a portion of the current flows also towards the p$^+$ diverter 6a from the p$^+$ anode 1 in an on-state. There was a problem of turn-on loss which is the power loss generated when the thyristor is turned on to compensate for the current flowing towards p$^+$ diverter 6a. There was also a steady-state loss generated by the on-state resistance in a steady state after being turned on. In other words, there was a problem of increase in power loss represented by the product of the on-state voltage and the main current.

SUMMARY OF THE INVENTION

In view of the foregoing, an object of the present invention is to provide a plane structure or a cross sectional structure of a p$^+$ diverter as a structure of an insulating gate type thyristor improved in controllable current and reduced in turn-on loss and steady-state loss.

A semiconductor device according to a first aspect of the present invention includes an element for conducting a main current flow between both main surfaces sandwiching a semiconductor substrate of a first conductivity type. The element includes a first impurity region of a second conductivity type, a second impurity region of the first conductivity type, a third impurity region of the second conductivity type, a fourth impurity region of the second conductivity type, a first gate electrode, a first main electrode, and a second main electrode. The first impurity region of the second conductivity type is formed at a first main surface of the semiconductor substrate of the first conductivity type. The second impurity region of the first conductivity type is formed at a first main surface in the first impurity region. The third impurity region of the second conductivity type is formed at a second main surface of the semiconductor substrate. The fourth impurity region of the second conductivity type is formed at the first main surface within the second impurity region. The first gate electrode is formed on a surface of the second impurity region sandwiched by the first impurity region and the fourth impurity region with a first insulating film thereunder. The first main electrode is formed at the first main surface, and is electrically connected to the fourth impurity region. The second main electrode is formed at the second main surface, and is electrically connected to the third impurity region.

By applying a predetermined voltage to the first gate electrode in a turn-off state during the transition of the first and second main electrodes to an off-state from an on-state, a channel inversion layer of the second conductivity type is generated in the second impurity region of the first conductivity type sandwiched by the first impurity region and the fourth impurity region in the proximity of the first insulating film, whereby the first impurity region and the fourth impurity region are connected electrically. As a result, holecurrent within the first impurity region is diverted towards the fourth impurity region. Therefore, the controllable current is improved since the effective holding current of the element in channel inversion is increased.

Preferably, a plurality of second impurity regions are formed at the first main surface within the first impurity region. The fourth impurity region is formed at the first main surface of each second impurity region. The first gate electrode is located on the surface of the second impurity region sandwiched by each fourth impurity region and the first impurity region. The first main electrode is electrically connected to each of the fourth impurity regions. The element can further include a second gate electrode formed on a surface of the first impurity region sandwiched by the second impurity region and a first conductivity type region of the semiconductor substrate with a second insulating film thereunder, and a third gate electrode formed on a surface of the first impurity region sandwiched by adjoining second impurity regions with a third insulating film thereunder.

In this case, application of a predetermined voltage to the first to third gate electrodes at the time of turn-off causes generation of a channel inversion layer of the second conductivity type at the second impurity region of the first conductivity type sandwiched by the first impurity region and the fourth impurity region in the proximity of the first insulating film, whereby the first impurity region and the fourth impurity region are electrically connected. A channel inversion layer is not formed in the first impurity region of the second conductivity type sandwiched by the second impurity region in the proximity of the second insulating film and the first conductivity type region of the semiconductor substrate, so that the second impurity region is electrically insulated from the first conductivity type region of the semiconductor substrate. Also, a channel inversion layer is not generated at the first impurity region of the second conductivity type sandwiched by adjoining second impurity regions in the proximity of the third insulating film. Therefore, the hole-current within the first impurity region can be diverted to each fourth impurity region. Since the effective holding current of the element at the time of channel inversion is increased, the controllable current is further improved.

Preferably, all the electric resistance between each of the adjoining fourth impurity regions may be equal.

In this case, the voltage drop between each of the fourth impurity regions becomes equal, so that the hole-current flowing towards each fourth impurity region is minimized. By virtue of the effective holding current of the element being increased, the controllable current is improved.

Preferably, the element further includes a fifth impurity region of the first conductivity type formed at the first main surface of the first impurity region with a distance from one of the plurality of second impurity regions located most remote from the outer edge of the first impurity region, and a fourth gate electrode formed on a surface of the first impurity region sandwiched by the fifth impurity region and the second impurity region with a fourth insulating film thereunder. The first main electrode is further connected electrically to the fifth impurity region. The first main electrode does not have to be directly connected to the plurality of second impurity regions electrically.

In this case, application of a predetermined voltage to the fourth gate electrode when turned off eliminates the channel region formed at the first impurity region in the proximity of the fourth insulating film. Therefore, injection of electrons from the fifth impurity region towards the second impurity region can be suppressed to result in improvement of the controllable current of the element.

According to a second aspect of the present invention, a semiconductor device includes an element sandwiching a semiconductor substrate of a first conductivity type for conducting a main current flow across both main surfaces. The element includes a first impurity region of a second conductivity type, a second impurity region of the first conductivity type, a third impurity region of the second conductivity type, a plurality of fourth impurity regions of the second conductivity type, a first gate electrode, a first main electrode, and a second main electrode. The first impurity region of the second conductivity type is formed at a first main surface of the semiconductor substrate of the first conductivity type. The second impurity region of the first conductivity type is formed at the first main surface within the first impurity region. The third impurity region of the second conductivity type is formed at a second main surface of the semiconductor substrate. The plurality of fourth impurity regions of the second conductivity type are formed at the first main surface with a distance from the first impurity region. The plurality of fourth impurity regions are spaced apart from each other along the outer edge of the first impurity region. The first gate electrode is formed on a surface of a first conductivity type region of semiconductor substrate sandwiched by the first impurity region and each fourth impurity region with a first insulating film thereunder. The first main electrode is formed on the first main surface, and is electrically connected to each of the fourth impurity regions. The second main electrode is formed at the second surface, and is electrically connected to the third impurity region.

By applying a predetermined voltage to the first gate electrode when turned off in the transition of the first and second main electrodes to an off-state from an on-state in the above-described structure, a channel inversion layer of the second conductivity type is generated at the first conductivity type region of the semiconductor substrate sandwiched by the first impurity region and each fourth impurity region in the proximity of the first insulating film, whereby the first impurity region is electrically connected to each fourth impurity region. As a result, the hole-current within the first impurity region is diverted towards the plurality of fourth impurity regions. By virtue of increase in the effective holding current of the element when the channel is inverted, the controllable current is improved.

A preferable arrangement of the fourth impurity regions is set forth in the following. The first impurity region includes an outer edge extending in an X direction and an outer edge extending in a Y direction crossing the X direction. One of the plurality of fourth impurity regions is located along the outer edge of the X direction. Another one of the plurality of fourth impurity regions can be located along the outer edge of the Y direction. Also preferably, the first impurity region includes an outer edge extending substantially linear along the X direction. One of the plurality of fourth impurity regions can be formed so as to be located along the outer edge in the X direction and also continuously over the entire length of the outer edge in the X direction. Further preferably, the first impurity region includes a first outer edge extending in the X direction, and a second outer edge extending in the X direction with a distance from the first outer edge. One of the plurality of fourth impurity regions can be arranged along the first outer edge, and another one of the plurality of fourth impurity regions can be arranged along the second outer edge. Further preferably, the outer edge of the first impurity region forms a closed region. The plurality of fourth impurity regions can be arranged along the closed outer edge positioned equally therebetween.

In these cases, the hole-current within the first impurity region is equally conducted towards the plurality of fourth impurity regions. The hole-current will not flow in only one direction, so that concentration of the hole-current can be alleviated. Thus, erroneous operation of a semiconductor device caused by current concentration can be prevented.

It is to be noted that the X direction is provided just for the sake of convenience to define a certain direction. It therefore does not indicate coordinates, and X includes curves as well as lines. The Y direction does not have to be orthogonal to the X direction, and can be just crossing the X direction.

Preferably, the element further includes a fifth impurity region of the first conductivity type formed at the first main surface of the first impurity region with a distance from the second impurity region, a second gate electrode formed on a surface of the first impurity region sandwiched by the second impurity region and the first conductivity type region of the semiconductor substrate with a second insulating film thereunder, and a third gate electrode formed on the surface of the first impurity region sandwiched by the second impurity region and the fifth impurity region with a third insulating film thereunder. The first main electrode is further connected electrically to the fifth impurity region, and does not have to be directly connected to the second impurity region electrically.

In this case, application of a predetermined voltage to the second and third gate electrodes when turned off causes elimination of the channel region formed at the first impurity region in the proximity of the second and third insulating films. As a result, injection of electrons from the first main electrode and the fifth impurity region towards the first conductivity type region of the semiconductor substrate through the second impurity region can be suppressed. Thus, the controllable current of the element is improved.

According to a third aspect of the present invention, a semiconductor device includes an element sandwiching a semiconductor substrate of a first conductivity type for conducting a flow of a main current across both main surfaces. The element includes a first impurity region of a second conductivity type, a second impurity region of the first conductivity type, a third impurity region of the second conductivity type, a fourth impurity region of the second conductivity type, a first gate electrode, a first main electrode, and a second main electrode. The first impurity region of the second conductivity type is formed at a first main surface of the semiconductor substrate of the first conductivity type. The outer edge of the first impurity region forms a closed region. The second impurity region of the first conductivity type is formed at the first main surface within the first impurity region. The third impurity region of the second conductivity type is formed at a second main surface of the semiconductor substrate. The fourth impurity region of the second conductivity type is spaced apart from the first impurity region, and is formed substantially continuously along the closed outer edge. The first gate electrode is formed over the entire surface of a first conductivity type region of the semiconductor substrate sandwiched by the first impurity region and the fourth impurity region with a first insulating film thereunder. The first main electrode is formed at the first main surface and is electrically connected to the fourth impurity region. The second main electrode is formed on the second main surface and is electrically connected to the third impurity region.

According to the above-described structure, by application of a predetermined voltage to the first gate electrode in a turned-off state during the transition of the first and second main electrodes to an off-state from an on-state, a channel inversion layer of the second conductivity type is generated in the first conductivity type region of the semiconductor substrate sandwiched by the first impurity region and the fourth impurity region in the proximity of the first insulating film, whereby the first and fourth impurity regions are electrically connected. As a result, the hole-current within the first impurity region is conducted in a divided manner into the substantially continuously-formed fourth impurity region along the outer edge of the first impurity region. Therefore, the controllable current is improved due to increase in the effective holding current of the element at channel inversion.

Preferably, the fourth impurity region can be formed so as to completely continuously surround the first impurity region.

In this case, the hole-current within the first impurity region is conducted more efficiently towards the fourth impurity region that completely continuously surrounds the first impurity region. Therefore, the effective holding current of the element at channel inversion is increased to further improve the controllable current.

Preferably, the element further includes a fifth impurity region of the first conductivity type formed at the first main surface within the first impurity region and spaced apart from the second impurity region, a second gate electrode formed on a surface of the first impurity region sandwiched by the second impurity region and the first conductivity type region of the semiconductor substrate with a second insulating film thereunder, and a third gate electrode formed on a surface of the first impurity region sandwiched by the second and fifth impurity regions with a third insulating film thereunder. The first main electrode is further connected electrically to the fifth impurity region. The first main electrode does not have to be directly connected electrically to the second impurity region.

In this case, application of a predetermined voltage to the second and third gate electrodes when turned off causes elimination of the channel region formed at the first impurity region in the proximity of the second and third insulating films. Therefore, injection of electrons from the first main electrode and the fifth impurity region towards the first conductivity type region of the semiconductor substrate via the second impurity region can be inhibited. Accordingly, the controllable current of the element is improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the first and second embodiments correspond to a semiconductor device of the first aspect of the present invention.

The third to twenty-third embodiments correspond to a semiconductor device of the second aspect of the present invention.

The twenty-fourth to thirty-first embodiments correspond to a semiconductor device according to the third aspect of the present invention.

The thirty-second to fortieth embodiments correspond to a semiconductor device according to the first to third aspects of the present invention.

First Embodiment

Figure 1:
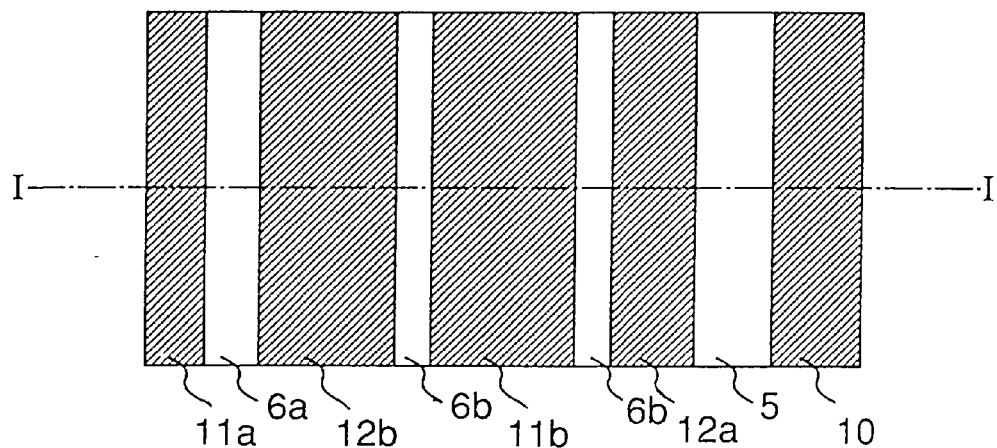
FIG. 1 is a plan view of a semiconductor device according to the first embodiment of the present invention.

A thyristor according to the first embodiment of the present invention will be described with reference to FIGS. 1 and 2.

A thyristor includes a $p^+$ anode 1, an $n^-$ layer 2, a p base 3, a $p^+$ contact 4, an $n^+$ cathode 5, $p^+$ diverters 6a and 6b, an $n^+$ floating region 7a, gate oxide films 8a and 8b, gate electrodes 12a and 12b, an anode electrode 9, a cathode electrode 10, and diverter electrodes 11a and 11b.

The thyristor has $p^+$ diverter 6a provided external of the region of p base 3. $P^+$ diverter 6a and p base 3 are electrically connected by a p channel region formed at $n^-$ layer 2 that is sandwiched by $p^+$ diverter 6a and p base 3 in the proximity of gate oxide film 8b by applying a predetermined threshold voltage to gate electrode 12b. The thyristor includes $n^+$ floating region 7a within p base 3. $P^+$ diverter 6b is provided within $n^+$ floating region 7a. P base 3 and $p^+$ diverter 6b are electrically connected by a p channel region formed at $n^+$ floating region 7a sandwiched by p base 3 and $p^+$ diverter 6b in the proximity of gate oxide film 8b by applying a predetermined threshold voltage to gate electrode 12b, and by a p channel region formed at $n^+$ floating region 7a sandwiched by p base 3 and $p^+$ diverter 6b in the proximity of gate oxide film 8a by a similar application of a threshold voltage. Therefore, $p^+$ diverter 6b formed within $n^+$ floating region 7a is located right above the current path in which holes are conducted from $n^+$ floating region 7a towards $n^+$ cathode 5 in an on-state.

The operation will be described hereinafter.

Figure 2:
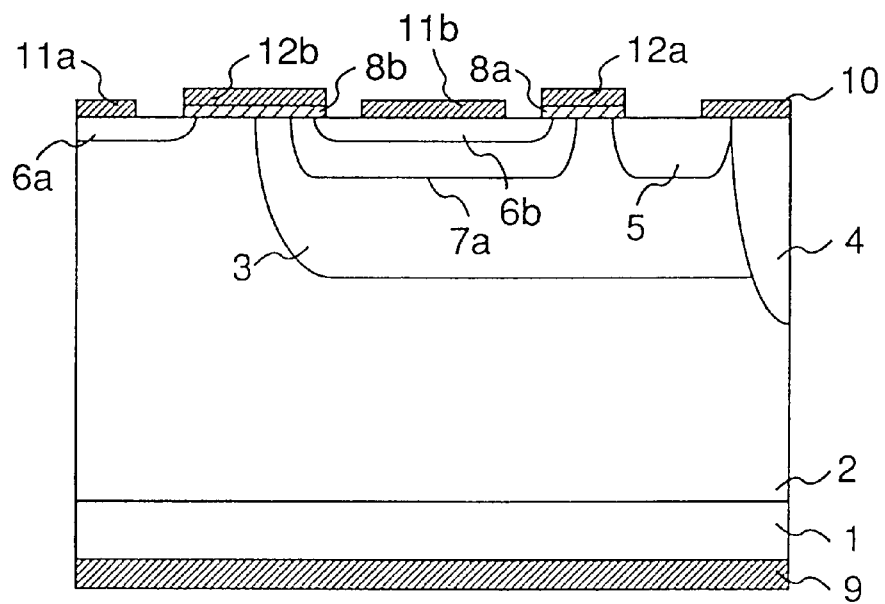
FIG. 2 is a sectional view of the semiconductor device of FIG. 1 taken along I—I.

Referring to FIG. 2, an on-state can be realized by applying a voltage higher than a threshold voltage to gate electrodes 12a and 12b. The details thereof are similar to those described in the section of the background art, and will not be repeated.

An off-state can be realized by applying a voltage lower than a threshold voltage to gate electrodes 12a and 12b. Application of the voltage to gate electrode 12a causes channel inversion to form a p type inversion layer at $n^+$ floating region 7a sandwiched by p base 3 and $p^+$ diverter 6b in the proximity of gate oxide film 8a. Also, application of the voltage to gate electrode 12b causes channel inversion to form a p type inversion layer at $n^-$ layer 2 of the semiconductor substrate sandwiched by p base 3 and $p^+$ diverter 6a in the proximity of gate oxide film 8b, and at $n^+$ floating region 7a sandwiched by p base 3 and $p^+$ diverter 6b. The hole-current flowing within p base 3 is also conducted to $p^+$ diverters 6a and 6b through these p type inversion layers to be diverted towards cathode electrode 10, and $p^+$ diverter electrodes 11a and 11b. When the current level becomes lower than the holding current in the thyristor formed of $p^+$ anode 1, $n^-$ layer 2, p base 3, and $n^+$ cathode 5, the thyristor operation is suppressed, so that the main current across cathode 10 and anode 9 is cut off.

The flow of hole-current in the transition to an off-state will be described in detail in comparison to that of the conventional case.

Figure 3:
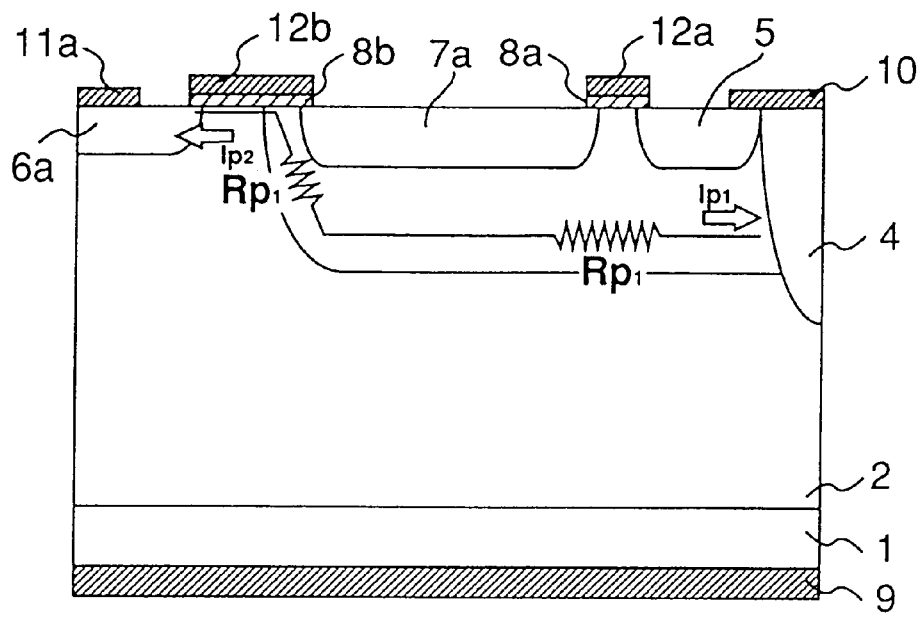
FIG. 3 is a schematic sectional view of the semiconductor device of the first embodiment for describing an operation thereof.
Figure 4:
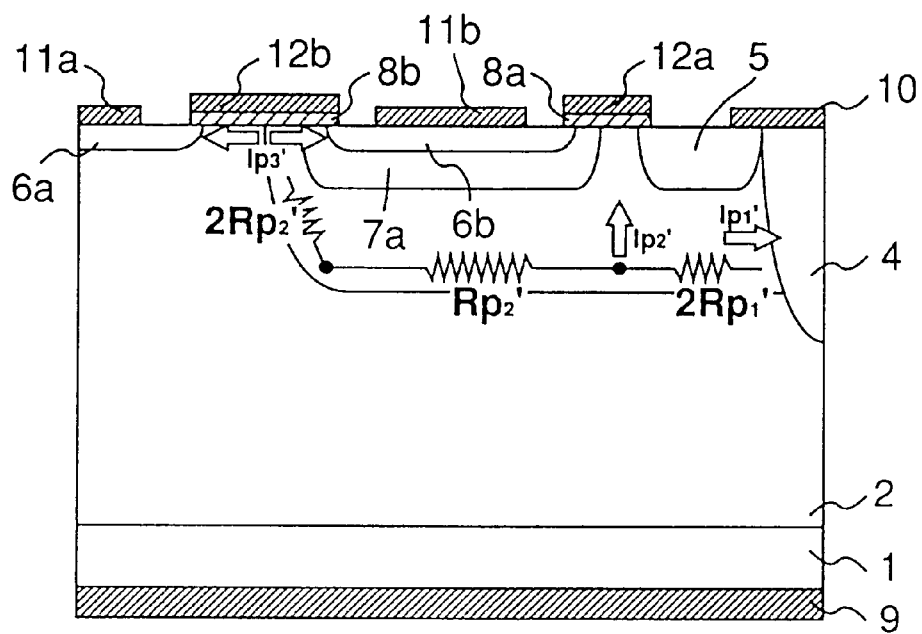
FIG. 4 is another schematic sectional view of the semiconductor device of the first embodiment for describing an operation thereof.

FIG. 3 is a schematic diagram showing the flow of hole-current in an ESTD described in the section of the background art, and FIG. 4 is a schematic diagram showing the flow of hole-current according to the present embodiment.

Referring to FIG. 3, the hole-current flowing within p base 3 in a turn-off state in a conventional ESTD is split into current $Ip_1$ towards cathode electrode 10 and $Ip_2$ towards diverter electrode 11a at approximately half the length of p base 3. Here, a voltage drop develops by resistance $Rp_1$ within the region.

In the present embodiment shown in FIG. 4, the hole-current flowing within p base 3 is split into $Ip_1'$ towards cathode 10, $Ip_2'$ towards diverter electrode 6b, and $Ip_3'$ towards diverter electrode 6a. Here, voltage drop occurs by respective resistances of $2Rp_1'$, $Rp_2'$, and $2Rp_2'$ in the region.

More specifically, $Ip_1$ in the conventional ESTD is split into $Ip_1'$ and $Ip_2'$, and $Ip_2$ into two $Ip_3'$ in the present invention. Therefore, the hole-current flowing right beneath $n^+$ floating region 7a is lower than that of the conventional ESTD.

Since the distance between $p^+$ diverter 6a and $p^+$ diverter 6b, and between $p^+$ diverter 6b and $p^+$ contact 4 in FIG. 4 is shorter than the distance between $p^+$ contact 4 and $p^+$ diverter 6a in FIG. 3, the electric resistance in the region becomes lower than that of the prior art. Therefore, the voltage drop at respective regions within p base 3 can be reduced than that of the conventional ESTD. Thus, the effective holding current of the thyristor is increased, and controllable current is improved.

This advantage is achieved by providing $p^+$ diverter 6b within the region of $n^+$ floating region 7a.

Since a p type inversion layer is not formed at $n^+$ floating region 7a sandwiched by p base 3 and $p^+$ diverter 6b in the proximity of gate oxide film 8b when the thyristor attains an on-state, no current flows from p base 3 towards $p^+$ diverter 6b. Therefore, the holding current in an on-state can be maintained at a level identical to that of the conventional ESTD.

Second Embodiment

Figure 5:
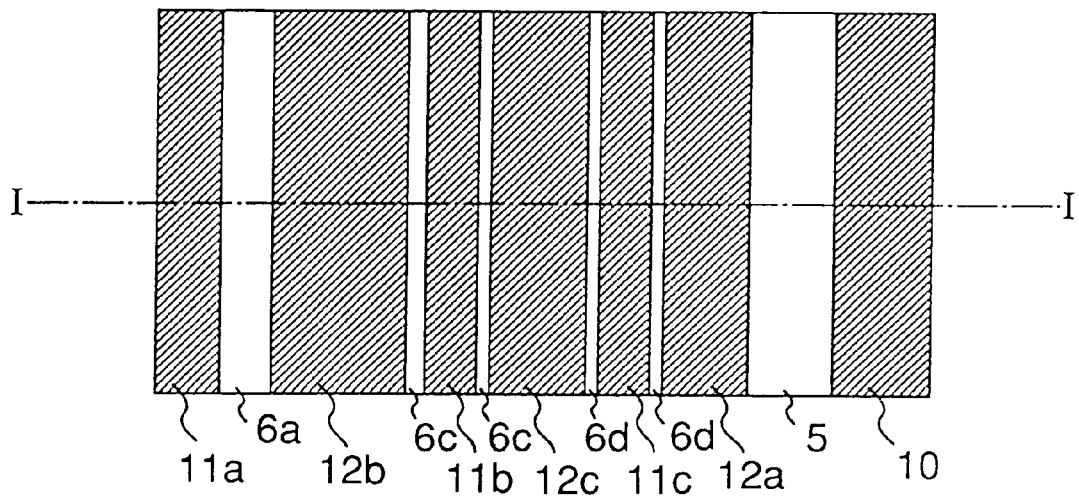
FIG. 5 is a plan view of a semiconductor device according to second embodiment of the present invention.

A thyristor according to a second embodiment of the present invention will be described hereinafter with reference to FIGS. 5 and 6.

The thyristor of the second embodiment includes another $p^+$ diverter in addition to the structure shown in FIG. 4. $N^+$ floating regions 7b and 7c, $p^+$ diverters 6c and 6d, diverter electrodes 11b and 11c, and gate electrode 12c are provided in the area of p base 3. These components are arranged so that the distance between $p^+$ diverter 6c and $p^+$ diverter 6d and the distance between $p^+$ diverter 6d and p contact 4 is constant.

Components corresponding to those of the first embodiment have the same reference characters allotted, and their description will not be repeated.

The operation of the thyristor of the second embodiment will be described hereinafter. Operation for an on-state can be realized by applying a voltage higher than a threshold voltage to gate electrodes 12a, 12b and 12c. An off-state can be realized by applying a voltage lower than a threshold voltage to each gate.

Application of the voltage to gate electrodes 12a, 12b and 12c in an off-state causes channel inversion to form a p type inversion layer at $n^+$ floating region 7c sandwiched by p base 3 and $p^+$ diverter 6d in the proximity of gate oxide film 8a, and to form a p type inversion layer at $n^+$ floating region 7b sandwiched by p base 3 and $p^+$ diverter 6c in the proximity of gate oxide film 8b. Furthermore, channel inversion occurs to form a p type inversion layer at $n^+$ floating region 7b sandwiched by p base 3 and $p^+$ diverter 6c in the proximity of gate oxide film 8c and $n^+$ floating region 7c sandwiched by p base 3 and $p^+$ diverter 6d. The hole-current flowing within p base 3 is diverted towards cathode electrode 10, and $p^+$ diverter electrodes 11a, 11b and 11c by this p type inversion layer. When the current in the thyristor becomes lower than the holding current, the thyristor operation is suppressed, whereby the main current across cathode electrode 10 and anode electrode 9 is cut off.

In the present embodiment, hole-current flows towards $p^+$ diverters 6a, 6c and 6d and to $p^+$ contact 4. In other words, the hole-current is drawn out from four electrodes. A case is considered of including n $p^+$ diverters including $p^+$ contact 4. It is assumed that each $p^+$ diverter is formed within p base 3 so that the distance between respective $p^+$ diverters and the distance between $p^+$ contact 4 and the $p^+$ diverter closest to $p^+$ contact 4 is constant. It is assumed that current flows uniformly within p base 3, and that the concentration distribution is seen only in the direction of depth within p base 3.

Since the current flowing towards the $p^+$ diverters and the $p^+$ contact is substantially identical, the current flowing to each $p^+$ diverter electrode is 1/n times that of an ESTD and ½n times that of an ESTD.

Since the distance between each $p^+$ diverter is constant and the potential right beneath the gate oxide film is substantially equal to the potential of the cathode, the length of the region causing a voltage drop and the resistance in that region respectively become 1/n times those of an EST and ½n times those of an ESTD.

Thus, the voltage drop in the p base becomes $1/n^2$ times that of an EST and $¼n^2$ times that of an ESTD. Since the effective holding current of the element in channel inversion is increased as the number of $p^+$ diverters within the element becomes greater, the controllable current is further improved.

The conditions for improving the controllable current of the element are set forth in the following.

The first condition is to provide the Nth $p^+$ diverter in a current path of an on-state, that is, within the p base region, so that the maximum potential within the p base is lower than the case where the nth $p^+$ diverter is not provided.

The second condition is to dispose the p diverters so that the value of the maximum potential between the two closest $p^+$ diverters is equal to the value of the maximum potential between other $p^+$ diverters, whereby the holding current can be maximized. The controllable current can be set to the greatest level by this condition.

In view of the foregoing, the controllable current can be improved even if the $p^+$ diverters are not arranged at equal distance such as in the present embodiment for $p^+$ diverters 6a, 6c and 6d, as long as the first condition is met.

When the current distribution is not uniform, the controllable current can be improved by reducing the distance between the $p^+$ diverters at the high current density portion and satisfying the first and second conditions.

When the impurity concentration within p base 3 is not uniform, the controllable current can be improved by increasing the distance between the $p^+$ diverters in the area where the concentration is high in p base 3 and satisfying the first and second conditions.

In the second embodiment, the effective holding current of the element in channel inversion is increased to improve the controllable current of the element by providing a plurality of p⁺ diverters 6a, 6c and 6d with the distance therebetween set so that the voltage drop is minimized in the region of p base 3.

Third Embodiment

Figure 7:
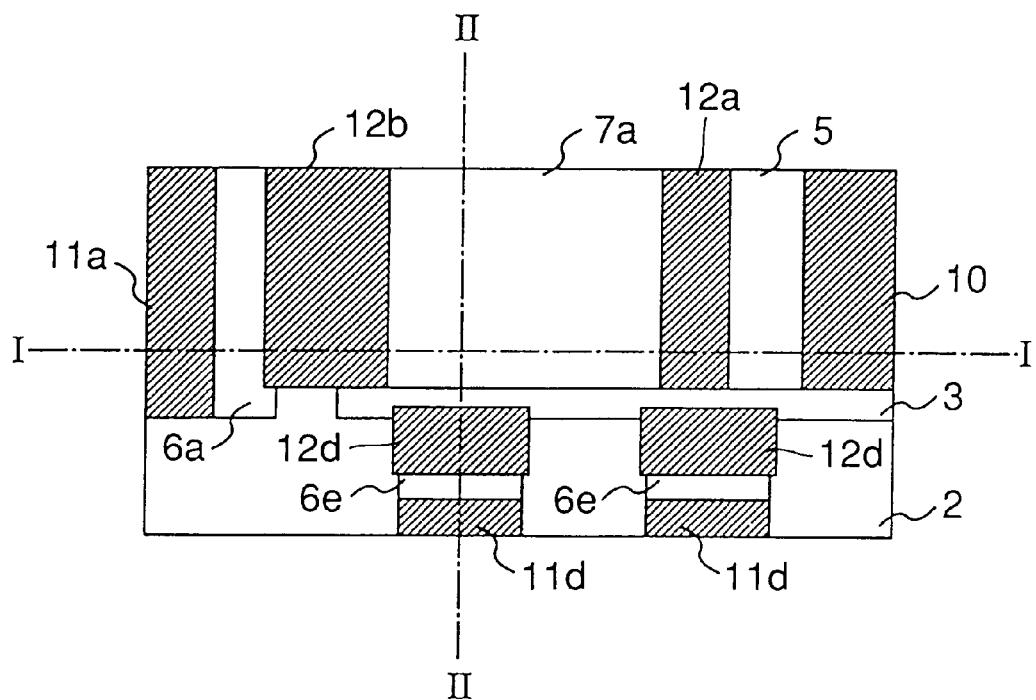
FIG. 7 is a plan view of a semiconductor device according to a third embodiment of the present invention.
Figure 8:
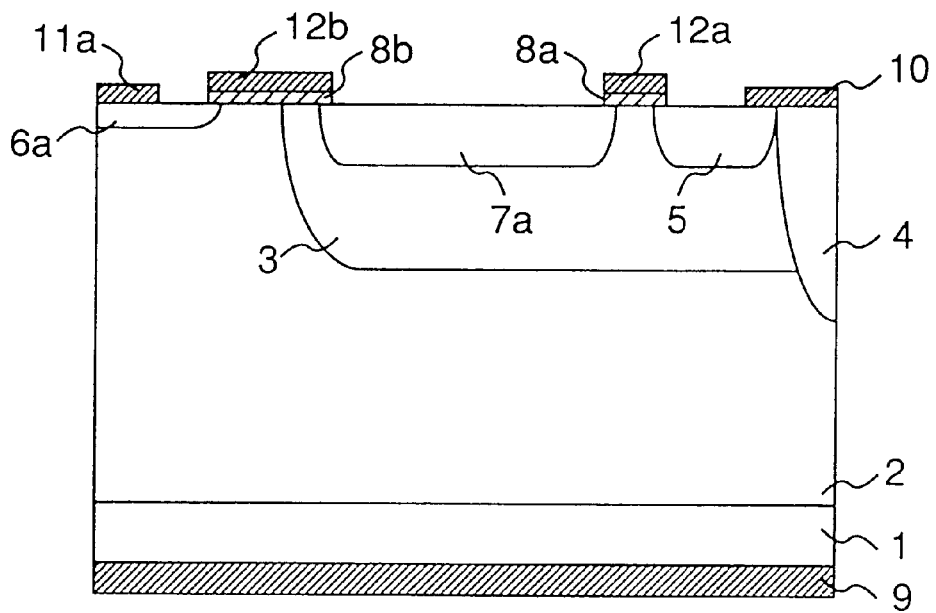
FIG. 8 is a sectional view of the semiconductor device of FIG. 7 taken along I—I.
Figure 9:
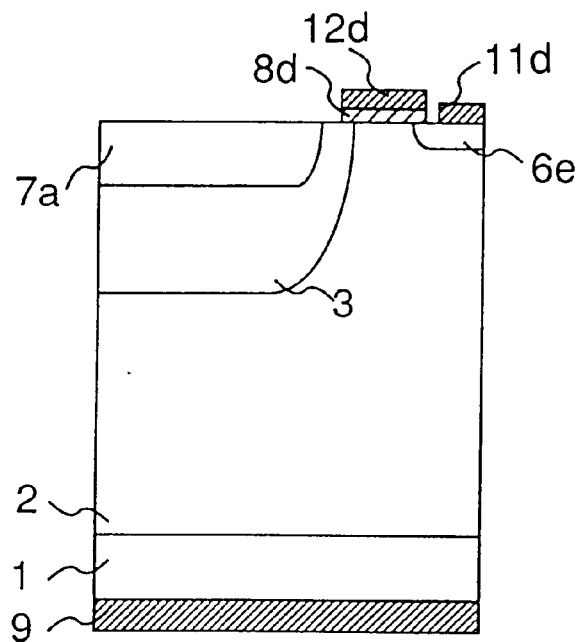
FIG. 9 is a sectional view of the semiconductor device of FIG. 7 taken along II—II.

Referring to FIGS. 7, 8 and 9, a thyristor according to a third embodiment of the present invention includes a p⁺ diverter 6e provided external to the region of p base 3 along the current path within the region of p base 3. It is appreciated from FIGS. 8 and 9 that all p⁺ diverters 6a and 6b are in contact with n⁻layer 2 of the semiconductor substrate. P base 3 and p⁺ diverter 6a are electrically connected by a p channel region formed at n⁻layer 2 sandwiched by p⁺ diverter 6a and p base 3 in the proximity of gate oxide film 8b formed by applying a predetermined threshold voltage to gate electrode 12b. P base 3 and p⁺ diverter 6e are electrically connected by a p channel region formed at n⁻layer 2 sandwiched by p⁺ diverter 6e and p base 3 in the proximity of gate oxide film 8d by applying a predetermined threshold voltage to gate electrode 12d.

The remaining structure is similar to that of the first embodiment. Corresponding components have the same 5 reference characters allotted, and their description will not be repeated.

The operation will be described hereinafter.

An on-state operation is realized by applying a voltage higher than a threshold voltage to gate electrodes 12a, 12b and 12d. An off-state is realized by applying a voltage lower than a threshold voltage to each gate electrode. The details of the operation are substantially similar to that described in the first embodiment, and will not otherwise be repeated.

In the present embodiment, p⁺ diverter 6e is provided along the current path, that is, along the region of p base 3, so that hole-current is conducted also to p⁺ diverter 6e in a turn-off state. Therefore, the effective holding current of the element in channel inversion is increased to improve the controllable current.

Figure 6:
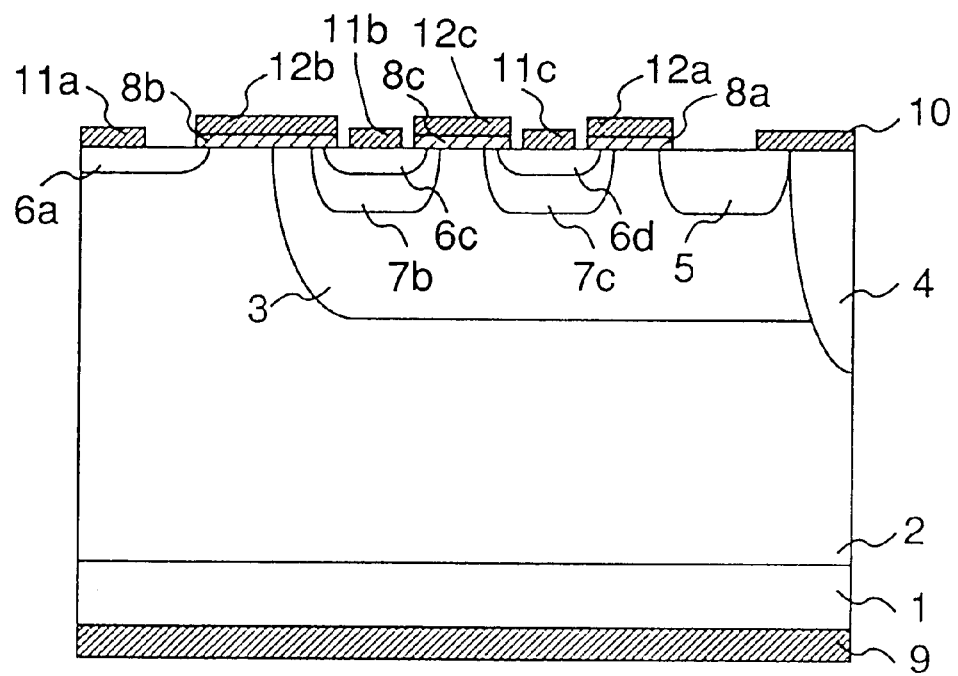
FIG. 6 is a sectional view of the semiconductor device of FIG. 5 taken along I—I.

The cross section structure taken in the direction of I—I is not limited to that shown in FIG. 8, and the structures shown in FIGS. 2 and 6 of the first and second embodiments, respectively, may be applied When the n p⁺ diverters 6e are formed at equal distance, the voltage drop becomes $1/n^2$ times that of an EST and $4/n^2$ times that of an ESTD. Therefore, the effective holding current of the element in channel inversion is further increased to further improve the controllable current.

Fourth Embodiment

Figure 10:
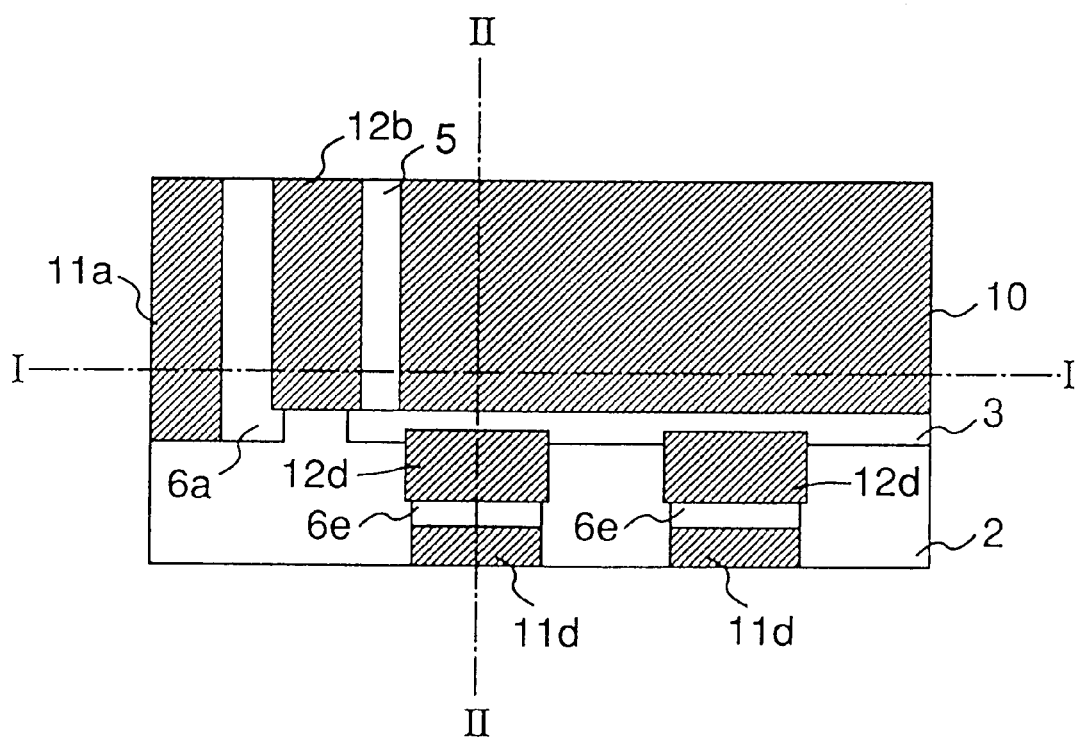
FIG. 10 is a plan view showing a semiconductor device according to a fourth embodiment of the present invention.

A thyristor according to a fourth embodiment of the present invention will be described hereinafter with reference to FIGS. 10–12.

Figure 11:
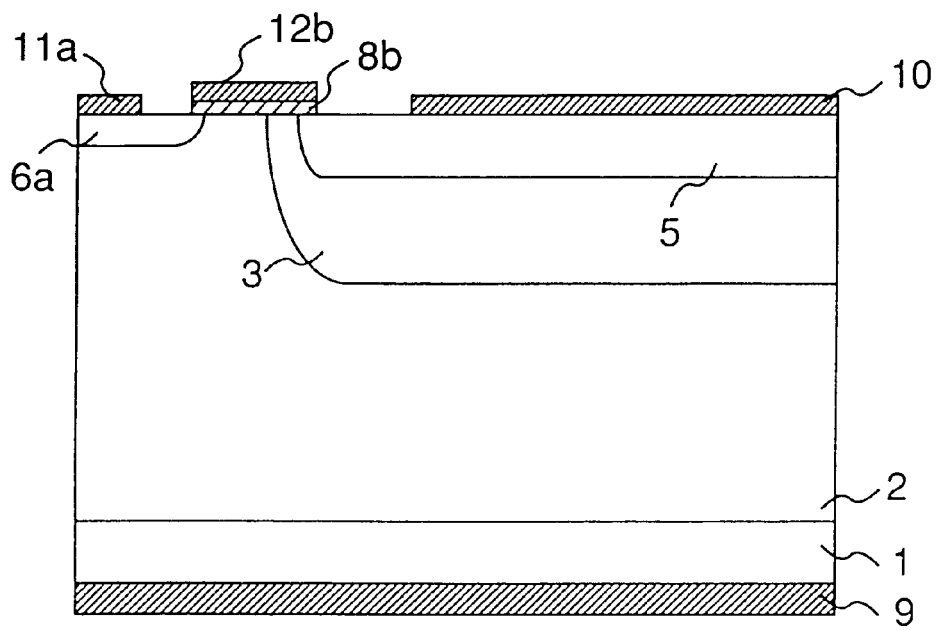
FIGS. 11 and 12 are sectional views of the semiconductor device of FIG. 10 taken along I—I and II—II, respectively.
Figure 12:
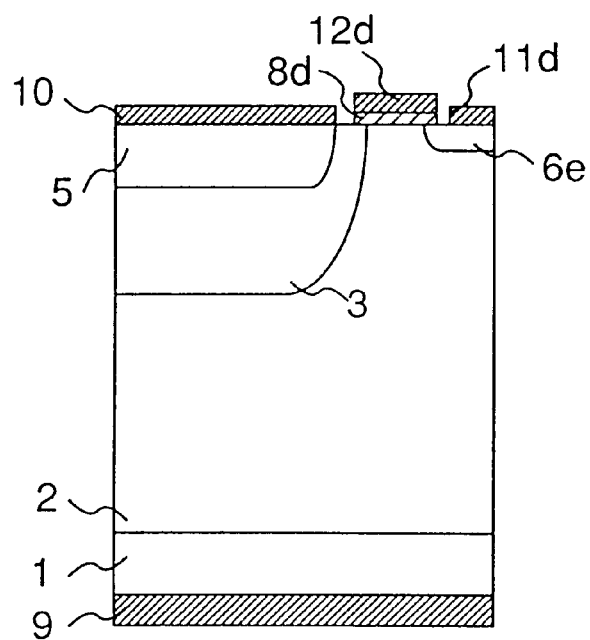
Figure 65:
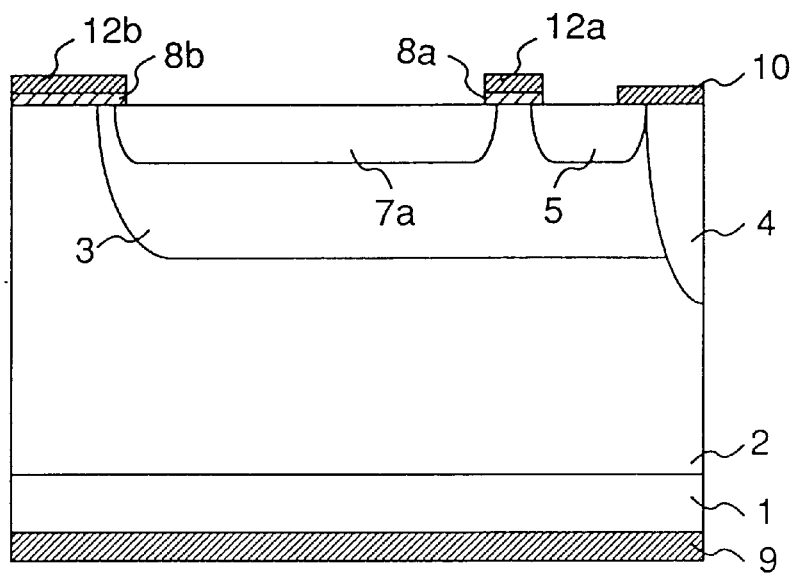
FIGS. 65 and 66 shows examples of cross sectional views of a conventional semiconductor device.
Figure 66:
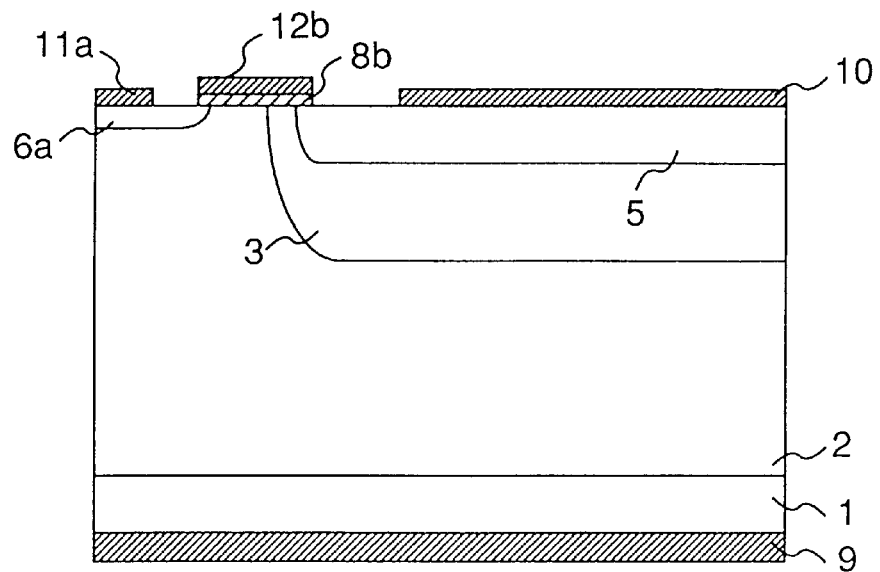
Figure 67:
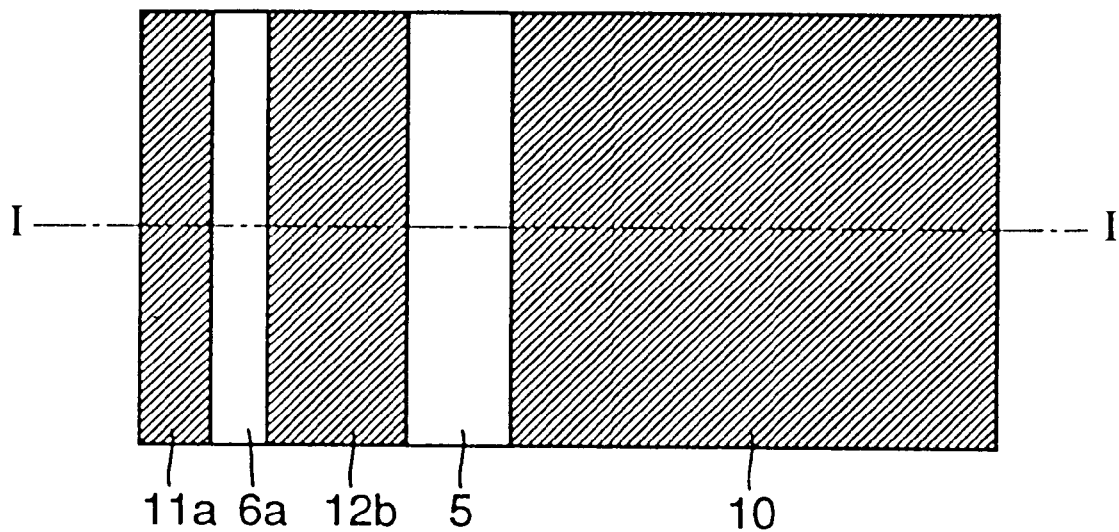
FIG. 67 is a plan view of the semiconductor device of FIG. 66.

It is appreciated from FIG. 11 that the thyristor of the fourth embodiment has a sectional structure of the BRT shown in FIG. 65 of the prior art. The thyristor of FIGS. 10–12 includes a p⁺ diverter 6e external to the region of p base 3 along the current path, that is, along the region of p base 3. P⁺ diverter 6e is in contact with n⁻ layer 2 of the semiconductor substrate. P base 3 and p⁺ diverter 6e are electrically connected by a p channel region formed at n⁻ layer 2 sandwiched by p⁺ diverter 6e and p base 3 in the proximity of gate oxide film 8d by applying a predetermined threshold voltage to gate electrode 12d.

The remaining structure is similar to that of the BRT of the prior art. Corresponding components have the same reference characters allotted, and their description will not be repeated.

The operation of the thyristor of the fourth embodiment will be described hereinafter. An on-state can be realized by applying a voltage higher than a threshold voltage to gate electrode 12b. More specifically, application of a voltage greater than the threshold voltage to gate electrode 12b causes formation of an n channel region at p base 3 sandwiched by n⁺ cathode 5 and n⁻ layer 2 in the proximity of gate oxide film 8b, whereby electron-current begins to flow from n⁺ cathode 5 towards n⁻ layer 2. When this electron-current becomes greater to increase the potential within p base 3 so that the level exceeds the internal potential of the pn junction formed of n⁺ cathode 5 and p base 3, hole-current flows towards n⁺ cathode 5, whereby the pn junction of n⁺ cathode 5 and p base 3 attains a forward bias state. In other words, the thyristor is turned on to initiate its operation. Thus, there is a main current flow across cathode electrode 10 and anode electrode 9.

An off-state can be realized by applying a voltage lower than a negative threshold voltage to gate electrodes 12b and 12d. More specifically, channel inversion occurs to generate a p channel region at n⁻ layer 2 sandwiched by p base 3 and p⁺ diverter 6a in the proximity of gate oxide film 8b, and also at n⁻ layer 2 sandwiched by p base 3 and p⁺ diverter 6e in the proximity of gate oxide film 8d. As a result, the hole-current in p base 3 is split towards p⁺ diverters 6a and 6e through the p channel region. Therefore, the current flowing through p base 3 is reduced. When the current becomes lower than the holding current of the thyristor formed of p⁺ anode 1, n⁻ layer 2, p base 3 and n⁺ cathode 5, the thyristor operation is inhibited, whereby the main current across cathode electrode 10 and anode electrode 9 is cut off.

In the present embodiment, p⁺ diverter 6e is provided along the region of p base 3. Similarly as described in the third embodiment, the hole-current can be split to increase the controllable current.

Similar to the second embodiment, arrangement of the n p⁺ diverters at equal distance therebetween renders the voltage drop to be $1/n^2$ times that of a conventional EST and to $4/n^2$ times that of an ESTD to allow increase in the effective holding current of the device in channel inversion. As a result, the controllable current is improved. The thyristor of the fourth embodiment is further advantageous in that the manufacturing step can be simplified since the step of forming the n⁺ floating region is not required. This is due to the fact that p⁺ diverters 6a and 6e are all formed in contact with n⁻ layer 2 of the semiconductor substrate and that the n⁺ floating region surrounds p⁺ diverters 6a and 6e.

Fifth Embodiment

Figure 13:
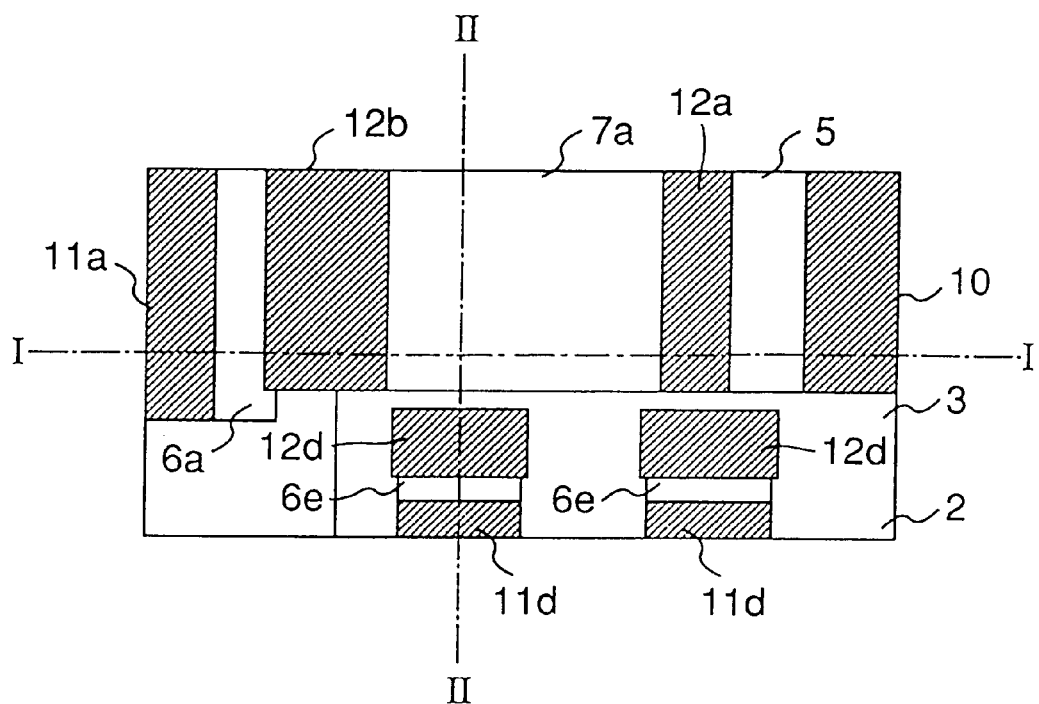
FIG. 13 is a plan view of a semiconductor device according to a fifth embodiment of the present invention.
Figure 14:
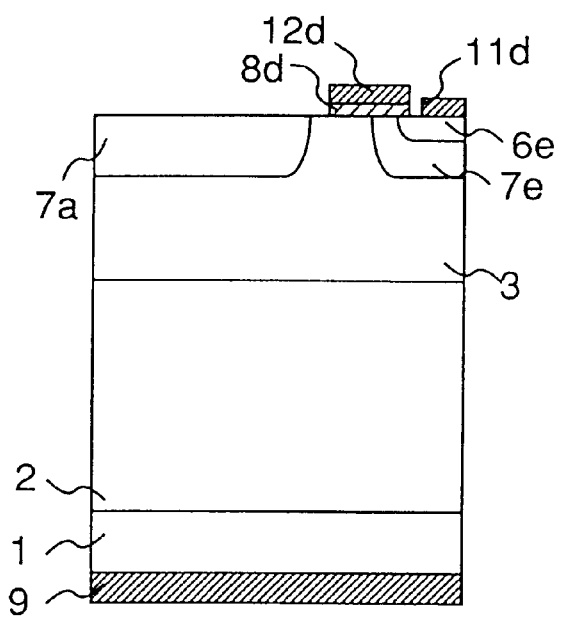
FIG. 14 is a sectional view showing the semiconductor device of FIG. 13 taken along II—II.

A thyristor according to a fifth embodiment of the present invention will be described with reference to FIGS. 13, 8 and 14. The cross section at I—I of FIG. 13 is identical to that of FIG. 8. The thyristor of the fifth embodiment includes a p⁺ diverter 6e formed within the region of p base 3 along the current path in the region of p base 3, and isolated from p base 3 by n⁺ floating region 7e. P base 3 and p⁺ diverter 6e are electrically connected by a p channel region formed at n⁺ floating region 7e in the proximity of gate oxide film 8d.

The remaining structure is similar to that described with reference to the third embodiment. Corresponding components have the same reference characters allotted, and their description will not be repeated.

The operation is also similar to the operation described with reference to the third embodiment. Particularly in the present embodiment, p base 3 and p⁺ diverter 6a are electrically connected by a p channel region formed at n⁻ layer 2 in the proximity of gate oxide film 8a. P base 3 and p⁺ diverter 6e are electrically connected by a p channel formed at n⁺ floating region 7e in the proximity of gate oxide film 8d. Therefore, the hole-current is diverted efficiently towards p⁺ diverter 6e formed in the proximity of the region of p base 3 along the current path within the p base region. Therefore, the effective holding current of the element in channel inversion is increased to improve the controllable current.

When the n p⁺ diverters are formed so as to be equally distant from each other as described in the second embodiment, the effective holding current of the device at channel inversion is further increased to further improve the controllable current.

Since hole-current does not flow into p⁺ diverter 6e formed within p base 3 at an on-state, turn-on characteristic similar to that of a conventional ESTD can be obtained.

Sixth Embodiment

Figure 15:
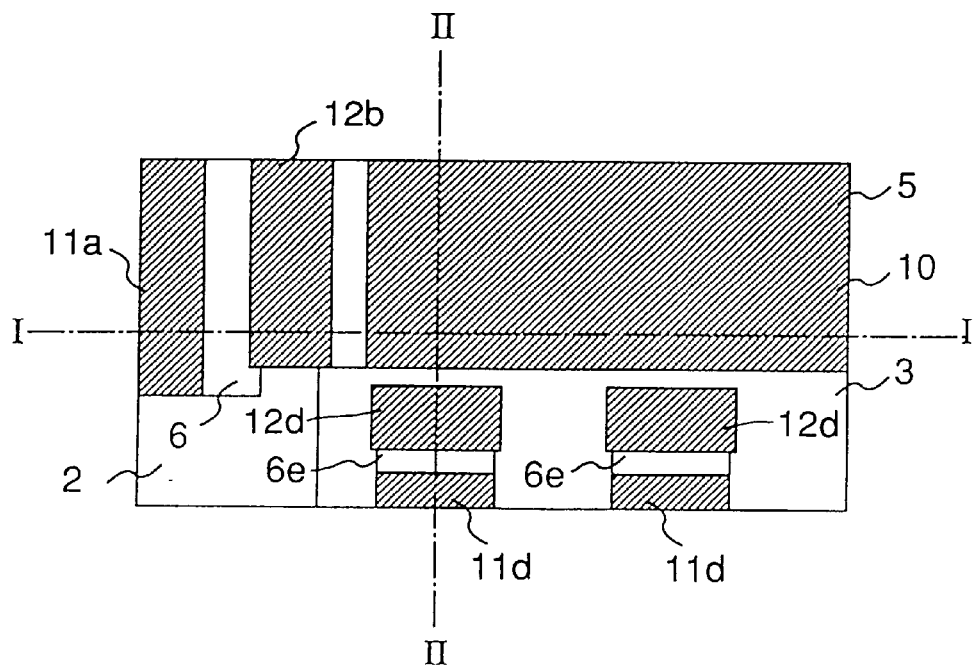
FIG. 15 is a plan view of a semiconductor device according to a sixth embodiment of the present invention.
Figure 16:
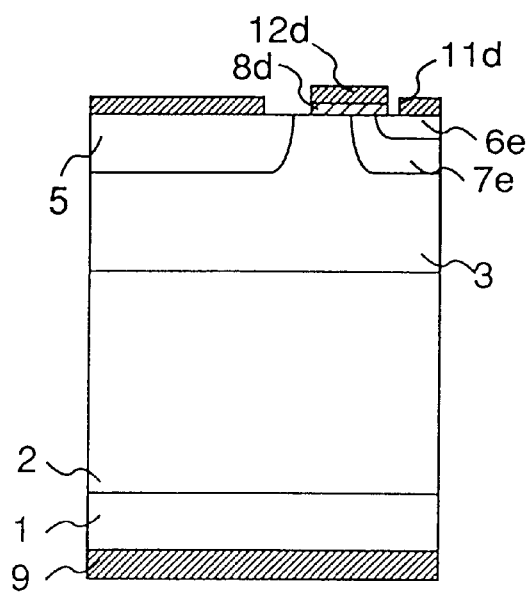
FIG. 16 is a sectional view of the semiconductor device of FIG. 15 taken along II—II.

Referring to FIGS. 11, 15 and 16, a thyristor according to a sixth embodiment of the present invention includes a p⁺ diverter 6e formed within p base 3 along the current path in p base 3, and isolated from p base 3 by n⁺ floating region 7e. P base 3 and p⁺ diverter 6a are electrically connected by a p channel region formed at n⁻ layer 2 in the proximity of gate oxide film 8b. P base 3 and p⁺ diverter 6e are electrically connected by a p channel region formed at n⁺ floating region 7e in the proximity of gate oxide film 8d.

The remaining structure is similar to that of the fourth embodiment, and corresponding components have the same reference characters allotted. The operation is also similar to the operation described with reference to the fourth embodiment.

In the present embodiment, p⁺ diverter 6e is provided along the current path within the region of p base 3. Therefore, the hole-current is diverted efficiently towards p⁺ diverter 6e formed in the proximity of the region of p base 3. Therefore, the effective holding current of the element in channel inversion is increased to improve the controllable current.

As described in the second embodiment, formation of the n p⁺ diverters at equal distance therebetween causes further increase in the effective holding current of the element in channel inversion to improve the controllable current.

Since hole-current does not flow into p⁺ diverter 6e formed in p base 3 at an on-state, a turn-on characteristic similar to that of the conventional ESTD can be obtained.

Seventh Embodiment

A thyristor according to a seventh embodiment of the present invention will be described with reference to FIG. 17. The cross section at I—I in FIG. 17 is identical to the view of FIG. 8.

Figure 17:
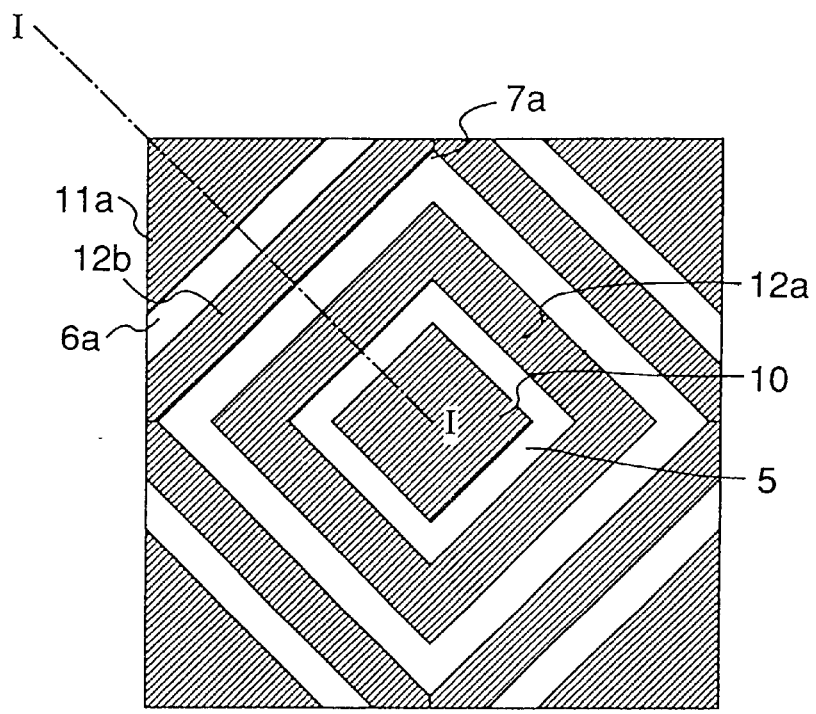
FIGS. 17–29 are plan views of a semiconductor device according to seventh to nineteenth embodiments, respectively, of the present invention.

The thyristor of FIG. 17 includes a p⁺ diverter 6a in the proximity of the four corners of a square which is the unitary structure of the element formation region.

The remaining structure is similar to that described with reference to the third embodiment, and corresponding components have the same reference characters allotted.

The operation of the thyristor is also similar to that described with reference to the third embodiment. Particularly in the thyristor of the present seventh embodiment, the hole-current is diverted in a plane manner at an off-state by means of p⁺ contact 4 and four p⁺ diverters 6a. The voltage drop in p base 3 can be lowered to improve the controllable current of the element.

By virtue of the present embodiment in which the unitary structure of the formation region of the element is a square, unevenness in the plane distribution of the current is reduced, so that unstable operation does not easily occur. Since the unitary structure of an element is a square, elements can be arranged with no space therebetween. Therefore, extra regions can be eliminated.

A similar effect can be obtained even when the unitary structure is rectangular.

Eighth Embodiment

Figure 18:
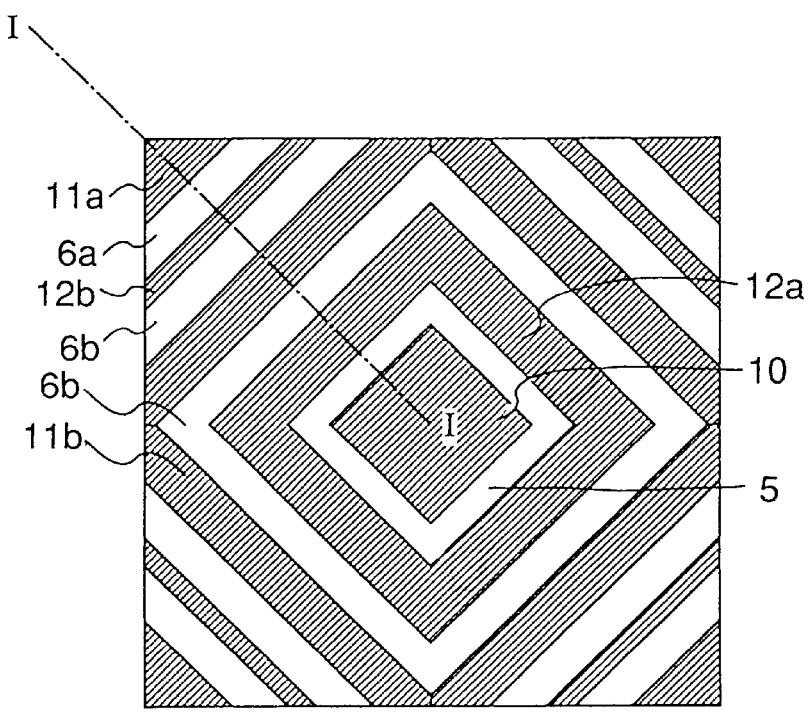

A thyristor according to an eighth embodiment of the present invention will be described with reference to the plane structure of FIG. 18. The cross section at I—I of FIG. 18 is identical to the view of FIG. 2.

The thyristor of the eighth embodiment includes p⁺ diverters 6a in the proximity of the four corners of a square which is the unitary structure of the thyristor formation region. The remaining structure is similar to that described with reference to the first embodiment. Corresponding components have the same reference characters allotted, and their description will not be repeated.

The operation is also similar to the operation described with reference to FIG. 1. Particularly in the thyristor of the present embodiment, the controllable current of the entire element can be improved by the advantage of diverting the current in a plane manner by provision of the p⁺ contact 4 and four p⁺ diverters 6a, and the current cut off effect due to the provision of p⁺ diverter 6b in the region of p base 3.

As described in the second embodiment, provision of a plurality of p⁺ diverters along the current path in the region of p base 3 allows further improvement in the controllable current cut off effect. By setting the distance between the p⁺ diverters equal to render the maximum potential in the region of p base 3 between each of the p⁺ diverters uniform, the controllable current can be optimized.

Since the unitary structure of the formation region of the element is a square in the present embodiment, variation in the current plane distribution is reduced. Therefore, unstable operation does not easily occur. The unitary structure of the device taking a square allows the elements to be arranged with no space therebetween. Therefore, extra region can be eliminated. A similar effect can be obtained even when the unitary structure is rectangle.

Ninth Embodiment

A thyristor according to a ninth embodiment of the present invention will be described with reference to the plan view of FIG. 19. A cross section at I—I of FIG. 19 is identical to the view of FIG. 11.

Figure 19:
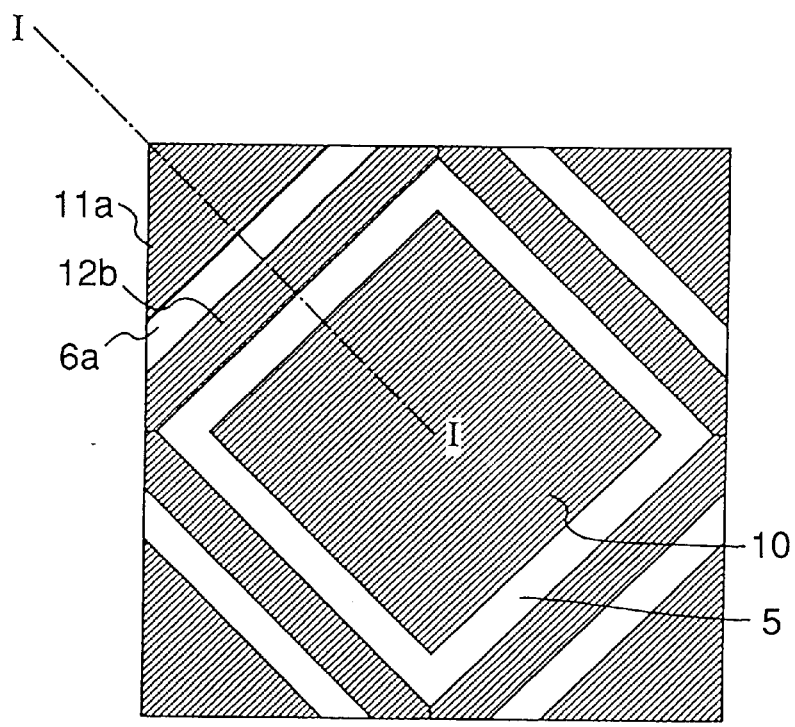

Referring to FIG. 19, the thyristor of the ninth embodiment includes 4 p⁺ diverters 6a at the proximity of the four corners of a square which is the unitary structure of the formation region.

The remaining structure is similar to that described with reference to the fourth embodiment. Corresponding components have the same reference characters allotted, and their description will not be repeated.

The operation is also similar to that described with reference to the fourth embodiment. In an off-state, the provision of p⁺ contact 4 and 4 p⁺ diverters 6a allows the current to be divided towards p⁺ contact 4 and 4 p⁺ diverters 6a to lower the voltage drop in p base 3. By advantage of conducting the current flow in a divided manner in plan, the controllable current of the entire element can be improved. Variation in the plane current distribution is reduced since the unitary structure of the formation region of the element is a square. Therefore, unstable operation does not easily occur.

Since elements can be arranged with no space therebetween by virtue of the unitary structure of a device taking a square, extra areas can be eliminated. A similar effect can be obtained even when the unitary structure is a rectangle.

Tenth Embodiment

A thyristor according to a tenth embodiment of the present invention will be described with reference to the plan structure of FIG. 20. The cross section at I—I in FIG. 20 is similar to the view of FIG. 8.

Figure 20:
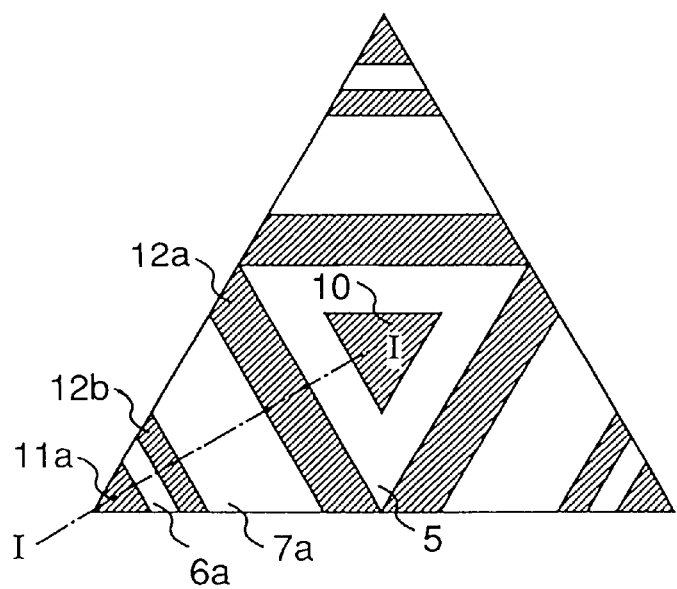

Referring to FIG. 20, the thyristor of the tenth embodiment includes three $p^+$ diverters 6a in the proximity of the three corners of a regular triangle which is the unitary structure of the formation region. The remaining structure is similar to that described with reference to the third embodiment. Corresponding components of the same reference characters allotted, and their description will not be repeated.

The operation is also similar to that described with reference to the third embodiment. Particularly in the present tenth embodiment, current can be split in a plane manner by virtue of including $p^+$ contact 4 and three $p^+$ diverters 6a. The voltage drop in p base 3 is reduced to allow improvement of the controllable current of the device.

Since the unitary structure of the element is an equilateral triangle, extra regions can be eliminated since elements can be disposed with no space therebetween. A similar effect can be obtained when the unitary structure of the element is an isosceles triangle.

Eleventh Embodiment

A thyristor according to an eleventh embodiment of the present invention will be described with reference to the same structure of FIG. 21. The cross section at I—I of FIG. 21 is identical to the view of FIG. 2.

Figure 21:
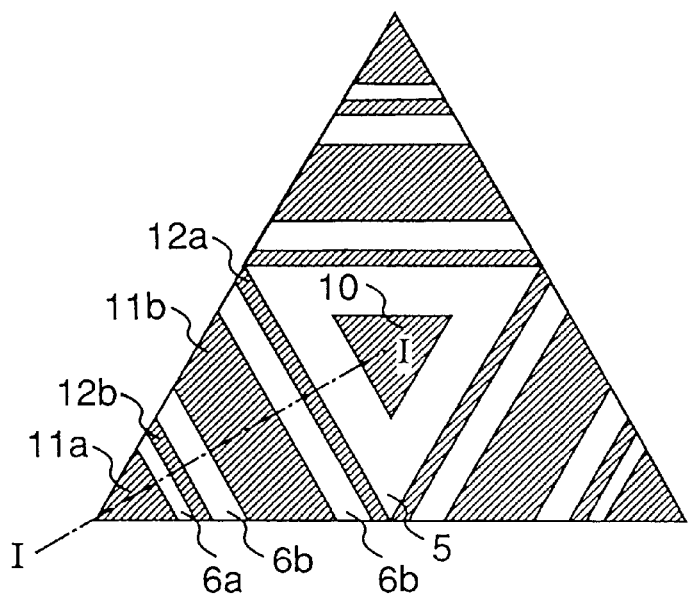

Referring to FIG. 21, the thyristor of the eleventh embodiment includes $p^+$ diverter 6a in the proximity of the corners of an equilateral triangle which is a unitary structure of the thyristor. The remaining structure is similar to that described with reference to the first embodiment. Corresponding components have the same reference characters allotted, and their description will not be repeated.

The operation is also similar to that described with reference to the first embodiment. Particularly in an off-state, the controllable current of the entire element can be improved by the advantage of dividing the current flow in a plane manner by virtue of including $p^+$ contact 4 and 3 $p^+$ diverters 6a, and the current cut off effect by virtue of including $p^+$ diverter 6b in the region of p base 3.

The controllable current can further be improved by providing a plurality of $p^+$ diverters 6b along the current path within the region of p base 3. The controllable current can be optimized by setting the distance between $p^+$ diverters 6b equal to render uniform the maximum potential in p base 3 between $p^+$ diverter 6b.

Since the unitary structure of the element is a regular triangle, elements can be disposed with no space therebetween to eliminate extra areas. A similar effect can be obtained even when the unitary structure of the element is an isosceles triangle.

Twelfth Embodiment

A thyristor according to a twelfth embodiment of the present invention will be described hereinafter with reference to the plan view of FIG. 22.

Figure 22:
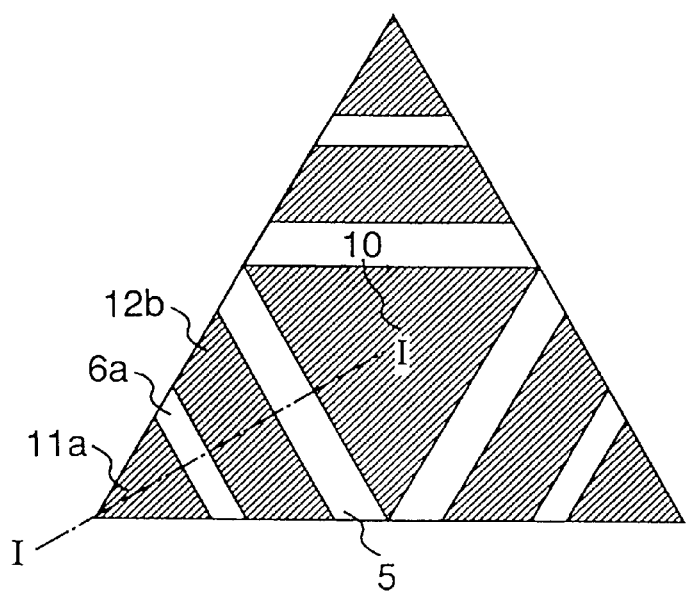

The cross section of I—I of FIG. 22 is identical to the view of FIG. 11.

Referring to FIG. 22, the thyristor of the twelfth embodiment includes $p^+$ diverter 6a in the proximity of the corners in a regular triangle which is the unitary structure of the thyristor.

The remaining structure is similar to that described with reference to the fourth embodiment. Corresponding components have the same reference characters allotted, and their description will not be repeated.

The operation is also similar to that described with reference to the fourth embodiment. Particularly in an off-state, the current flow can be divided in a plane manner by virtue of including $p^+$ contact 4 and 3 $p^+$ diverters 6a. The voltage drop in p base 3 is reduced to allow improvement in the controllable current of the element.

Since the unitary structure of the device takes an equilateral triangle shape, elements can be disposed with no space therebetween to eliminate extra areas. A similar effect can be achieved even when the unitary structure of the element is an isosceles triangle.

Thirteenth Embodiment

A thyristor according to a thirteenth embodiment of the present invention will be described with reference to the plane structure of FIG. 23. The cross section at I—I of FIG. 23 is identical to the view of FIG. 8.

Figure 23:
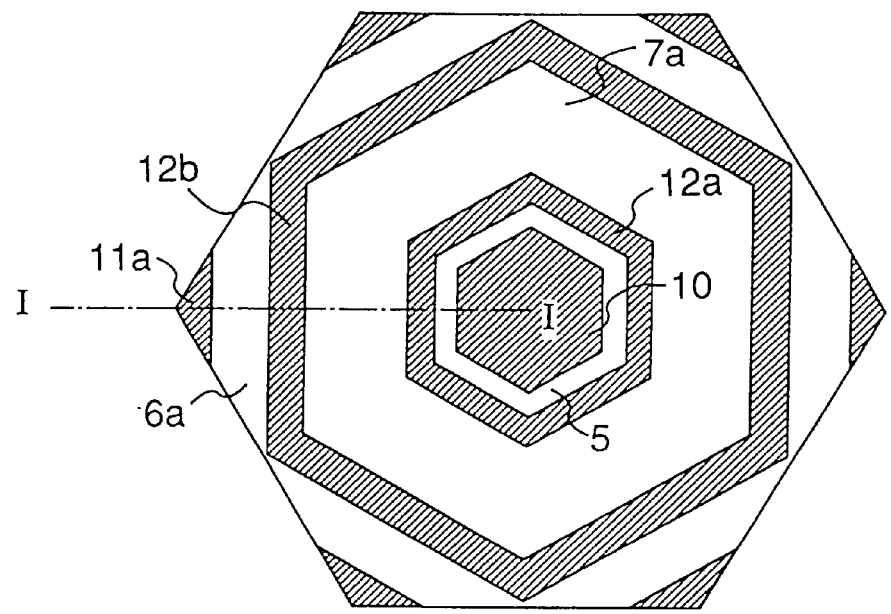

The thyristor of FIG. 23 includes 6 $p^+$ diverters 6a in the proximity of the six corners of a regular hexagon which is the unitary structure of the thyristor. The remaining structure is similar to that described with reference to the third embodiment. Corresponding component have the same reference characters allotted, and their description will not be repeated, The operation is also similar to that described with reference to the third embodiment. Particularly in an off-state, the current flow can be divided in a plane manner by virtue of including $p^+$ contact 4 and six $p^+$ diverters 6a. The voltage drop in p base 3 reduced to allow improvement of the effective controllable current of the element.

Since the unitary structure of the element takes an equilateral hexagon configuration, elements can be disposed with no space therebetween to eliminate extra areas.

The hexagon unitary structure of the element also provides the advantage of reducing variation in the plane current distribution. Therefore, unstable operation does not easily occur.

Fourteenth Embodiment

A thyristor according to a fourteenth embodiment of the present invention will be described with reference to the plan view of FIG. 24. The cross section at I—I of FIG. 24 is identical to the view of FIG. 2.

Figure 24:
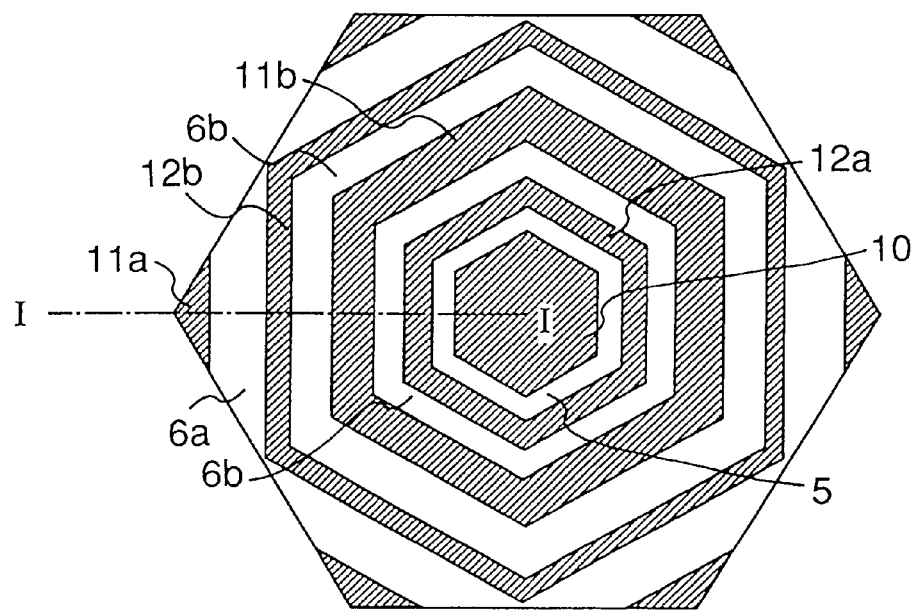

Referring to FIG. 24, the thyristor of the fourteenth embodiment includes six $p^+$ diverters 6a in the proximity of the six corners of a regular hexagon which is the unitary structure of the thyristor.

The remaining structure is similar to that described with reference to the first embodiment. Corresponding components have the same reference characters allotted, and their description will not be repeated.

The operation is similar to that described with reference to the first embodiment. Particularly in an off-state, the controllable current of the entire element can be improved by the advantage of dividing the current flow in a plane manner by virtue of including p+ contact 4 and six p+ diverters 6a, and the current cut off effect by virtue of including the p+ diverter 6b also within the base 3.

As described in the second embodiment, the controllable current can further be improved by providing a plurality of p+ diverters 6b along the current path within the region of p base 3. Furthermore, by setting the distance between the plurality of p+ diverters equal to render uniform the maximum potential between the p+ diverters in p base 3, the controllable current can be optimized.

Since the unitary structure of the element takes an equilateral hexagon configuration, elements can be disposed with no space therebetween. As a result, extra areas can be eliminated.

The unitary structure of the element of a regular hexagon also provides the advantage that variation in the plane current distribution is reduced. Therefore, unstable operation does occur easily.

Fifteenth Embodiment

A thyristor according to a fifteenth embodiment of the present invention will be described with reference to the plane structure of FIG. 25. The cross section at I—I of FIG. 25 is identical to the view of FIG. 11.

Figure 25:
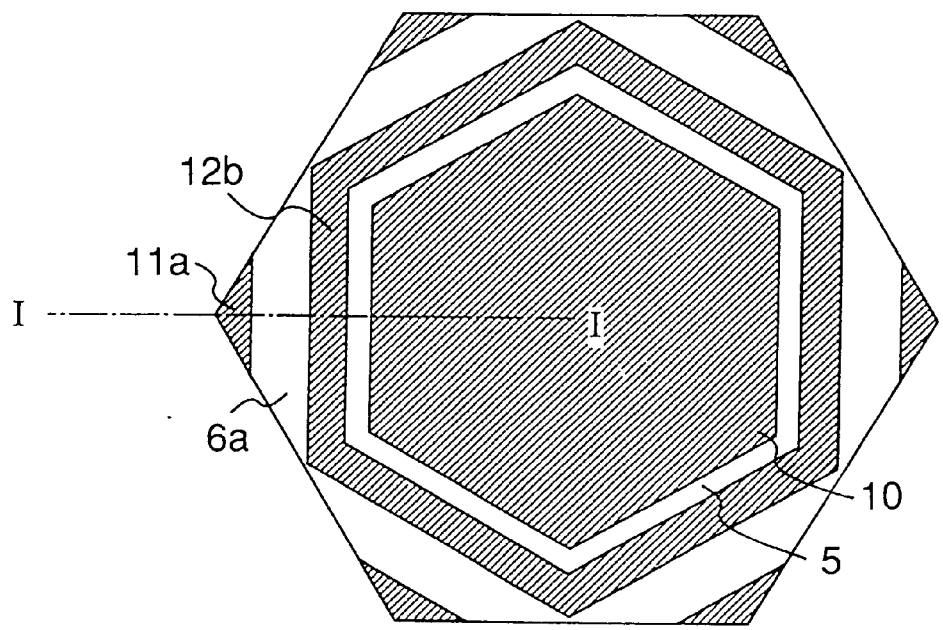

Referring to FIG. 25, the thyristor of the fifteenth embodiment includes 6 p+ diverters 6a in the proximity of the six corners of a regular hexagon which is the unitary structure of the thyristor.

The remaining structure is similar to that described with reference to the fourth embodiment. Corresponding components have the same reference characters allotted, and their description will not be repeated.

The operation is also similar to that described with reference to the fourth embodiment. Particularly in an off-state, the current flow can be divided in a plane manner by virtue of including p+ contact 4 and six p+ diverters 6a. The voltage drop in p base 3 is reduced to allow improvement of the effective controllable current of the device.

Since the unitary structure of the element takes an equilateral hexagon configuration, elements can be disposed with no space therebetween. Therefore, extra areas can be eliminated.

The unitary structure of the element of a regular hexagon also provides the advantage that variation in the plane current distribution is reduced. Therefore, unstable operation does not easily occur.

Sixteenth Embodiment

A thyristor according to the sixteenth embodiment of the present invention will be described with reference to the plane structure of FIG. 26. The cross section at I—I of FIG. 26 is identical to the view of FIG. 8.

Figure 26:
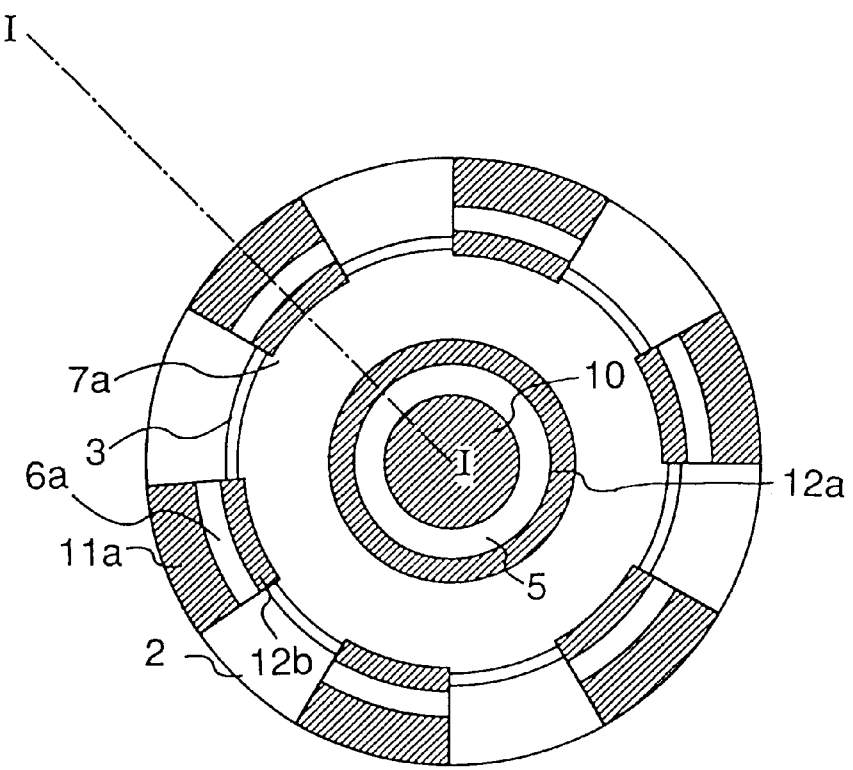

Referring to FIG. 26, the thyristor of the sixteenth embodiment includes 6 p+ diverters 6a spaced apart from each other at the periphery of the region of p base 3 in a circle which is the unitary structure of the thyristor.

The remaining structure is similar to that described with reference to the eighth embodiment. Corresponding components have the same reference characters allotted, and their description will not be repeated.

The operation is also similar to that described with reference to the eighth embodiment. Particularly, the thyristor can divide the current flow in a plane manner at an off-state by virtue of including p+ contact 4 and 6 p+ diverters 6a. The voltage drop within p base 3 is reduced to allow improvement of the effective controllable current of the element.

Since the unitary structure of the element takes a concentric circle structure, variation in the current distribution in plan is reduced. Therefore, unstable operation does not easily occur.

Seventeenth Embodiment

A thyristor according to a seventeenth embodiment of the present invention will be described with reference to the plan structure of a FIG. 27. The cross section at I—I of FIG. 27 is identical to the view of FIG. 2.

Figure 27:
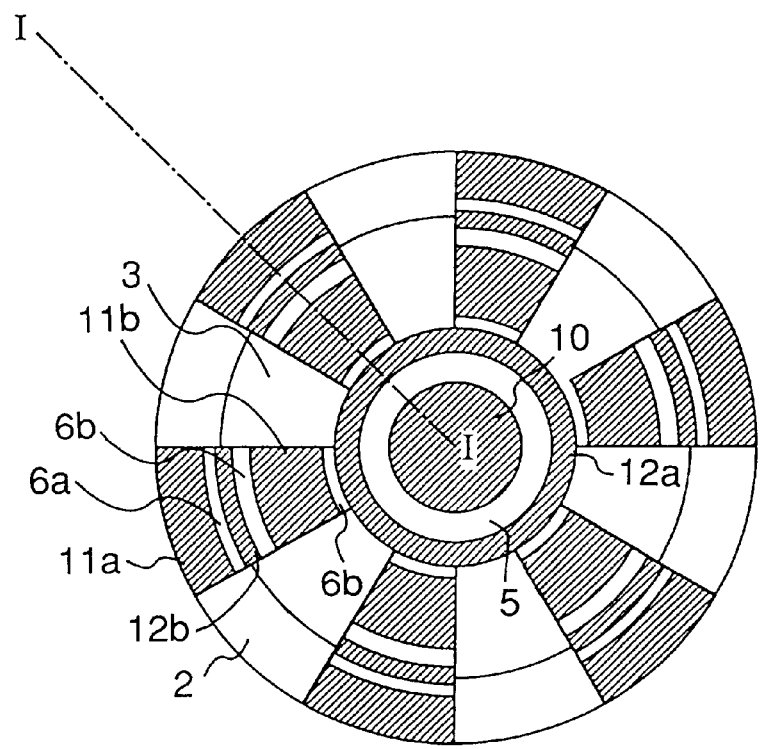

Referring to FIG. 27, the thyristor of the seventeenth embodiment includes 6 p+ diverters 6b spaced apart from each other and surrounding n+ cathode 5 at the periphery of the region of n+ cathode 5, and 6 p+ diverters 6a spaced apart from each other and surrounding p base 3 at the periphery of the region of p base 3.

The remaining structure is similar to that described with reference to the first embodiment. Corresponding components have the same reference characters allotted, and their description will not be repeated.

The operation is similar to that described with reference to the first embodiment. Particularly, the thyristor can have the controllable current of the entire element improved by the advantage of dividing the current flow in a plane manner in an off-state by virtue of including p+ contact 4 and 6 p+ diverters 6a, and the current cut off effect by virtue of including 6 p+ diverters 6b in the region of p base 3.

As described in the second embodiment, the provision of a plurality of p+ diverters 6b along the current path within the region of p base 3 allows further improvement of the controllable current. Furthermore, by setting the distance between p+ diverters 6b equal to render uniform the maximum potential between p+ diverters 6 within p base 3, the controllable current can be optimized.

Since the unitary structure of the element has a concentric circle configuration, variation in the current distribution in the plane is reduced. Therefore, unstable operation does not easily occur.

Eighteenth Embodiment

A thyristor according to an eighteenth embodiment of the present invention will be described with reference to the plane structure of FIG. 28. The cross section at I—I of FIG. 28 is identical to the view of FIG. 11.

Figure 28:
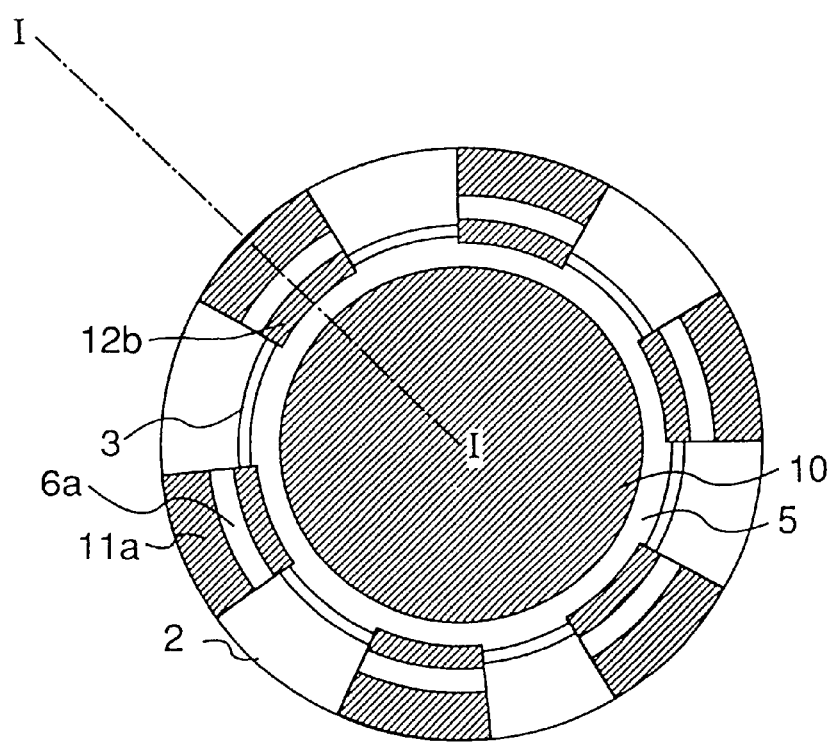

Referring to FIG. 28, the thyristor of the eighteenth embodiment has a concentric circle structure on the basis of the circular cathode electrode 10, and includes 4 p+ diverters 6a spaced apart from each other so as to surround p base 3 at the periphery thereof.

The remaining structure is similar to that described with reference to FIG. 4. Corresponding components have the same reference characters allotted, and their description will not be repeated.

The operation is also similar to that described with reference to the fourth embodiment. Particularly, the thyristor of the present embodiment can have the current flow divided in a plane manner by virtue of including p+ contact 4 and 6 p+ diverters 6a so that the current flow in each p+ diverter 6a is reduced. Therefore, the voltage drop in p base 3 can be reduced to allow improvement of the effective controllable current of the element.

Since the unitary structure of the element takes a concentric circle configuration, variation in the current distribution in plan is reduced. Therefore, unstable operation does not easily occur.

Nineteenth Embodiment

A thyristor according to a nineteenth embodiment of the present invention will be described with reference to the plan view and sectional view of FIGS. 29 and 30. The cross section at II—II of FIG. 29 is identical to the view of FIG. 9.

Figure 29:
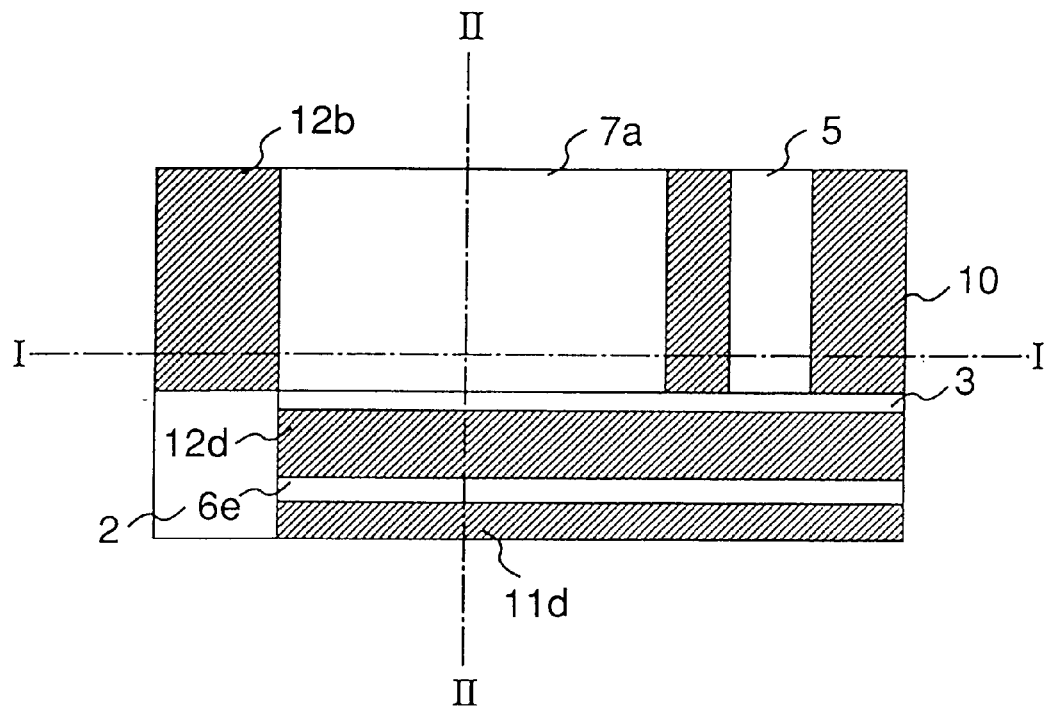
Figure 30:
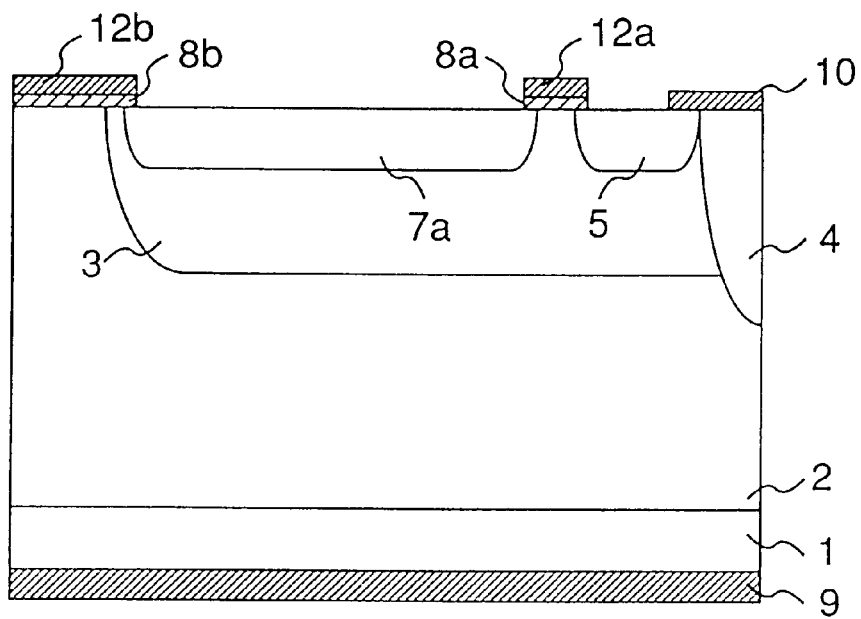
FIG. 30 is a sectional view of the semiconductor device of FIG. 29 taken along I—I.

Referring to FIGS. 29 and 30 or 9, the thyristor of the nineteenth embodiment includes a current path of an on-state, that is, a p base 3 in which the length of the side in a direction orthogonal to the I—I direction is shorter than the length of the side that is parallel to the current path. The thyristor also includes a $p^+$ diverter 6e external to the region of p base 3 in parallel with the current path at an on-state. Taking an arbitrary point on p base 3, the distance from that point to $p^+$ diverter 6e or the distance from that point to $p^+$ contact 4 is equal to or shorter than the distance from that point to $p^+$ contact 4.

Figure 32:
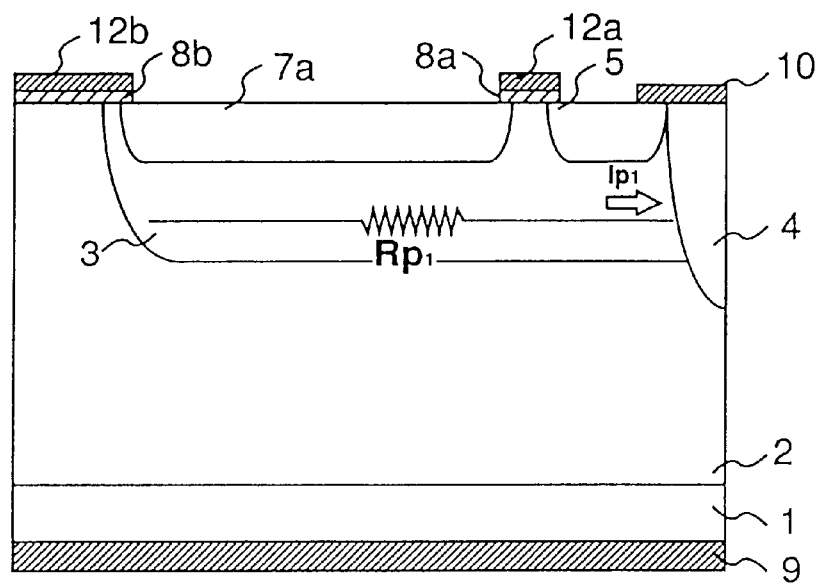
Figure 33:
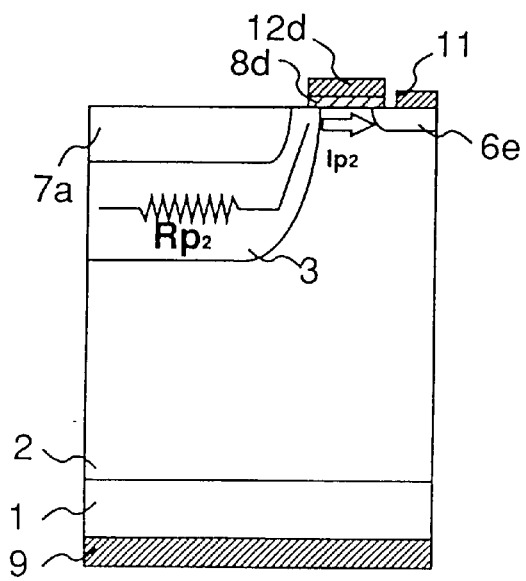

The operation of the thyristor of the nineteenth embodiment will be described with reference to FIGS. 31, 32 and 33.

An on-state can be realized by applying a voltage higher than a threshold voltage to gate electrodes 12a and 12b. When the potential in p base 3 becomes greater than the internal potential of the pn junction formed by p base 3 and $n^+$ floating region 7a, hole-current flows into n floating region 7a, whereby the thyristor is turned on. An off-state can be realized by applying a voltage lower than a threshold voltage to gate electrode 12d.

Figure 31:
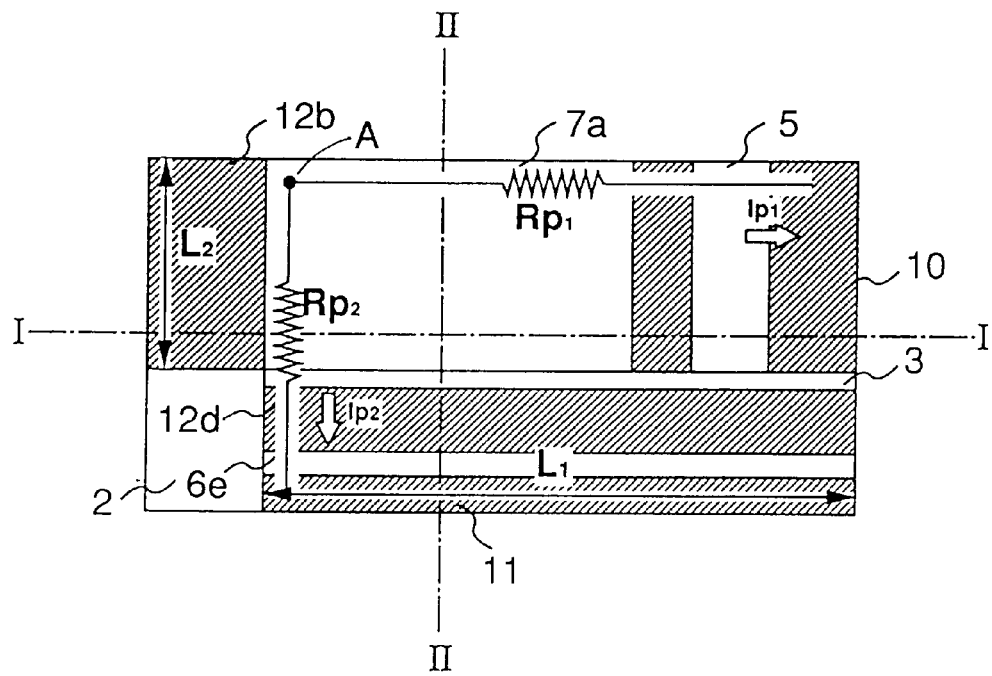
FIGS. 31–33 are diagrams for describing the operation of the semiconductor device of the nineteenth embodiment.

Taking an arbitrary point A on p base 3 in FIG. 31, resistance $Rp_1$ up to $p^+$ contact 4 is proportional to distance L1 up to $p^+$ contact 4. Similarly, assuming that the resistance from point A to $p^+$ diverter 6e is $Rp_2$, $Rp_2$ is proportional to distance L2. Here, $Rp_1$ and $RP_2$ always satisfy the following relationship.

$$Rp_2 \leq Rp_1^-$$

When a p channel region is formed at $n^-$ layer 2 in the proximity of gate oxide film 8d, p base 3 and $p^+$ diverter 6e are electrically connected, whereby the current flow is diverted towards $p^+$ diverter 6e. Assuming that all the current is conducted only to $p^+$ diverter 6e in an on-state, the current density becomes the ratio of sides L1 to L2. Therefore, the hole-current flowing along $Rp_2$ satisfies the following equation.

$$Ip_2=(Ip_1+Ip_2)\times Rp_2/Rp_1$$

The above modification is expressed as:

$$IP_2\times Rp_2=(Ip_1+Ip_2)\times Rp_1\times (Rp_2/Rp_1)^2$$

where the left-hand member of $IP_2 \times Rp_2$ is the voltage drop when there is a $p^+$ diverter, and $(Ip_1+Ip_2)\times Rp_1$ is the voltage drop when there is no $p^+$ diverter and all the hole-current is conducted to $p^+$ contact 4.

Therefore, by taking a sufficient low value of $(Rp_2/Rp_1)$, the voltage drop can be reduced to $(Rp_2/Rp_1)^2$.

In practice, provision of a $p^+$ diverter allows the voltage drop to be further reduced since there are components flowing to $p^+$ contact 4.

From the above equation, the voltage drop at this point in an off-state is reduced to $(Rp_2/Rp_1)^2$. Therefore, the effective holding current of the element in channel inversion is increased to allow improvement of the controllable current.

Twentieth Embodiment

A thyristor according to a twentieth embodiment of the present invention will be described with reference to the plane structure of FIG. 34. Cross sections at I—I and II—II of FIG. 34 are identical to the views of FIGS. 8 and 9, respectively.

Figure 34:
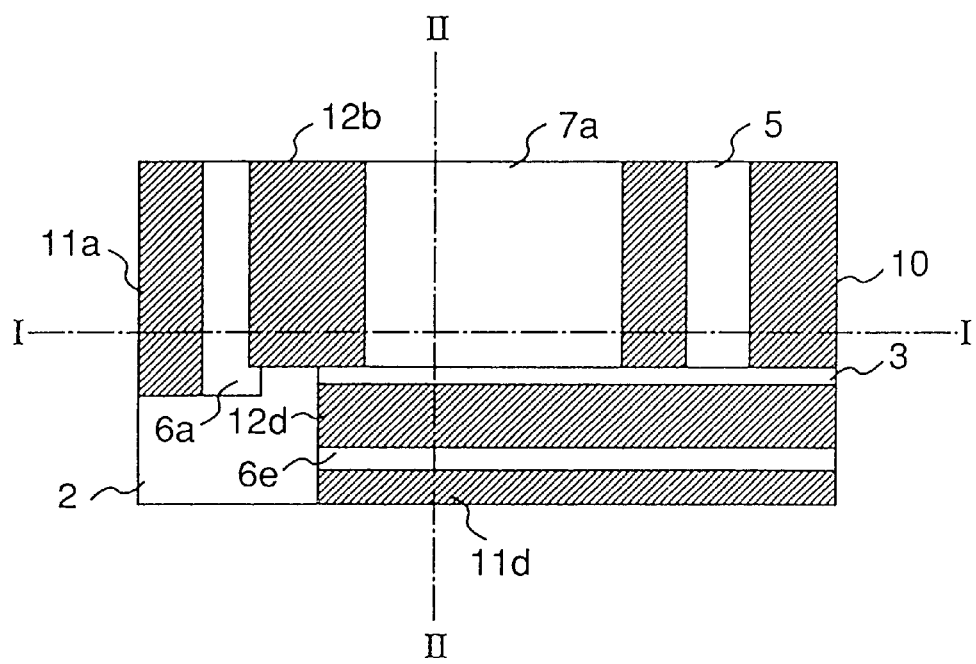
FIGS. 34 and 35 are plan views showing a semiconductor device according to twentieth and twenty-first embodiments, respectively, of the present invention.

Referring to FIG. 34, arrangement of p base 3 and $p^+$ diverter 6e is completely identical to that of the preceding nineteenth embodiment.

The remaining structure is identical to that described with reference to FIG. 3. Corresponding components have the same reference characters allotted, and their description will not be repeated.

The operation is similar to that described with reference to the third embodiment.

In the present embodiment, the distance from an arbitrary point on p base 3 to $p^+$ diverter 6e or to $p^+$ contact 4 is equal to or shorter than the distance between the arbitrary point and $p^+$ contact 4, as in the nineteenth embodiment. Therefore, the current diversion effect by $p^+$ diverter 6a is further added to the effect of the voltage drop reduced to $(Rp_2/Rp_1)^2$ at an arbitrary point. The effective holding current of the element at channel inversion is increased to allow improvement of the controllable current.

Twenty-First Embodiment

A thyristor according to a twenty-first embodiment of the present invention will be described with reference to the plane structure of FIG. 35. The cross sections at I—I and II—II of FIG. 35 are identical to the view of FIGS. 36 and 12, respectively.

Figure 35:
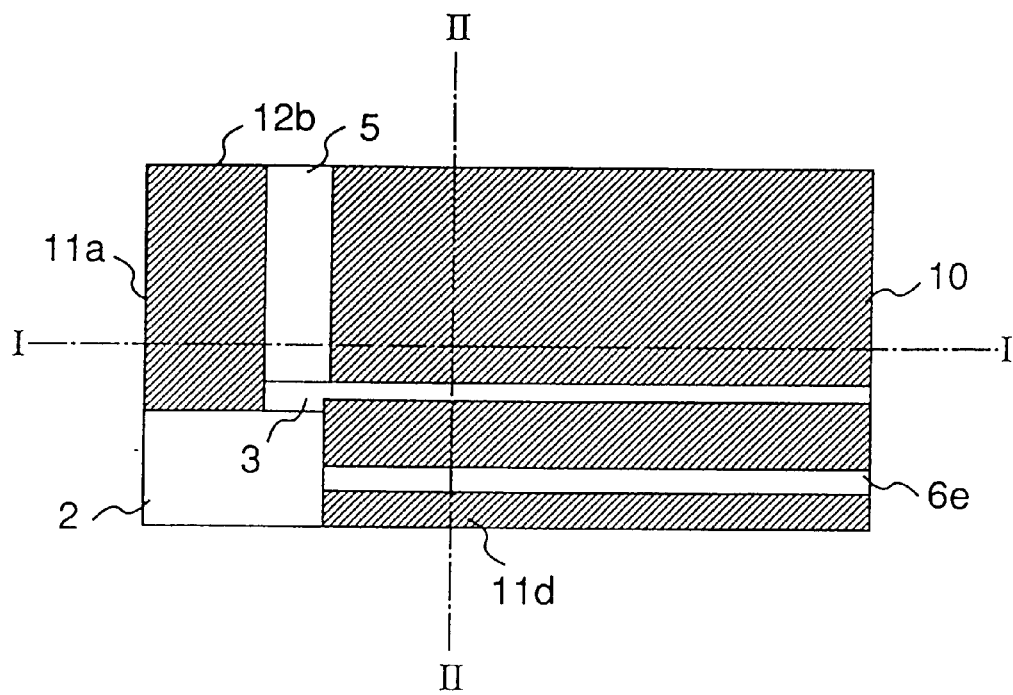

Referring to FIG. 35, the arrangement between p base 3 and $p^+$ diverter 6e is completely identical to the arrangement described with reference to the nineteenth embodiment.

The remaining structure is similar to a portion of the conventional BRT. Corresponding components have the same reference characters allotted, and their description will not be repeated.

The operation of the thyristor of the twenty-first embodiment is similar to that described with reference to the fourth embodiment.

In the present embodiment, the voltage drop at an arbitrary point on p base 3 at an off-state is reduced to $(Rp_2/Rp_1)^2$, as described in the nineteenth embodiment. Therefore, the effective holding current of the element in channel inversion is increased to allow improvement of the controllable current.

Twenty-Second Embodiment

A thyristor according to a twenty-second embodiment of the present invention will be described with reference to the plan view of FIG. 37. The cross sections at I—I and II—II of FIG. 37 are identical to the view of FIGS. 11 and 12, respectively.

Figure 37:
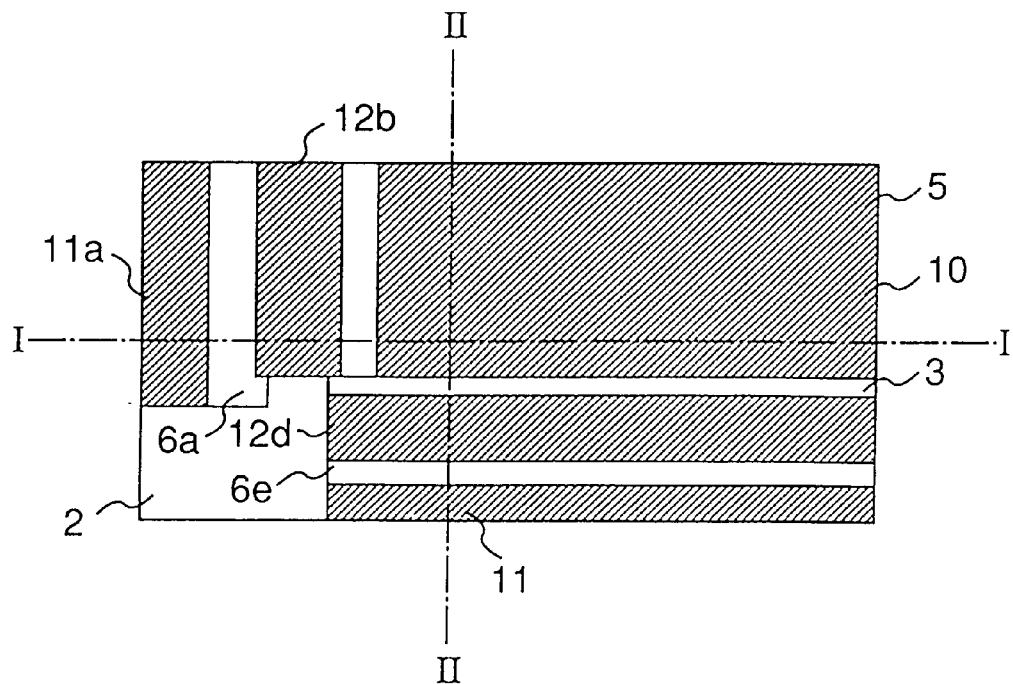
FIGS. 37–46 are plan views of a semiconductor device according to twenty-second to thirty-first embodiments, respectively, of the present invention.

Referring to FIG. 37, the arrangement between p base 3 and $p^+$ diverter 6e is completely identical to the arrangement described with reference to the nineteenth embodiment.

The remaining structure is similar to the structure described in the fourth embodiment. Corresponding components have the same reference characters allotted, and their description will not be repeated.

The operation of the thyristor of the twenty-second embodiment is similar to that described with reference to the fourth embodiment. In the present embodiment, the distance from an arbitrary point on p base 3 to p$^+$ diverter 6e or to p$^+$ contact 4 is equal to or shorter than the distance between the arbitrary point and p$^+$ contact 4. Therefore, the voltage drop at an arbitrary point on p base 3 is reduced. Also, the current diversion effect by p$^+$ diverter 6a is added. Therefore, the effective holding current of the element in channel inversion is increased to improve the controllable current.

Twenty-Third Embodiment

A thyristor according to a twenty-third embodiment of the present invention will be described with reference to the plan view of FIG. 38. Cross sections at I—I and II—II of FIG. 38 are identical to the view of FIGS. 2 and 9, respectively.

Figure 38:
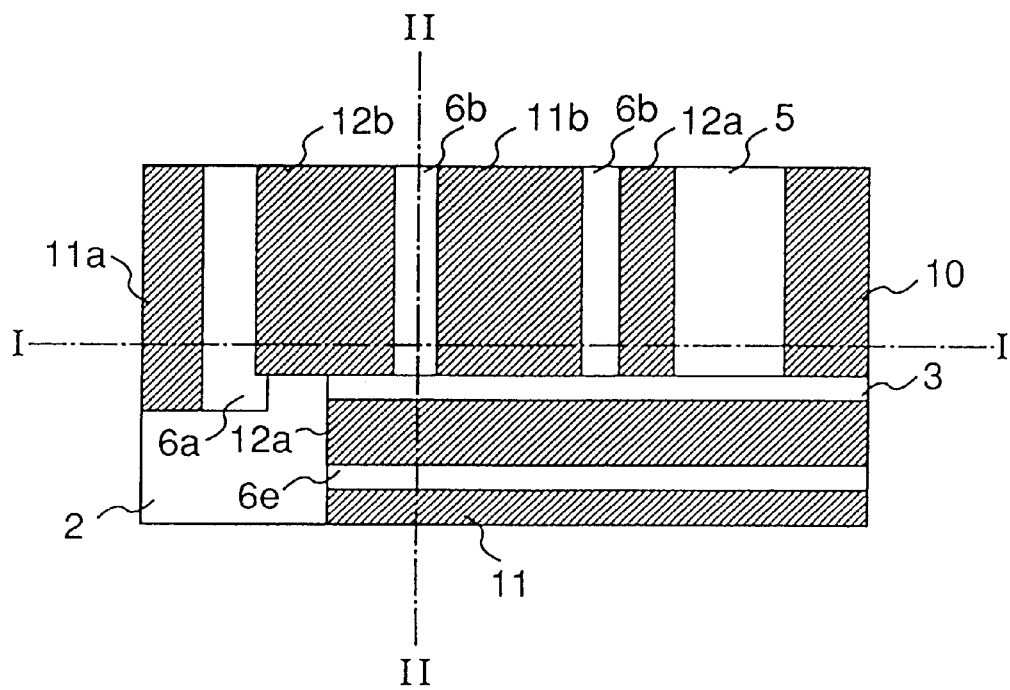

Referring to FIG. 38, the arrangement of p base 3 and p$^+$ diverter 6e is completely identical to the arrangement described with reference to the nineteenth embodiment.

The remaining structure is similar to that described with reference to the first embodiment. Corresponding components have the same reference characters allotted, and their description will not be repeated.

The operation of the thyristor of the twenty-third embodiment is similar to that described with reference to the first embodiment.

In the present embodiment, the distance from an arbitrary point on p base 3 to p$^+$ diverter 6e or to p$^+$ contact 4 is equal to or shorter than the distance between the arbitrary point to p$^+$ contact 4. Therefore, the voltage drop at an arbitrary point on p base 3 is reduced to $(Rp_2/Rp_1)^2$. As described in the first embodiment, the current flow is split by p$^+$ diverters 6a and 6b. Furthermore, the distance between each of p$^+$ diverters 6a and 6b is shortened to reduce the resistance. Therefore, the effective-holding current of the element in channel inversion is increased to allow improvement of the controllable current.

Twenty-Fourth Embodiment

A thyristor according to a twenty-fourth embodiment will be described with reference to the plane structure of FIG. 39. The cross section at I—I of FIG. 39 is identical to the view of FIG. 8.

Figure 39:
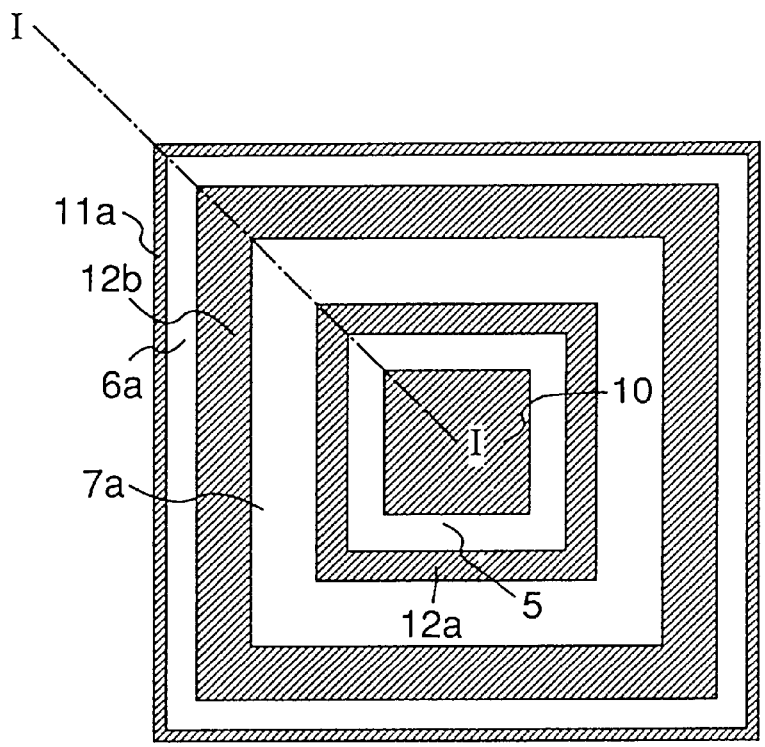

Referring to FIGS. 39 and 8, the thyristor of the twenty-fourth embodiment includes a p$^+$ diverter 6a that continuously surrounds the region of p base 3 at the periphery thereof. The inner edge of p$^+$ diverter 6a is a square.

The remaining structure is similar to that described with reference to the third embodiment. Corresponding components have the same reference characters allotted, and their description will not be repeated.

The operation of the thyristor of the twenty-fourth embodiment is similar to that described with reference to the third embodiment.

The thyristor of the present embodiment includes p$^+$ diverter 6a that continuously surrounds the periphery of the region of p base 3. When current is cut off, the current density becomes lower as the current flows towards p$^+$ diverter 6a to result in increase in the current diversion effect. The voltage drop within the region of p base 3 when current is cut off is reduced. Therefore, the effective holding current of the element in channel inversion is increased to allow improvement of the controllable current.

Since the unitary structure of the element is a square in the present embodiment, variation in the plane current distribution is reduced. Therefore, unstable operation does not easily occur. The unitary structure of the device taking a square configuration also provides the advantage that elements can be arranged with no space therebetween to eliminate extra areas.

Twenty-Fifth Embodiment

A thyristor according to a twenty-fifth embodiment of the present invention will be described with reference to the plan view of FIG. 40. The cross section at I—I of FIG. 40 is identical to the view of FIG. 11.

Figure 40:
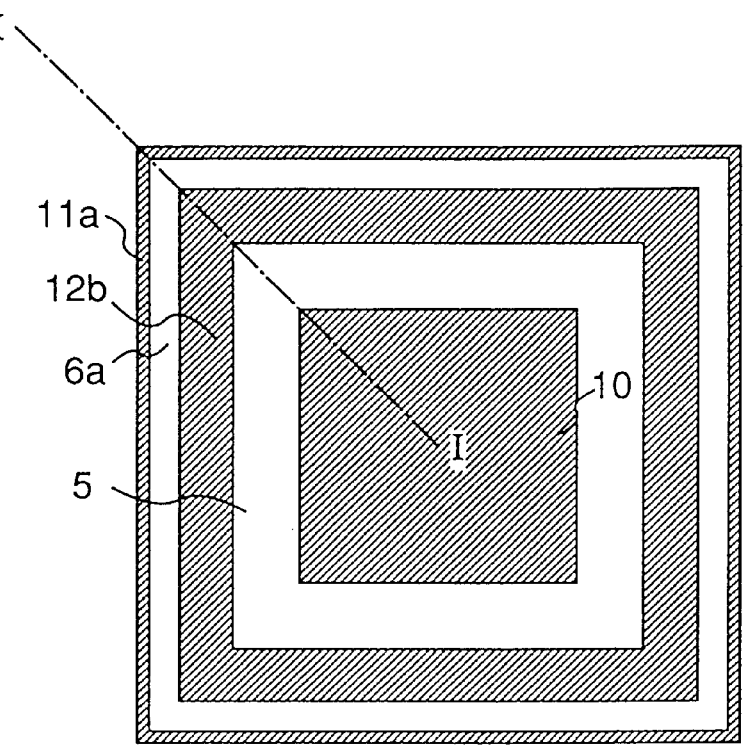

Referring to FIGS. 40 and 11, the thyristor of the twenty-fifth embodiment includes a p$^+$ diverter 6a continuously surrounding the region of p base 3 at the periphery thereof. The inner edge of p$^+$ diverter 6a is a square.

The remaining structure is similar to that described with reference to the fourth embodiment. Corresponding components have the same reference characters allotted, and their description will not be repeated.

The operation of the thyristor of the twenty-fifth embodiment is similar to that described with reference to the fourth embodiment.

The thyristor of the present embodiment includes p$^+$ diverter 6a that continuously surrounds the region of p base 3. When current is cut off, the current density becomes smaller as the current is conducted towards p$^+$ diverter 6a so that the current diversion effect is increased. As a result, voltage drop within the region of p base 3 in current cut off is reduced. The effective holding current of the element in channel inversion is increased to allow improvement of the controllable current. Since the unitary structure of the element is a square in the present embodiment, variation in the plane distribution of current is reduced. Therefore, unstable operation does not easily occur.

The unitary structure of the element being a square also provides the advantage that elements can be disposed with no space therebetween. Therefore, no extra area is required.

Twenty-Sixth Embodiment

A thyristor according to a twenty-sixth embodiment of the present invention will be described with reference to the plane structure of FIG. 41. The cross section at I—I of FIG. 41 is identical to the view of FIG. 8.

Figure 41:
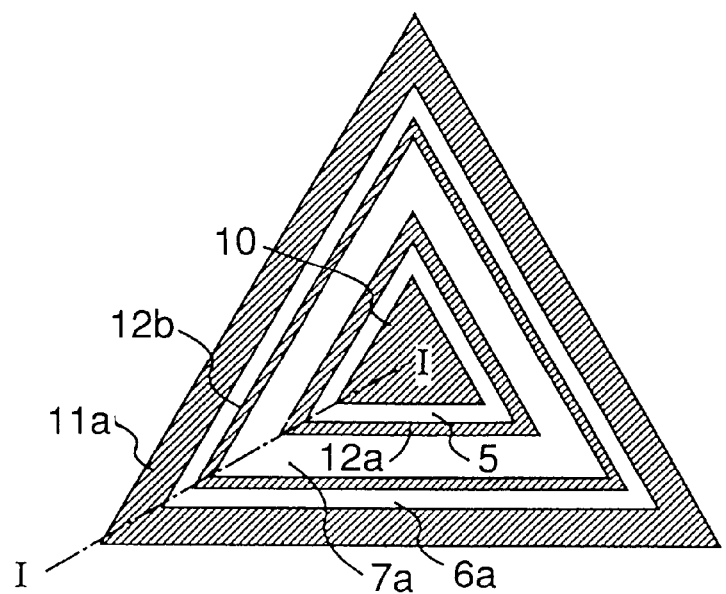

Referring to FIGS. 41 and 8, the thyristor of the twenty-sixth embodiment includes p$^+$ diverter 6a that continuously surrounds the region of p base 3 at the periphery thereof. The inner edge of p$^+$ diverter 6a is a regular triangle.

The remaining structure is similar to that described with reference to the third embodiment. Corresponding components have the same reference characters allotted, and their description will not be repeated. When the current is cut off, the current density becomes lower as the current is conducted towards p$^+$ diverter 6a to increase the effect of current diversion. As a result, the voltage drop within the region of p base 3 is reduced when current is cut off. Therefore, the effective holding current of the element is increased in channel conversion to allow improvement of the controllable current.

Since the unitary structure of the element of the present embodiment has an equilateral triangle configuration, elements can be arranged with no space therebetween so that no extra area is required. Since variation in the current of the element can be eliminated, a uniform operation of the element can be realized. Elements can be disposed with no space therebetween even when the unitary structure of the element is an isosceles triangle.

Twenty-Seventh Embodiment

A thyristor according to a twenty-seventh embodiment of the present invention will be described with reference to the plane structure of FIG. 42. The cross section at I—I of FIG. 42 is identical to that of FIG. 11.

Figure 42:
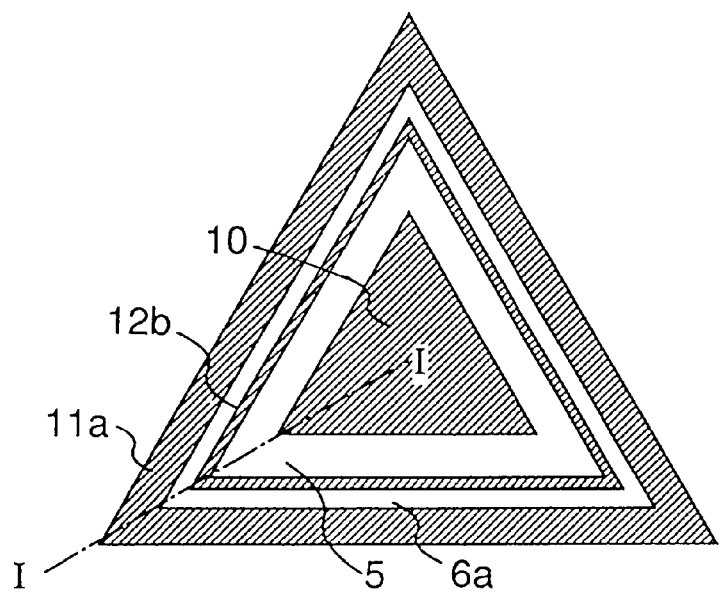

Referring to FIGS. 42 and 11, the thyristor according to the twenty-seventh embodiment includes $p^+$ diverter 6a that continuously surrounds the region of p base 3 at the periphery thereof. Similar to the twenty-sixth embodiment, the inner edge of $p^+$ diverter 6a is a regular triangle.

The remaining structure is similar to that described with reference to the fourth embodiment. Corresponding components have the same reference characters allotted, and their description will not be repeated.

The operation is similar to that described with reference to the fourth embodiment.

The thyristor of the twenty-seventh embodiment includes $p^+$ diverter 6a that continuously surrounds the region of p base 3. Therefore, the current density is reduced as the current is conducted towards $p^+$ diverter 6a when the current is cut off. As a result, the effect of current diversion is increased, whereby the voltage drop within the region of p base 3 is reduced when current is cut off. Therefore, the effective holding current of the element in channel inversion is increased to allow improvement of the controllable current.

Since the unitary structure of the element takes an equilateral triangle configuration, elements can be disposed with no space therebetween. Therefore, no extra area is required. Furthermore, a stable operation of the element can be realized since variation in current of the element can be eliminated. The elements can be disposed with no space therebetween even when the unitary structure of the element is an isosceles triangle.

Twenty-Eighth Embodiment

A thyristor according to a twenty-eighth embodiment of the present invention will be described with reference to the plane structure of FIG. 43. The cross section at I—I of FIG. 43 is identical to that of FIG. 8.

Figure 43:
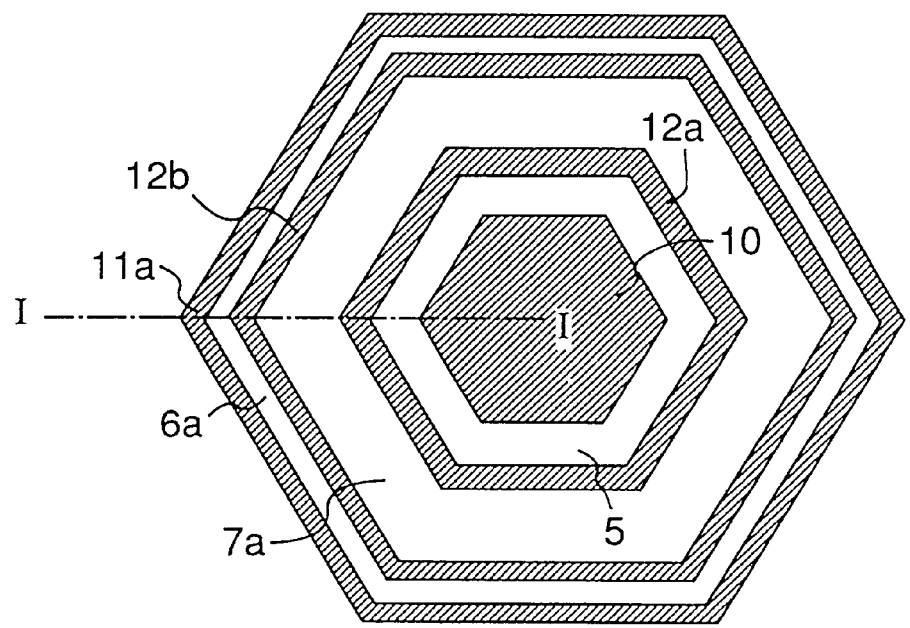

Referring to FIGS. 43 and 8, the thyristor of the twenty-eighth embodiment includes $p^+$ diverter 6a that continuously surrounds the region of p base 3 at the periphery thereof. The inner edge of $p^+$ diverter 6a is an equilateral hexagon.

The operation of the thyristor of the twenty-eighth embodiment is similar to that described with reference to the third embodiment. By virtue of the thyristor of the present embodiment including $p^+$ diverter 6a that continuously surrounds the periphery of P base 3, the current density becomes lower as the current is conducted towards $p^+$ diverter 6a when the current is cut off. As a result, the current diversion effect is increased, whereby the voltage drop within the region of p base 3 is reduced when current is cut off. The effective holding current of the element in channel inversion is increased to allow improvement of the controllable current.

Since the unitary structure of the element takes an equilateral hexagon configuration in the present embodiment, variation in the plane current distribution is reduced. Therefore, unstable operation does not easily occur.

The unitary structure of the element taking a regular hexagon also provides the advantage that elements can be disposed with no space therebetween. Therefore, extra areas can be eliminated.

Twenty-Ninth Embodiment

A thyristor according to a twenty-ninth embodiment of the present invention will be described with reference to the plan view of FIG. 44. The cross section at I—I of FIG. 44 is identical to that of FIG. 11.

Figure 44:
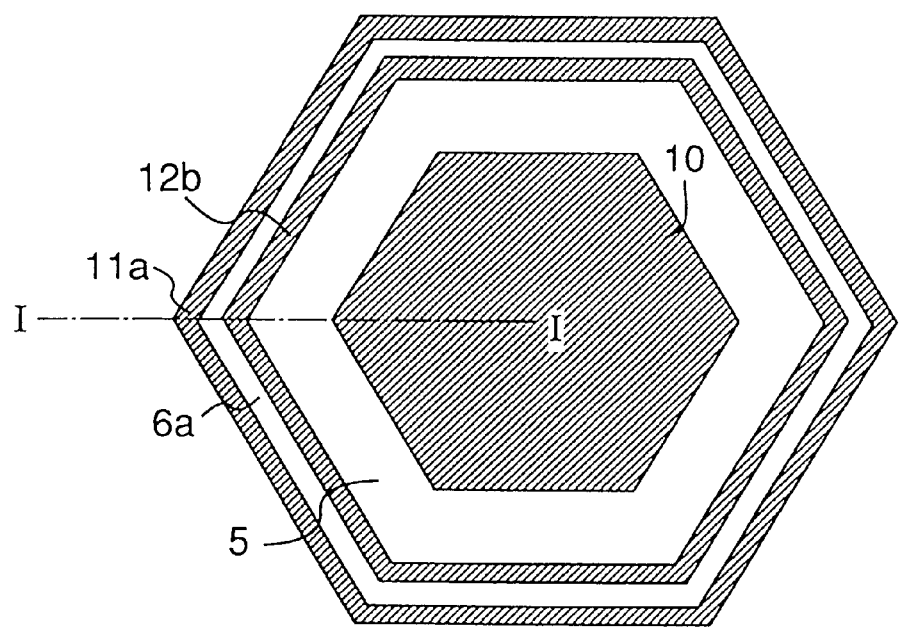

Referring to FIGS. 44 and 11, the thyristor of the twenty-ninth embodiment includes $p^+$ diverter 6a that continuously surrounds p base 3 at the periphery thereof. The inner edge of $p^+$ diverter 6a is an equilateral hexagon.

The operation of the thyristor of the twenty-ninth embodiment is similar to that described with reference to the fourth embodiment.

Since the thyristor of the present embodiment includes $p^+$ diverter 6a that continuously surrounds the periphery of p base 3, the current density is reduced as the current is conducted towards $p^+$ diverter 6a when current is cut off. As a result, the effect of current diversion is increased, so that the voltage drop within the region of p base 3 is reduced when current is cut off. Since the effective holding current of the element in channel inversion is increased, the controllable current is improved.

Since the unitary structure of the element takes a regular hexagon in the present embodiment, variation in the plane current distribution is reduced. Therefore, unstable operation does not easily occur.

The unitary structure of the element taking an equilateral hexagon also provides the advantage that elements can be disposed with no space therebetween. Therefore, extra areas can be eliminated.

Thirtieth Embodiment

A thyristor according to a thirtieth embodiment of the present invention will be described with reference to the plane structure of FIG. 45. The cross section at I—I of FIG. 45 is identical to that of FIG. 8.

Figure 45:
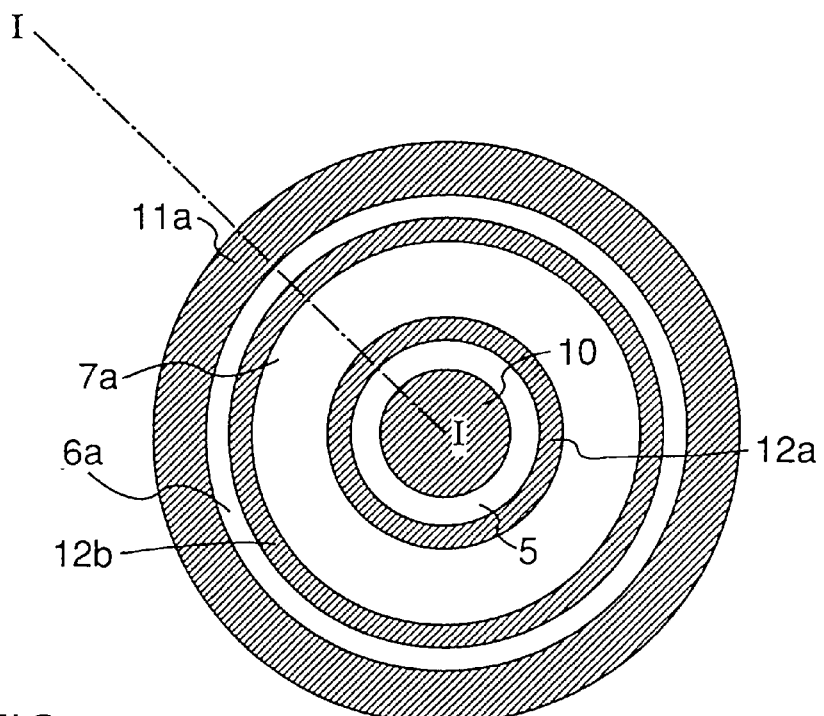

Referring to FIGS. 45 and 8, the thyristor of the thirtieth embodiment includes $p^+$ diverter 6a that continuously surrounds the region of p base 3 at the periphery thereof. The inner edge of $p^+$ diverter 6a takes a circular configuration about $p^+$ contact 4.

The remaining structure is similar to that described with reference to the third embodiment. Corresponding components have the same reference characters allotted, and their description will not be repeated.

The operation of the thyristor of the thirtieth embodiment is similar to that described with reference to the third embodiment.

Since the thyristor of the present embodiment includes $p^+$ diverter 6a continuously surrounding the periphery of the region of p base 3, the current density becomes lower as the current is conducted towards $p^+$ diverter 6a when current is cut off. The effect of current flow diversion is increased so that voltage drop within the region of p base 3 is reduced when current is cut off. Therefore, the effective holding current of the element in channel inversion is increased to allow improvement of the controllable current.

Since the unitary structure of the element takes a circle configuration in the present embodiment, the same current distribution can be obtained in all directions from the center of the circle. Therefore, unstable operation of the element can be prevented.

Thirty-First Embodiment

A thyristor according to a thirty-first embodiment of the present invention will be described with reference to the plane structure of FIG. 46. The cross section at I—I of FIG. 46 is identical to that of FIG. 11.

Figure 46:
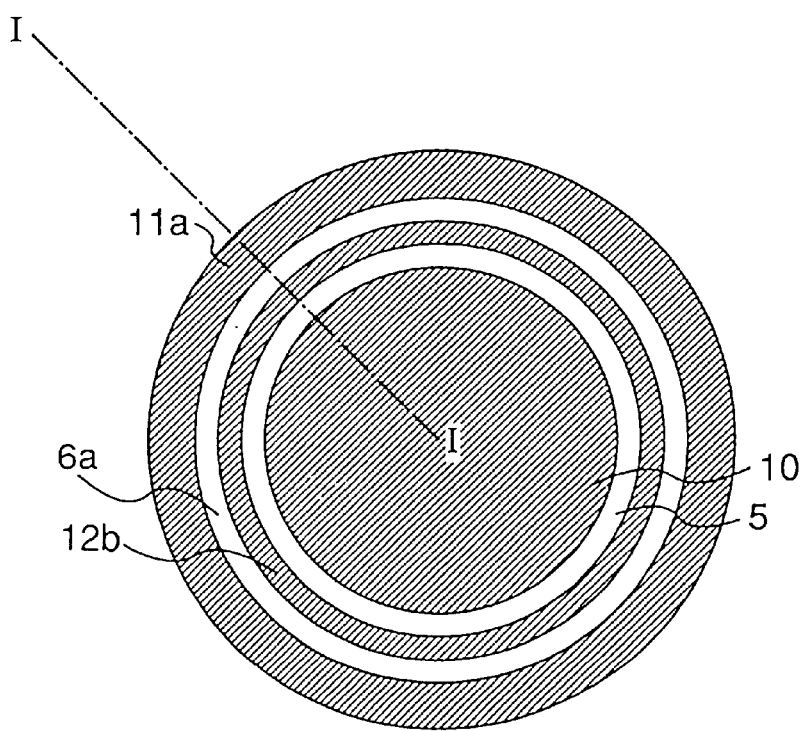

Referring to FIGS. 46 and 11, the thyristor of the thirty-first embodiment includes p$^+$ diverter 6a that continuously surrounds the region of p base 3 at its periphery. The inner edge of p$^+$ diverter 6a is a circle with p$^+$ contact 4 as the center.

The remaining structure is similar to that described with reference to FIG. 4. Corresponding components have the same reference characters allotted, and their description will not be repeated.

The operation of the thyristor of the thirty-first embodiment is similar to that described with reference to the fourth embodiment.

Since the thyristor of the present embodiment includes p$^+$ diverter 6a that continuously surrounds the region of p base 3, the current density becomes smaller as the current is conducted towards p$^+$ diverter 6a when current is cut off. The effect of current flow diversion is increased so that the voltage drop within the region of p base 3 when current is cut off is reduced. The effective holding current of the element in channel inversion is increased to allow improvement of the controllable current.

Since the unitary structure of the element takes a circular configuration, the same current distribution is obtained in all directions from the center. Therefore, unstable operation of the element can be prevented.

Although the twenty-fourth to thirty-first embodiments were described of a structure in which p base 3 and p$^+$ diverter 6a continuously surround the periphery of p$^+$ contact 4, the controllable current can be improved even with a structure in which the region of p base 3 surrounds p$^+$ diverter 6a substantially continuously, and p$^+$ contact 4 surrounds p base 3 substantially continuously to split the current flow.

The twenty-fifth to thirty-first embodiments have a structure in which the distance from an arbitrary point on p base 3 to p$^+$ diverter 6a or to p$^+$ contact 4 is not greater than the distance between the arbitrary point and p$^+$ contact 4, as described specifically in the nineteenth embodiment. The voltage drop at the arbitrary point on p base 3 is reduced to $(Rp_2/Rp_1)^2$. Therefore, the effective holding current of the element in channel inversion is increased to allow improvement of the controllable current.

Although the twenty-fourth to thirty-first embodiments were described having a structure in which the p$^+$ diverter completely continuously surrounds the region of p base 3, the structure may have a portion in which the region of the p$^+$ diverter is not continuous. A similar effect can be obtained with a structure as long as the p$^+$ diverter substantially continuously surrounds the region of p base 3.

Thirty-Second Embodiment

Figure 47:
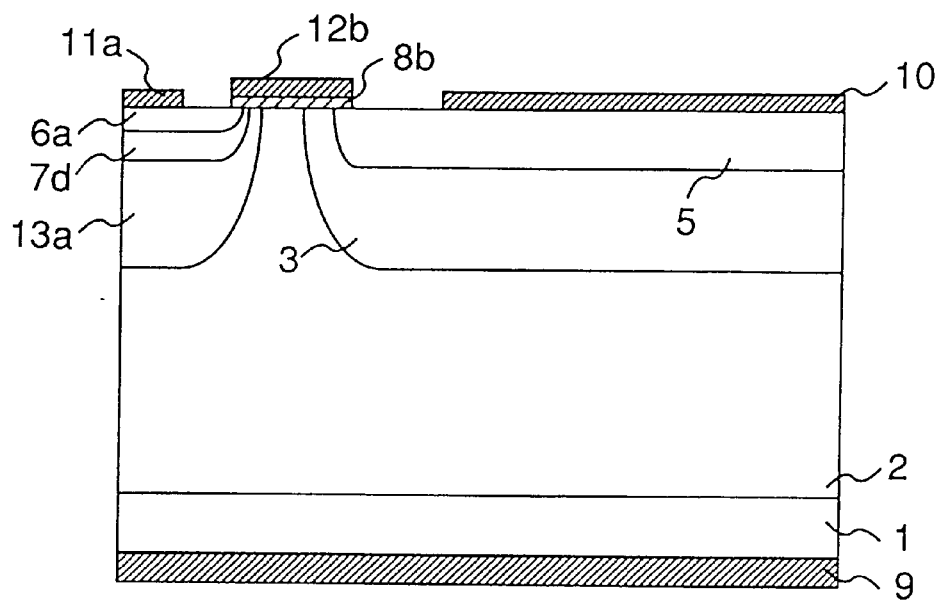
FIGS. 47–49 are sectional views of a semiconductor device according to thirty-second to thirty-fourth embodiments, respectively, of the present invention.

A thyristor according to a thirty-second embodiment of the present invention will be described with reference to the sectional view of FIG. 47.

The thyristor of the thirty-second embodiment has p$^+$ diverter 6a surrounded by an n$^+$ floating region 7d. N$^+$ floating region 7d is surrounded by p well 13a. N$^+$ floating region 7d and p well 13a are isolated from p base 3. A gate oxide film 8b is formed so as to cover p$^+$ diverter 6a, n$^+$ floating region 7d, p well 13a, n$^-$ layer 2, and p base 3. The thyristor functions as a p channel MOSFET by having a voltage lower than a predetermined voltage applied to gate electrode 12b. The portion of thyristor operation is similar to that of an EST as described in the section of the background art.

The operation of the thyristor of the thirty-second embodiment will be described hereinafter.

An on-state can be realized by applying a voltage higher than a threshold voltage to gate electrode 12b. An off-state can be realized by applying a voltage lower than a negative threshold voltage to gate electrode 12b. Application of a voltage lower than the threshold voltage to gate electrode 12b causes n$^-$ layer 2 and n$^+$ cathode 5 to be electrically connected by an n channel region formed at the region of p base 3 in the proximity of gate oxide film 8b. As a result, an electron current flow is initiated. At the same time, hole-current is generated from p$^+$ anode 1.

Since p$^+$ diverter 6a is directly in contact with n$^-$ layer 2 as in the structure shown in FIG. 11, the whole-current flow is diverted towards p base 3 and p$^+$ diverter 6a. Since the current flowing towards p base 3 is substantially reduced, the turn-on loss is increased since it is necessary to supply the amount of current conducted towards p$^+$ diverter 6a to p base 3.

In a state where a voltage higher than the threshold voltage is applied to gate electrode 12b in the present embodiment, hole-current will not flow towards the p$^+$ diverter 6a since a channel region is not formed at n$^+$ floating region 7d in the proximity of gate oxide film 8b. All the hole-current flow is conducted from p base 3 to n$^+$ cathode 5. Therefore, the thyristor junction formed of n$^+$ cathode 5, p base 3, n$^-$ layer 2, and p$^+$ anode 1 can be operated at lower loss.

Since p$^+$ diverter 6a is isolated from n$^-$ layer 2 by n$^+$ floating region 7a and p well 13a so that current flows to p base 3, not to p$^+$ diverter 6a, in a turn-on state in the present embodiment, the holding current of the element is reduced to allow reduction in the turn-on loss.

An MOSFET formed of p$^+$ diverter 6a, n$^+$ floating region 7d, p well 13a and gate oxide film 8b can be used at a turn on gate since p well 13a is isolated from n$^-$ layer 2 in the present embodiment.

Thirty-Third Embodiment

A thyristor according to a thirty-third embodiment will be described with reference to the sectional view of FIG. 48.

The thyristor of the present embodiment has p$^+$ diverter 6a surrounded by n$^+$ floating region 7d. N$^+$ floating region 7d is surrounded by p well 13a. N$^+$ floating region 7d and p well 13a are isolated from p base 3. Gate oxide film 8b is formed so as to cover p$^+$ diverter 6a, n$^+$ floating region 7d, p well 13a, n$^-$ layer 2, and p base 3. By applying a negative voltage to gate electrode 12b, the thyristor functions as a p channel MOSFET. The thyristor operation portion is similar to that of an ESTD, as described in the section of the background art.

The operation of the thyristor of the thirty-third embodiment will be described briefly.

An on-state can be realized by applying a voltage higher than a threshold voltage to gate electrodes 12a and 12b. An off-state can be realized by applying a threshold voltage to each gate electrode.

In a state where a voltage higher than the threshold voltage is applied to gate electrode 12b in the present embodiment, hole-current will not flow towards p$^+$ diverter 6a since a channel region is not formed at n⁺ floating region 7d in the proximity of gate oxide film 8b. All the hole-current flow from p base 3 to p⁺ contact 4. Therefore, a thyristor formed of n⁺ cathode 5, p base 3, n⁻ layer 2, and p⁺ anode 1 can function with loss lower than that of a conventional ESTD.

P⁺ diverter 6a is isolated from n⁻ layer 2 by n⁺ floating region 7a and p well 13a so that hole-current does not flow to p⁺ diverter 6a when turned on in the present embodiment. Since the hole-current flows to p base 3 and not to p⁺ diverter 6a, the holding current of the element is reduced to allow reduction of the turn-on loss.

Thirty-Fourth Embodiment

A thyristor according to a thirty-fourth embodiment of the present invention will be described with reference to the sectional view of FIG. 49. The thyristor of the thirty-fourth embodiment has p⁺ diverter 6a surrounded by n⁺ floating region 7d. This n⁺ floating region 7d is surrounded by p well 13a. N⁺ floating region 7d and p well 13a are isolated from p base 3. Gate oxide film 8b is formed so as to cover p⁺ diverter 6a, n⁺ floating region 7d, p well 13a, n⁻ layer 2, and p base 3. The thyristor provides a function similar to that of a p channel MOSFET by having a negative voltage applied to gate electrode 12b. The thyristor operating portion is similar to that described with reference to the first embodiment.

The operation of the thyristor of the thirty-fourth embodiment is similar to that described with reference to the first embodiment. In a state where a voltage greater than a positive threshold voltage is applied to gate electrode 12b in the present embodiment, hole-current will not flow towards p⁺ diverter 6a since a channel region is not formed at n⁺ floating region 7d in the proximity of gate oxide film 8b. All the hole-current will flow to p⁺ contact 4 from p base 3. Therefore, a thyristor formed of n⁺ cathode 5, p base 3, n⁻ layer 2, and p⁺ anode 1 can operate with a loss lower than that in a conventional ESTD.

Since p⁺ diverter 6a is isolated from n⁻ layer 2 by n⁺ floating region 7a and p well 13a so that hole-current does not flow to p⁺ diverter 6a when turned on in the present embodiment, and flows to p base 3, the holding current of the element is lowered to allow reduction of the turn-on loss.

By forming a plurality of p⁺ diverters 6b within the region of p base 3 in the present embodiment, the effective holding current of the element in channel inversion is increased to allow improvement of the controllable current.

By setting the distance between the plurality of p⁺ diverters 6b equal, the controllable current of the element can be optimized.

The thirty-third to thirty-fifth embodiments were described having a structure in which p⁺ diverter 6a is surrounded by n⁺ floating region 7d and p well 13a. This can be applied to all elements having a structure in which p⁺ diverter 6a is directly in contact with n⁻ layer 2.

A thyristor having such a structure will be described in the following.

Thirty-Fifth Embodiment

Figure 50:
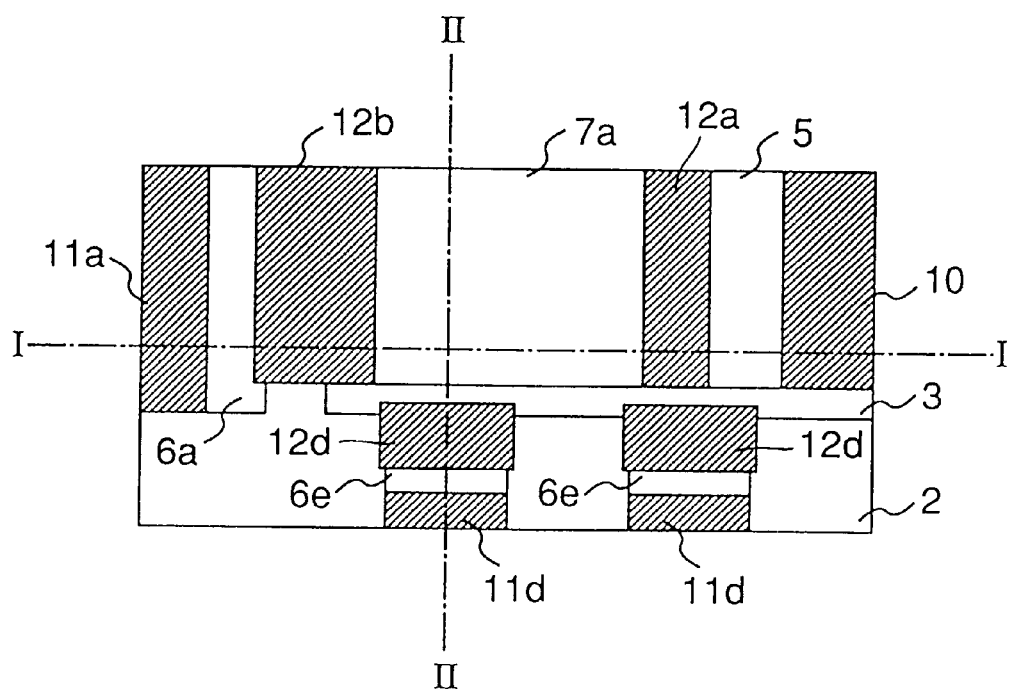
FIG. 50 is a plan view of a semiconductor device according t6 a thirty-fifth embodiment of the present invention.

FIG. 50 shows a plan structure of a thyristor according to a thirty-fifth embodiment of the present invention. The cross section at I—I and II—II of FIG. 50 are identical to those of FIGS. 48 and 51, respectively.

Figure 48:
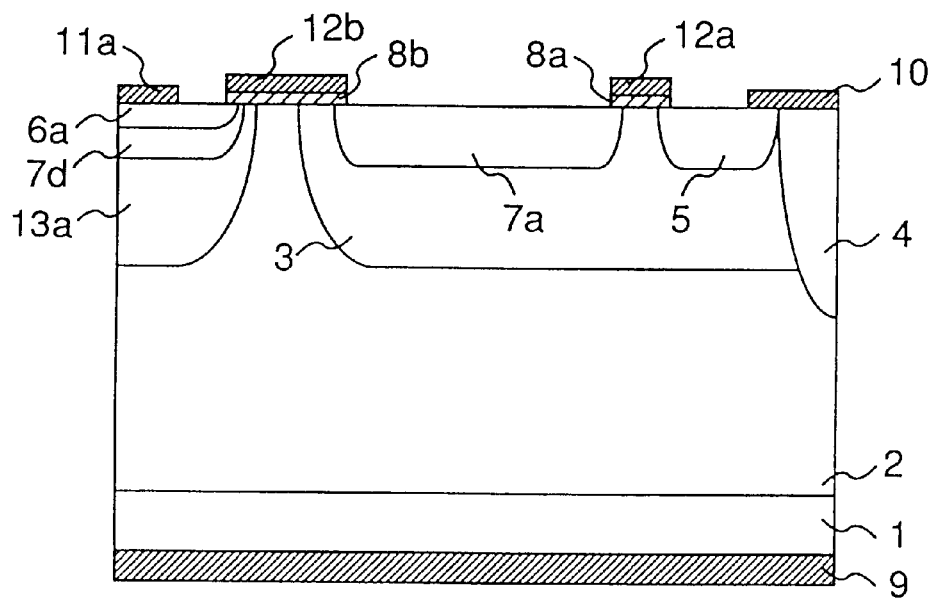
Figure 51:
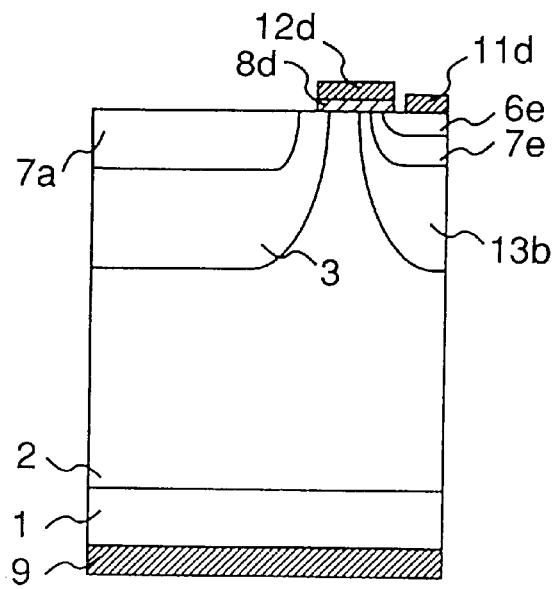
FIG. 51 is a sectional view of the semiconductor device of FIG. 50 taken along II—II.

Referring to FIGS. 50, 48 and 51, the thyristor has a p⁺ diverter 6a surrounded by n⁺ floating region 7d. This n⁺ floating region 7d is surrounded by p well 13a. A p⁺ diverter 6e is surrounded by n⁺ floating 7e region. N⁺ floating region 7e is surrounded by p well 13a. N⁺ floating regions 7d and 7e, and p wells 13a and 13b are isolated from p base 3. Gate oxide film 8d is formed so as to cover p⁺ diverter 6e, n⁺ well 7a, p well 13a, n⁻ layer 2, and p base 3. The thyristor provides a function similar to that of a p channel MOSFET by applying a negative voltage to gate electrode 12d.

The remaining structure is similar to that described with reference to the thirty-third embodiment. Corresponding components have the same reference characters allotted, and their description will not be repeated.

The operation of the thyristor of the thirty-fifth embodiment is similar to that described with reference to the first embodiment.

In addition to the effects described with reference to the third embodiment, the present embodiment can have the holding current of the element lowered to reduce turn-on loss since p⁺ diverters 6a and 6d are surrounded by n⁺ floating regions 7a and 7d and p wells 13a and 13b and isolated from n⁺ layer 2 so that hole-current flows to p base 3, not to p⁺ diverters 6a and 6d, in the present embodiment.

Thirty-Sixth Embodiment

Figure 52:
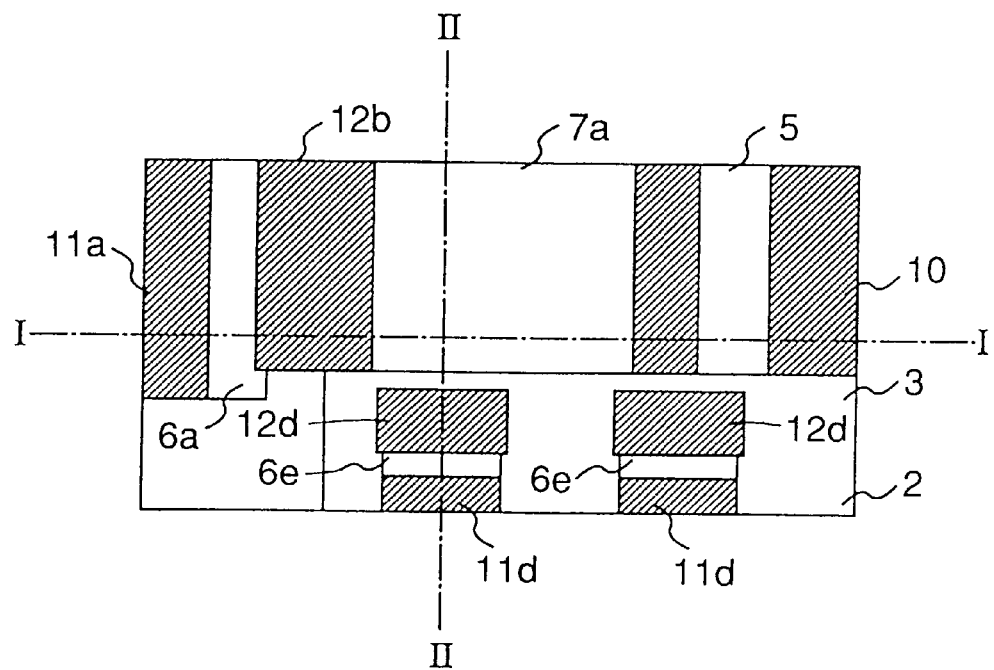
FIG. 52 is a plan view of a semiconductor device according to a thirty-sixth embodiment of the present invention.

FIG. 52 shows a plane structure of a thyristor according to a thirty-sixth embodiment of the present invention. The cross sections at I—I and II—II of FIG. 52 are identical to those of FIGS. 48 and 53, respectively.

Figure 53:
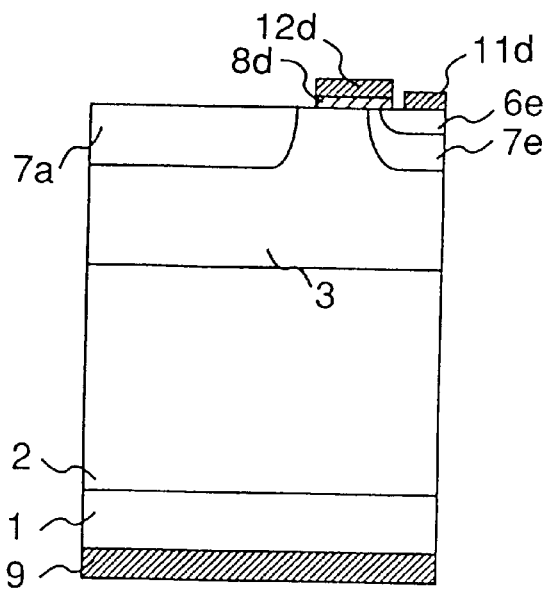
FIG. 53 is a sectional view of the semiconductor device of FIG. 52 taken along II—II.

Referring to FIGS. 52, 48 and 53, the thyristor has a structure in which p⁺ thyristor 6d is surrounded by n floating region 7e in p base 3.

The remaining structure is similar to that described with reference to the thirty-third embodiment. Corresponding components have the same reference characters allotted, and their description will not be repeated.

The operation of the thyristor of the thirty-sixth embodiment is similar to that described with reference to the third embodiment.

In addition to the advantage described with reference to the third embodiment, the holding current of the element can be lowered to reduce the turn-on loss since p⁺ diverter 6e is surrounded by n⁺ floating region 7e and p base 3 and isolated from n⁻ layer 2 so that hole-current flows to p base 3, and not to p⁺ diverter 6e, in the present embodiment.

Thirty-Seventh Embodiment

Figure 54:
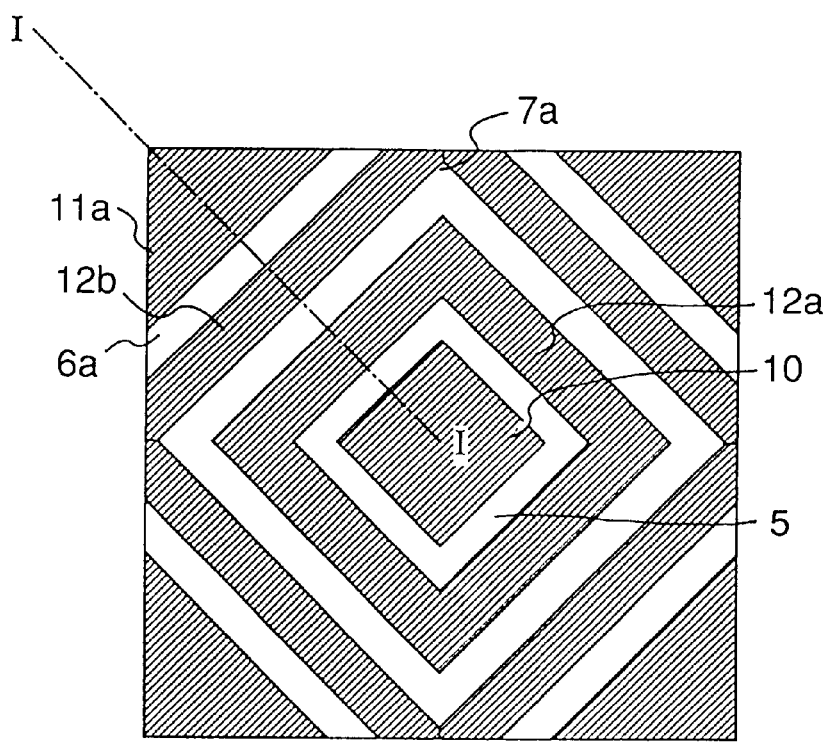
FIGS. 54–56 are plan views of a semiconductor device according to thirty-seventh to thirty-ninth embodiments, respectively, of the present invention.

FIG. 54 shows a plan view of a thyristor according to a thirty-seventh embodiment of the present invention. The cross section at I—I of FIG. 54 is similar to that of FIG. 48.

Referring to FIGS. 54 and 48, the thyristor of the thirty-seventh embodiment has p⁺ diverter 6a surrounded by n⁺ floating region 7d. N⁺ floating region 7d is surrounded by p well 13a. P⁺ diverter 6a, n⁺ floating 7d, and p well 13a are all isolated from p base 3. The remaining structure is similar to that described with reference to the seventh embodiment. The corresponding components have the same reference characters allotted, and their description will not be repeated.

The operation of the thyristor of the thirty-seventh embodiment is similar to that described with reference to the third embodiment. In addition to the advantage described in the seventh embodiment, the holding current of the element is lowered to allow reduction in the turn-on loss since p⁺ diverter 6a is surrounded by n⁺ floating region 7d and p well 13a and isolated from n⁻ layer 2 so that hole-current flows to p base 3, not to p⁺ diverter 6a, in the present embodiment.

Thirty-Eighth Embodiment

Figure 55:
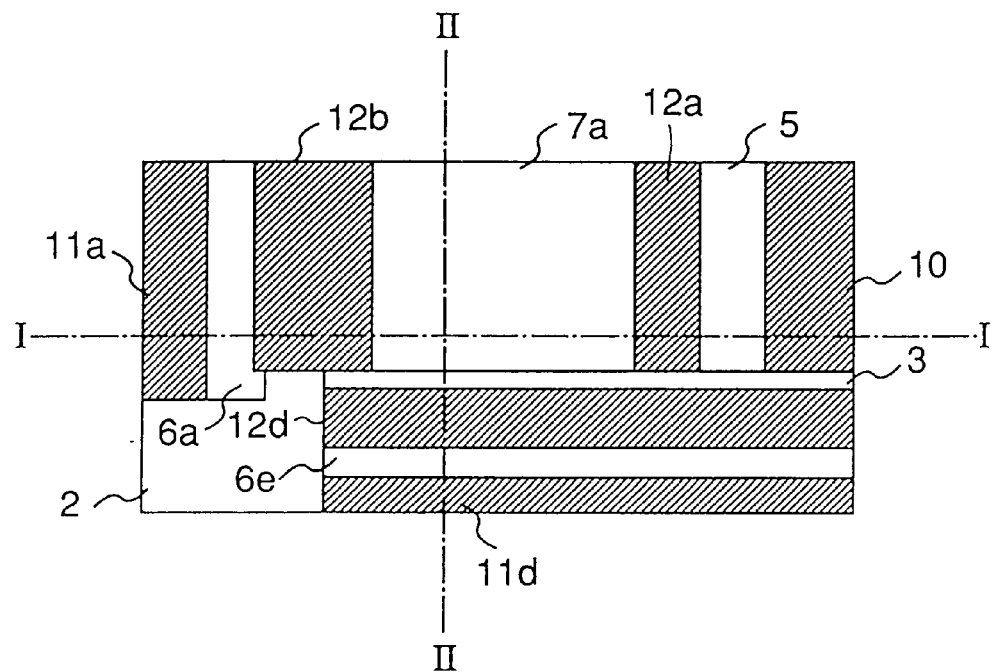

FIG. 55 shows a plane structure of a thyristor according to a thirty-eighth embodiment of the present invention. The cross sections at I—I and II—II of FIG. 55 are identical to those of FIGS. 48 and 51, respectively.

Referring to FIGS. 55, 48 and 51, the thyristor of the thirty-eighth embodiment includes, in addition to the structure described with reference to the twenty-eighth embodiment, $p^+$ diverters 6a and 6e surrounded by $n^+$ floating regions 7d and 7e, respectively. $N^+$ floating regions 7d and 7e are surrounded by p wells 13a and 13b, respectively. $P^+$ diverters 6a and 6e, $n^+$ floating regions 7d and 7e, and p wells 13a and 13b are isolated from p base 3.

The remaining structure is similar to that described with reference to the twentieth embodiment.

Corresponding components have the same reference characters allotted, and their description will not be repeated.

The operation of the thyristor of the thirty-eighth embodiment is similar to that described with reference to the third embodiment.

In addition to the advantage described with reference to the twentieth embodiment, the holding current of the element is lowered to reduce turn-on loss since $p^+$ diverters 6a and 6e are surrounded by $n^+$ floating regions 7d and 7e and p wells 13a and 13b, respectively, so that hole-current flows to p base 3, not to $p^+$ diverters 6a and 6e, when turned on in the present embodiment.

Thirty-Ninth Embodiment

Figure 56:
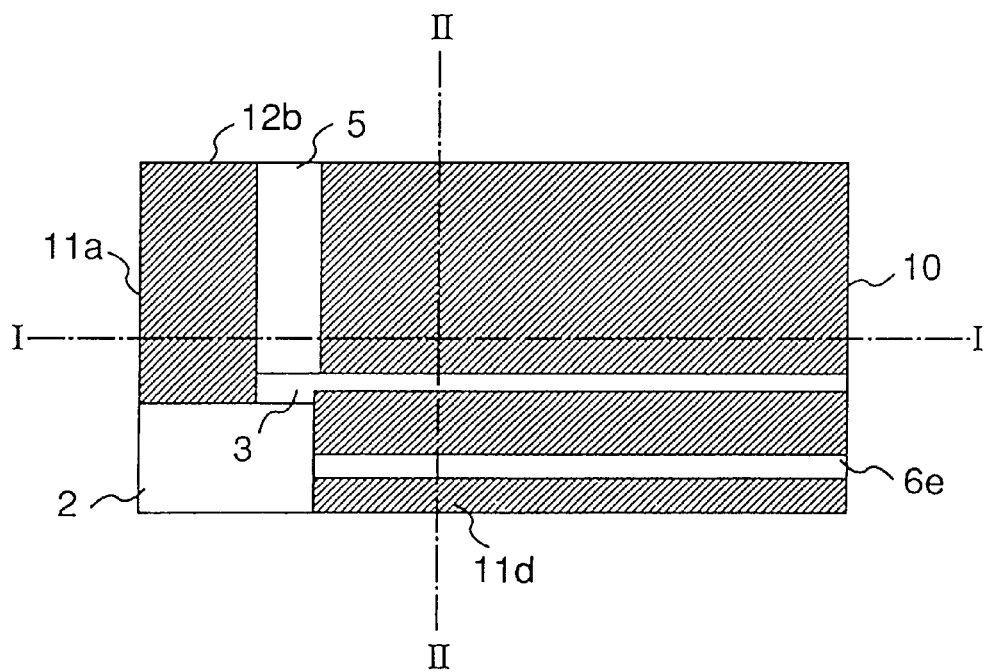

FIG. 56 shows a plane structure of a thyristor according to a thirty-ninth embodiment of the present invention. The cross sections at I—I and II—II of FIG. 56 are identical to those of FIGS. 36 and 57, respectively.

Figure 36:
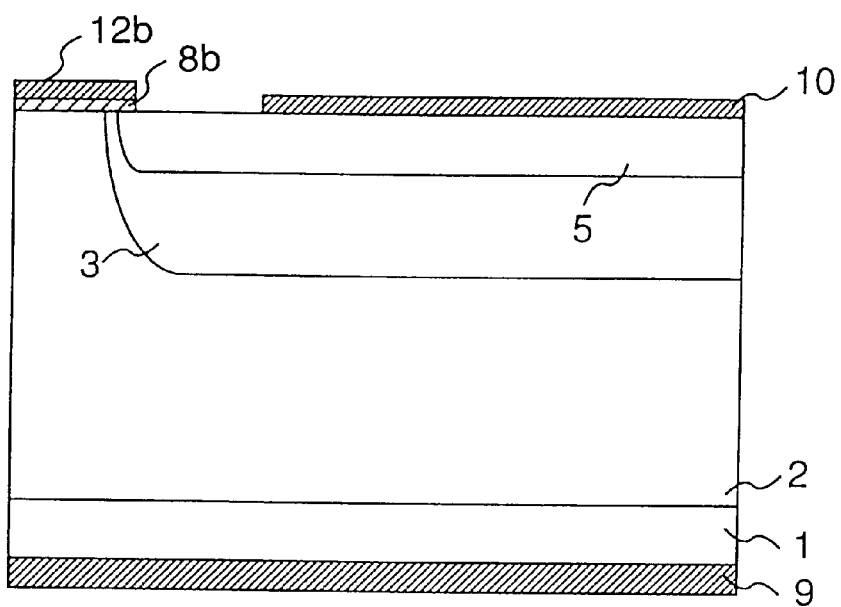
FIG. 36 is a sectional view of the semiconductor device of FIG. 35 taken along I—I.
Figure 57:
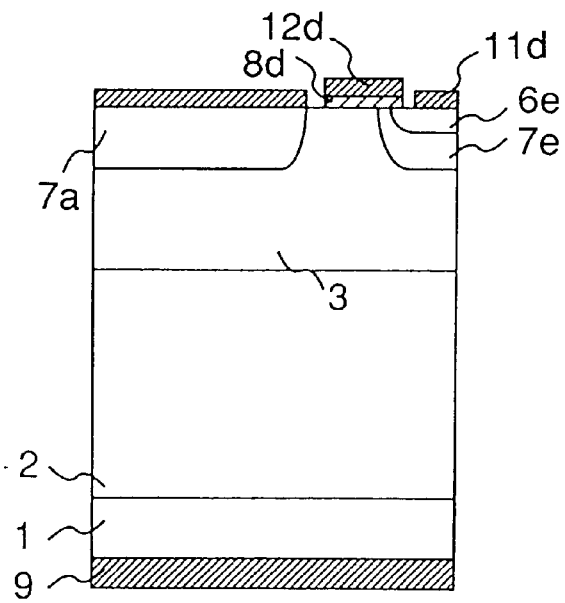
FIG. 57 is a sectional view of the semiconductor device of FIG. 56 taken along II—II.

Referring to FIGS. 56, 36 and 57, the thyristor of the thirty-ninth embodiment includes, in addition to the structure described with reference to FIG. 21, a $p^+$ diverter 6e surrounded by $n^+$ floating region 7e. $N^+$ floating region 7e is further surrounded by p base 3.

The remaining structure is similar to that described with reference to the twenty-first embodiment. Corresponding components have the same reference characters allotted, and their description will not be repeated.

The operation of the thyristor of the thirty-ninth embodiment is similar to that described with reference to the fourth embodiment. In addition to the advantage described with reference to the twenty-first embodiment, the holding current of the element is lowered to allow reduction in turn-on loss since $p^+$ diverter 6e is surrounded by $n^+$ floating region 7e and p base 3 so that hole-current flows to p base 3, not to $p^+$ diverter 6e, when turned on in the present embodiment.

Fortieth Embodiment

Figure 58:
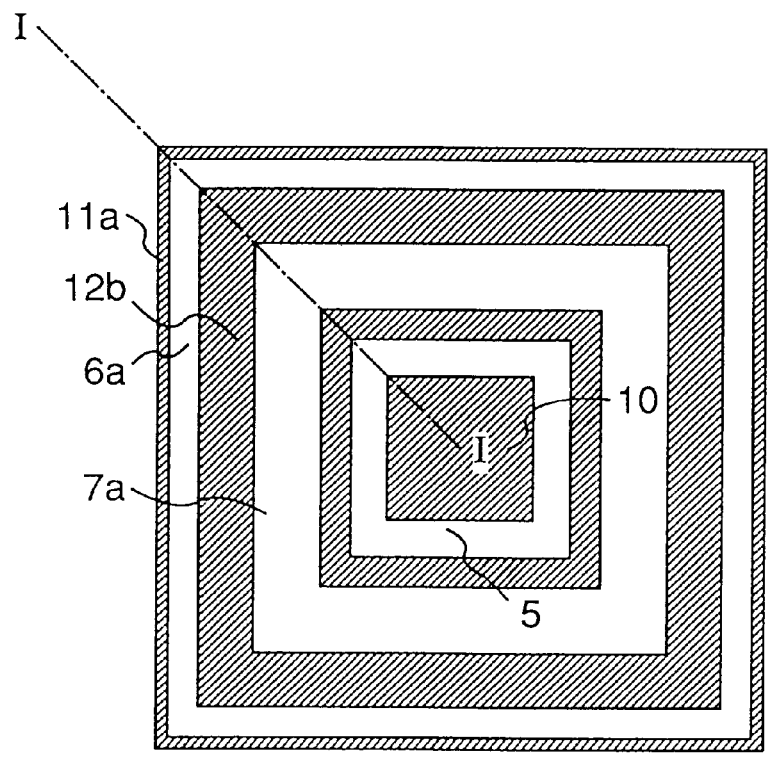
FIG. 58 is a plan view of a semiconductor device according to a fortieth embodiment of the present invention.

FIG. 58 is a plan view showing a thyristor according to a fortieth embodiment of the present invention. The cross section at I—I of FIG. 58 is identical to that shown in FIG. 48.

Referring to FIGS. 58 and 48, the thyristor of the fortieth embodiment includes, in addition to the structure described with reference to the twenty-fourth embodiment, $p^+$ diverter 6a surrounded by $n^+$ floating region 7d. $N^+$ floating region 7d is surrounded by p well 13a. $P^+$ diverter 6a, $n^+$ floating region 7d, and p well 13a are isolated from p base 3.

The remaining structure is similar to that described with reference to the twenty-fourth embodiment. Corresponding components have the same reference characters allotted, and their description will not be repeated.

The operation of the thyristor of the fortieth embodiment is similar to that described with reference to the third embodiment.

In addition to the advantage described with reference to the twenty-fourth embodiment, the holding current of the element is lowered to allow reduction of the turn-on loss since $p^+$ diverter 6a is surrounded by $n^+$ floating region 7d and p well 13a so that hole-current flows to p base 3, not to $p^+$ diverter 6a, when turned on in the present embodiment.

In the thirty-seventh and fortieth embodiments, the unitary structure of the element was described for a square configuration. The present embodiment is applicable to an element that has a plane structure and a cross section structure described in the twenty-sixth to thirty-first embodiments.

Forty-First Embodiment

A method of manufacturing an element having a structure described in the thirty-fourth embodiment will be briefly described hereinafter.

Figure 59:
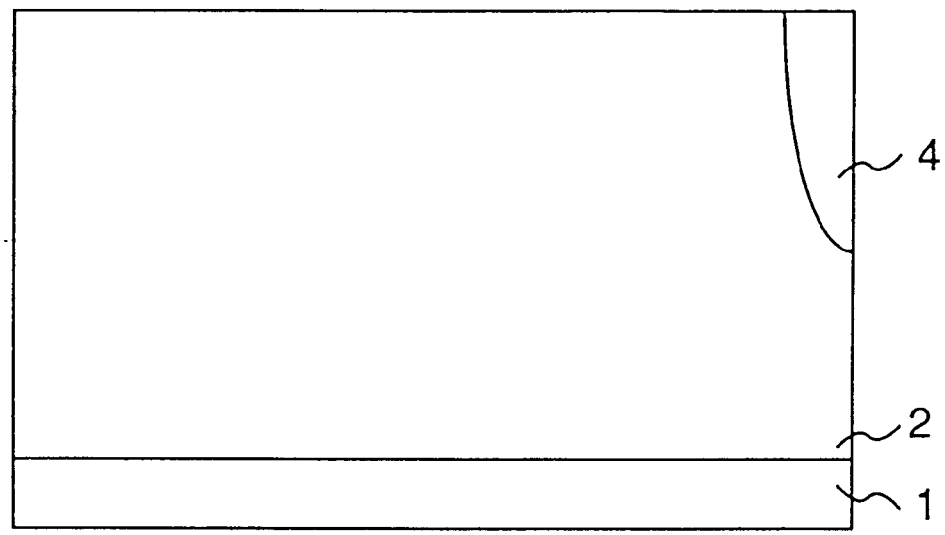
FIG. 59 is a sectional view of a semiconductor device according to a forty-first embodiment of the present invention indicating a step of a manufacturing method thereof.

Referring to FIG. 59, p type impurity ions are implanted into a predetermined region at one surface of an n type semiconductor substrate to form $p^+$ contact 4 by thermal diffusion. P type impurity ions are implanted to the other surface of the substrate to form $p^+$ anode 1 by thermal diffusion.

Figure 60:
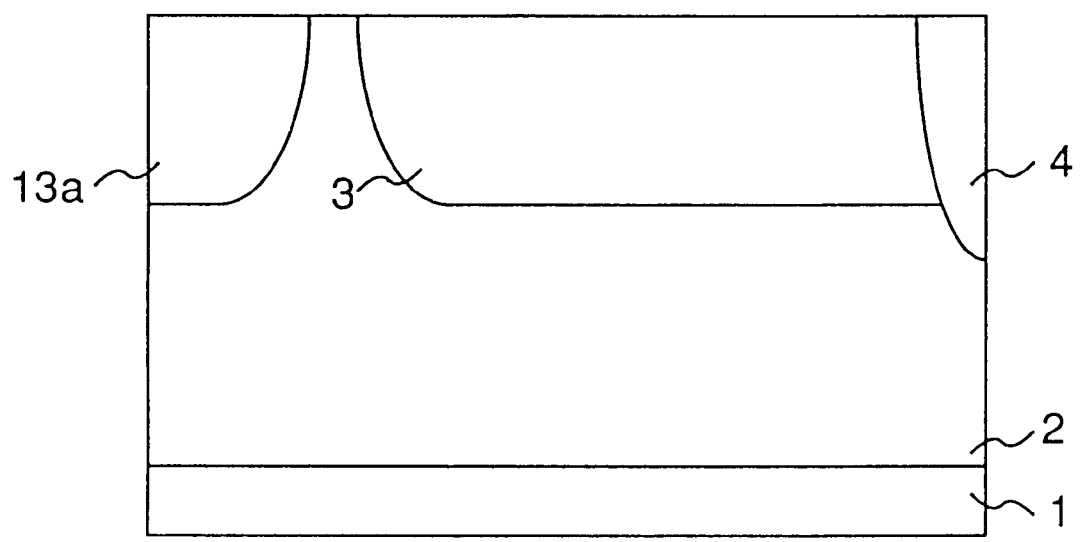
FIGS. 60–62 are sectional views of the semiconductor device of the forty-first embodiment indicating respective steps subsequent to the step of FIG. 59.

Referring to FIG. 60, by photolithography and ion-implantation, p type impurities are selectively introduced to one surface of the n type semiconductor substrate, which is subjected to thermal diffusion to form p base 3 and p well 13a.

Figure 61:
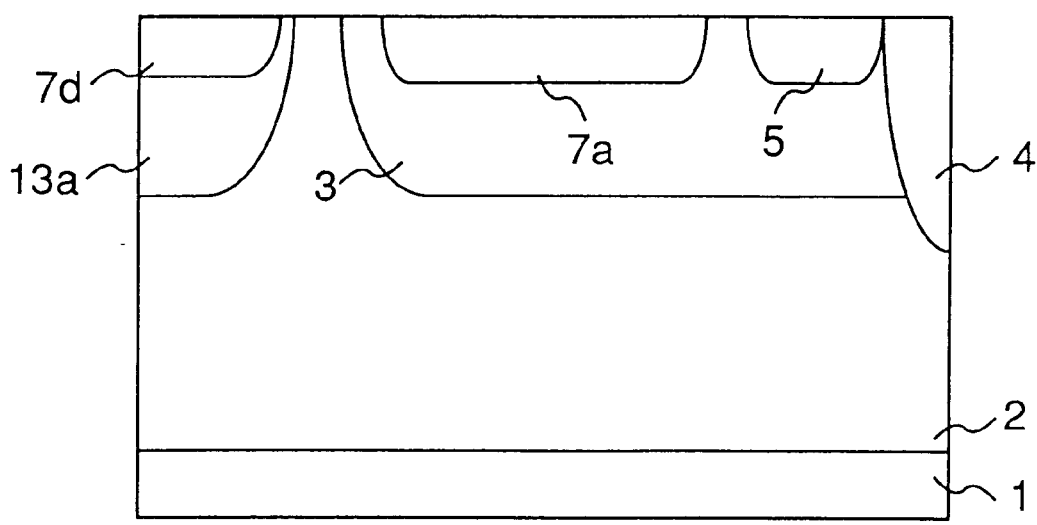

Referring to FIG. 61, by selectively introducing type impurities into one surface and applying thermal diffusion using photolithography and ion-implantation, $n^+$ floating region 7a and $n^+$ cathode 5 are formed.

Figure 62:
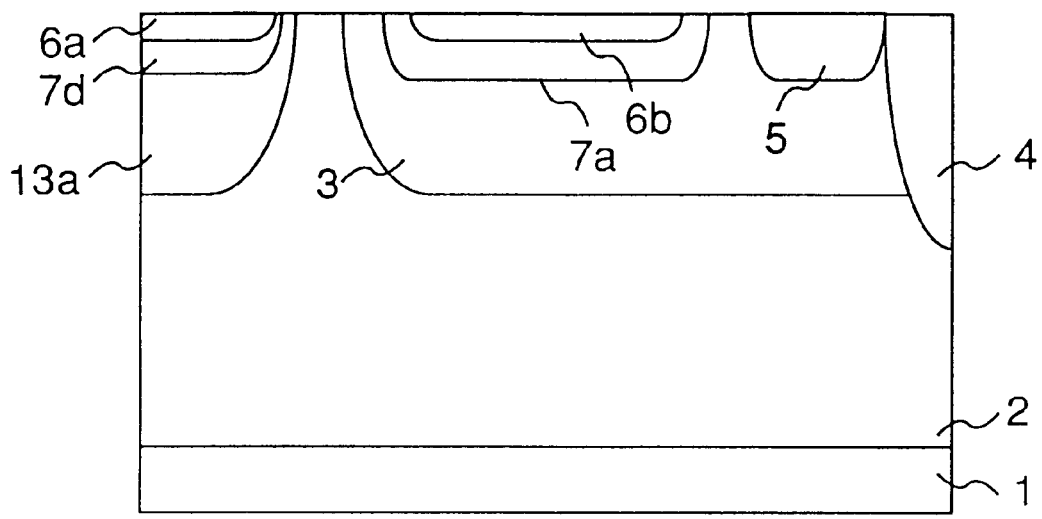
Figure 63:
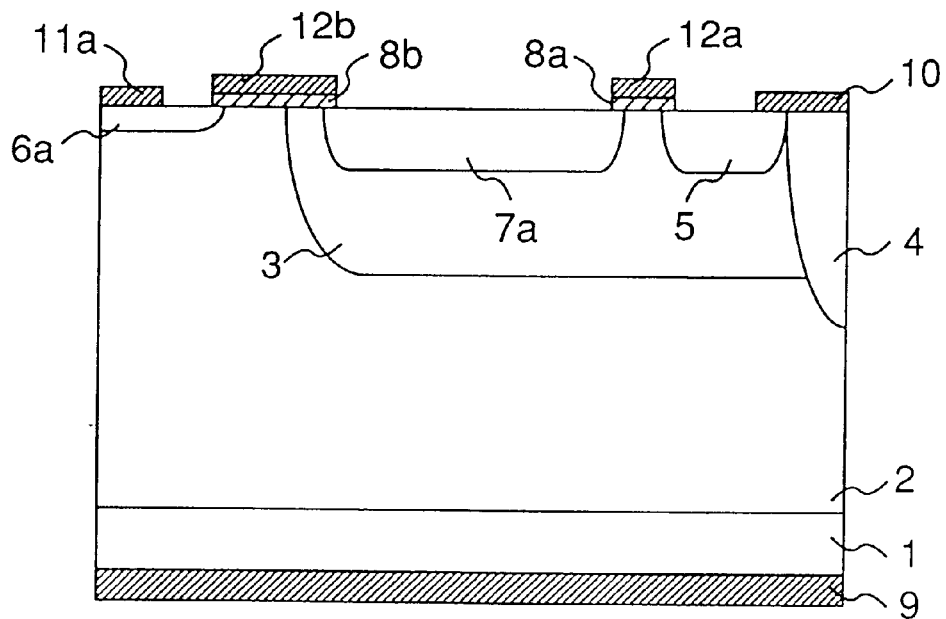
FIG. 63 shows a sectional view of a conventional semiconductor device.
Figure 64:
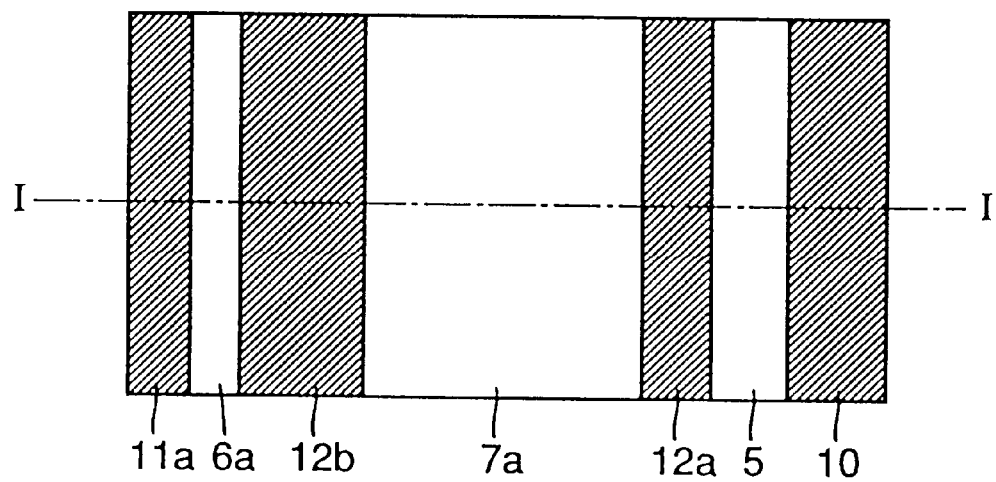
FIG. 64 is a plan view of the semiconductor device of FIG. 63.

Referring to FIG. 62, n type impurities are introduced to one surface to be subjected to thermal diffusion to form $p^+$ diverters 6a and 6b. Then, referring to FIG. 49, an insulating film or a conductive film is selectively formed on one surface to form cathode electrode 10 electrically connected to $p^+$ contact 4 and $n^+$ cathode 5, diverter electrodes 11a and 11b, gate oxide films 8a and 8b, and gate electrodes 12a and 12b. Anode electrode 9 is formed all over the other surface by forming a conductive film on the entire surface.

Figure 49:
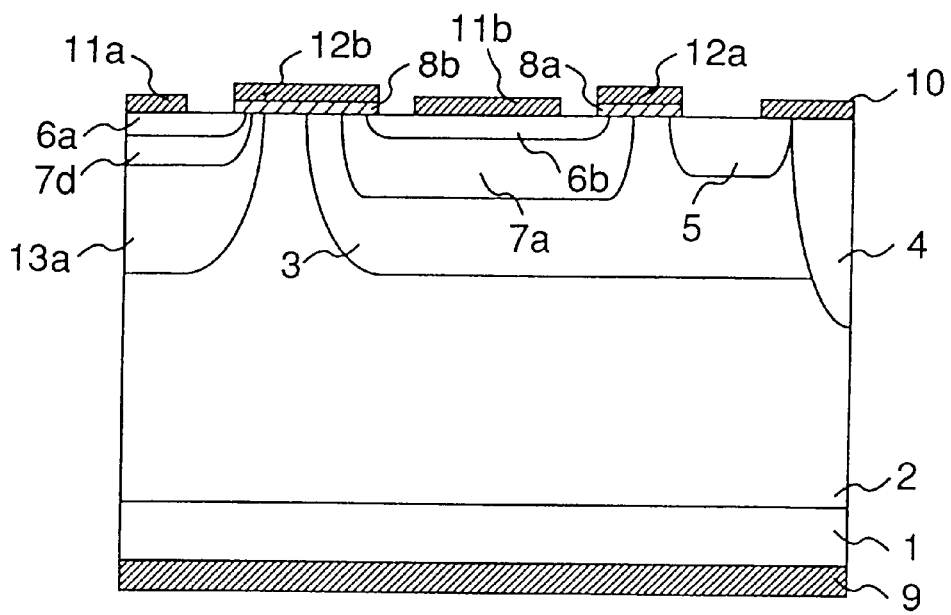

Thus, a thyristor having a sectional structure as shown in FIG. 49 and described with reference to the thirty-fourth embodiment can be formed.

Although p base 3 and p well 13a and also $n^+$ floating region 7a and $n^+$ cathode 5 are formed simultaneously in the present embodiment to simplify the manufacturing steps, processes of photolithography, ion-implantation, and thermal treatment can be applied appropriately to each manufacturing step when the concentration of the impurity or the depth of diffusion must be controlled independently. The structure of the other embodiments can easily be obtained by modifying the impurity formation region according to photolithography and by eliminating some of the steps.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including an element sandwiching a semiconductor substrate of a first conductivity type for conducting a main current across first and second main surfaces, said element comprising:
   a first impurity region of a second conductivity type formed with a surface at the first main surface of said semiconductor substrate of the first conductivity type, and forming a region having a closed outer edge,
   a second impurity region of the first conductivity type formed at said first main surface within said first impurity region,
   a third impurity region of the second conductivity type formed at the second main surface of said semiconductor substrate,
   a fourth impurity region of the second conductivity type formed at said first main surface apart from said first impurity region, and substantially continuous along said closed outer edge,
   a fifth impurity region of the first conductivity type formed at said first main surface within said first impurity region and spaced apart from said second impurity region,
   a first gate electrode formed all over the entire surface of a first conductivity type region of said semiconductor substrate sandwiched by said first impurity region and said fourth impurity region with a first insulating film thereunder,
   a second gate electrode formed on a surface of said first impurity region sandwiched by said second impurity region and said first impurity region of said semiconductor substrate with a second insulating film thereunder, and
   a third gate electrode formed on a surface of said first impurity region sandwiched by said second impurity region and said fifth impurity region with a third insulating film thereunder,
   a first main electrode formed at said first main surface, and connected electrically to said fourth impurity region, and
   a second main electrode formed at said second main surface, and connected electrically to said third impurity region wherein said first main electrode is further connected electrically to said fifth impurity region, and not directly connected electrically to said second impurity region.

2. The semiconductor device according to claim 1, wherein said fourth impurity region surrounds said first impurity region completely continuously.

3. A semiconductor device including an element sandwiching a semiconductor substrate of a first conductivity type for conducting a main current across first and second main surfaces, said element comprising:
   a first impurity region of a second conductivity type formed at the first main surface of said semiconductor substrate of the first conductivity type,
   a second plurality of impurity regions of the first conductivity type formed at said first main surface within said first impurity region,
   a third impurity region of the second conductivity type formed at the second main surface of said semiconductor substrate,
   a fourth impurity region of the second conductivity type formed at said first main surface within said each impurity region,
   a first gate electrode formed on a surface of said second impurity region with a first insulating film thereunder,
   a first main electrode formed at said first main surface, and connected electrically to said fourth impurity region,
   a second main electrode formed at said second main surface, and connected electrically to said third impurity region;
   a second gate electrode formed on a surface of said first impurity region sandwiched by one of said plurality of second impurity regions located closest to an external edge of said first impurity region and a first conductivity type region of said semiconductor substrate with a second insulating film thereunder; and
   a third gate electrode formed on a surface of each of said first impurity regions sandwiched by adjacent second impurity regions with a third insulating film under the third gate electrode; wherein,
   said first gate electrode is located on the surface of said second impurity region sandwiched by each of said plurality of fourth impurity regions and said first impurity region,
   said first main electrode is electrically connected to each of said plurality of fourth impurity regions,
   none of the plurality of second impurity regions are connected with the first main electrodes, directly,
   said element further comprising:
       a fifth impurity region of the first conductivity type formed at said first main surface of said first impurity region, and spaced apart from one of said plurality of second impurity regions located farthest from an outer edge of said first impurity region; and
       a fourth gate electrode formed on a surface of said first impurity region sandwiched by said fifth impurity region and a second impurity region located farthest from the outer edge of said first impurity region with a fourth insulating film thereunder,
   wherein said first main electrode is further connected electrically to said fifth impurity region.

4. The semiconductor device according to claim 3, wherein all electric resistance between said fourth impurity regions adjacent to each other is equal.

5. A semiconductor device including an element sandwiching a semiconductor substrate of a first conductivity type for conducting a main current across first and second main surfaces, said element comprising:
   a first impurity region of a second conductivity type formed on the first main surface of said semiconductor substrate of the first conductivity type, a second impurity region of the first conductivity type formed at said first main surface within said first impurity region,
   a third impurity region of the second conductivity type formed at a second main surface of said semiconductor substrate,
   a plurality of fourth impurity regions of the second conductivity type formed with a distance therebetween at said first main surface apart from said first impurity region and along an outer edge of said first impurity region,
   a first gate electrode formed on a surface of a first conductivity type region of said semiconductor substrate with a first insulating film thereunder,
   a first main electrode formed at said first main surface, and connected electrically to each of said plurality of fourth impurity region, a second main electrode formed at said second main surface, and connected electrically to said third impurity region, a fifth impurity region of the first conductivity type at said first main surface within said first impurity region, and spaced apart from said second impurity region, a second gate electrode formed on a surface of said first impurity region sandwiched by said second impurity region and said first conductivity type region of said semiconductor substrate with a second insulating film thereunder, and a third gate electrode formed on a surface of said first impurity region sandwiched by said second impurity region and said fifth impurity region with a third insulating film thereunder, wherein said first main electrode is further connected electrically to said fifth impurity region, and is not directly connected electrically to said second impurity region, and said first gate electrode includes:
(A) a rate electrode formed on a region including surfaces of the first conductivity type region and the first impurity region, sandwiched by the second impurity region and either one of the fourth impurity regions, so as to bridge one of the fourth impurity regions and the second impurity region; and
(B) at least one gate electrode formed on a surface of a first conductivity type region of said semiconductor substrate sandwiched by the first impurity region and either one of the fourth impurity regions so as to bridge one of the fourth impurity regions and the first impurity region, and one sidewall of the gate electrode is located exterior to the second impurity region so as not to form in the first impurity region a channel region connecting the first conductivity type region and the second impurity region.

6. The semiconductor device according to claim 5, wherein said first impurity region includes an outer edge extending in an X direction and an outer edge extending in a Y direction crossing said X direction, and one of said plurality of fourth impurity regions is located along said outer edge of the X direction, and another one of said plurality of fourth impurity regions is located along said outer edge in the Y direction.

7. The semiconductor device according to claim 5, wherein said first impurity region includes an outer edge extending substantially in a straight line along an X direction, and one of said plurality of fourth impurity regions is formed along said outer edge of the X direction and completely continuously over the entire said outer edge of the X direction.

8. The semiconductor device according to claim 5, wherein said first impurity region includes a first outer edge extending in an X direction and a second outer edge extending in said X direction spaced apart from said first outer edge, one of said plurality of fourth impurity regions is located along said first outer edge, and another one of said plurality of fourth impurity regions is located along said second outer edge.

9. The semiconductor device according to claim 5, wherein an outer edge of said first impurity region forms a closed region, and a plurality of said fourth impurity regions are located at equal intervals along said closed region.

10. A semiconductor device including an element sandwiching a semiconductor substrate of a first conductivity type for conducting a main current across first and second main surfaces, said element comprising:

a first impurity region of a second conductivity type formed on the first main surface of said semiconductor substrate of the first conductivity type, a second impurity region of the first conductivity type formed at said first main surface within said first impurity region, a third impurity region of the second conductivity type formed at a second main surface of said semiconductor substrate, a plurality of fourth impurity regions of the second conductivity type formed with a distance therebetween at said first main surface apart from said first impurity region and along an outer edge of said first impurity region, a first gate electrode formed on a surface of a first conductivity type region of said semiconductor substrate with a first insulating film thereunder, a first main electrode formed at said first main surface, and connected electrically to each of said plurality of fourth impurity region, a second main electrode formed at said second main surface, and connected electrically to said third impurity region, wherein an outer edge of said first impurity region forms a closed region, and a plurality of said fourth impurity regions are located at equal intervals along said closed region.

11. A semiconductor device including an element sandwiching a semiconductor substrate of a first conductivity type for conducting a main current across both main surfaces, said element comprising:

a first impurity region of a second conductivity type formed at a first main surface of said semiconductor substrate of the first conductivity type, a second impurity region of the first conductivity type formed at said first main surface within said first impurity region, a third impurity region of the second conductivity type formed at a second main surface of said semiconductor substrate, a fourth impurity region of the second conductivity type formed at said first main surface within said second impurity region, a fifth impurity region of the first conductivity type formed at a first main surface of said first impurity region in a direction opposite to an outer perimeter of said first impurity region, and apart from said second impurity region, a first gate electrode formed on a surface of said second impurity region sandwiched by said first impurity region and said fourth impurity region with a first insulating film thereunder, a second gate electrode formed on a surface of said first impurity region sandwiched by said fifth impurity region and said second impurity region with a second gate insulating film thereunder, a first main electrode formed at said first main surface, and connected electrically to said fourth impurity region, said first main electrode being electrically connected to said fifth impurity region and not electrically connected to said second impurity region, and a second main electrode formed at said second main surface, and connected electrically to said third impurity region.

* * * * *